US012733484B2

(12) United States Patent
Kraman et al.

(10) Patent No.: US 12,733,484 B2

(45) Date of Patent: Sep. 8, 2026

(54) THREE-DIMENSIONAL MEMORY DEVICE CONTAINING MULTI-LEVEL WORD LINE CONTACT WELLS AND METHODS FOR MANUFACTURING THE SAME

(71) Applicant: SANDISK TECHNOLOGIES LLC, Addison, TX (US)

(72) Inventors: Mark D. Kraman, San Jose, CA (US); Johann Alsmeier, San Jose, CA (US); James Kai, Santa Clara, CA (US); Koichi Matsuno, Fremont, CA (US); Jixin Yu, Milpitas, CA (US); Ruogu Matthew Zhu, San Jose, CA (US); Seyyed Ehsan Esfahani Rashidi, Milpitas, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 412 days.

(21) Appl. No.: 18/360,461

(22) Filed: Jul. 27, 2023

(65) Prior Publication Data

US 2024/0290714 A1 Aug. 29, 2024

Related U.S. Application Data

(60) Provisional application No. 63/487,084, filed on Feb. 27, 2023.

(51) Int. Cl.
*H10B 41/10* (2023.01)
*G11C 16/04* (2006.01)
(Continued)

(52) U.S. Cl.
CPC ....... *H10W 20/435* (2026.01); *G11C 16/0483* (2013.01); *H10B 41/10* (2023.02);
(Continued)

(58) Field of Classification Search
CPC .................................................. H10W 20/435
See application file for complete search history.

(56) References Cited

U.S. PATENT DOCUMENTS 9,601,502 B2 3/2017 Sano et al.
9,905,573 B1 2/2018 Mada et al.
(Continued)

FOREIGN PATENT DOCUMENTS

JP 2012-119478 A 6/2012

OTHER PUBLICATIONS

IPRP-WO—Notification Concerning Transmittal of International Preliminary Report on Patentability and Written Opinion of the International Searching Authority for International Patent Application No. PCT/US2023/084783, mailed Sep. 11, 2025, 8 pages.
(Continued)

*Primary Examiner* — Jeff W Natalini
*Assistant Examiner* — Jacob Raul Marin
(74) *Attorney, Agent, or Firm* — THE MARBURY LAW GROUP PLLC

(57) ABSTRACT

A memory device includes an alternating stack of insulating layers and electrically conductive layers, memory openings vertically extending through the alternating stack, memory opening fill structures located in the memory openings and including a respective memory film and a respective vertical semiconductor channel, contact wells vertically extending through a respective subset of layers of the alternating stack that includes a topmost insulating layer of the insulating layers, dielectric fill structures located in the contact wells, and an array of contact via structures vertically extending through the respective dielectric fill structure in each of the contact wells and contacting a top surface of a respective electrically conductive layer within a subset of the electrically conductive layers, the subset of the electrically con-
(Continued)

ductive layers including a plurality of electrically conductive layers that are vertically spaced apart.

20 Claims, 50 Drawing Sheets

(51) Int. Cl.
*H10B 41/27* (2023.01)
*H10B 43/10* (2023.01)
*H10B 43/27* (2023.01)
*H10W 20/41* (2026.01)
*H10W 20/42* (2026.01)

(52) U.S. Cl.
CPC ............. *H10B 41/27* (2023.02); *H10B 43/10* (2023.02); *H10B 43/27* (2023.02); *H10W 20/42* (2026.01)

(56) References Cited

U.S. PATENT DOCUMENTS 9,960,181 B1 5/2018 Cui et al.
10,192,877 B2 1/2019 Norizuki et al.
10,290,803 B2 5/2019 Sano et al.
10,546,870 B2 1/2020 Shimabukuro et al.
10,629,606 B2 4/2020 Sugawara et al.
10,804,284 B2 10/2020 Ishii et al.
11,081,443 B1 8/2021 Mizutani et al.
11,450,679 B2 9/2022 Tanaka et al.
11,495,612 B2 11/2022 Tanaka et al.
2012/0132983 A1 5/2012 Fukuzumi
2012/0238093 A1 9/2012 Park et al.
2015/0236038 A1* 8/2015 Pachamuthu .......... H10B 43/20 257/326
2016/0111361 A1 4/2016 Oh et al.
2018/0061850 A1 3/2018 Mada et al.
2019/0139974 A1 5/2019 Sugawara et al.
2019/0221574 A1 7/2019 Shimabukuro et al.
2019/0319040 A1* 10/2019 Ishii ...................... H01L 23/528
2020/0075746 A1* 3/2020 Waskiewicz ...... H01L 21/28518
2020/0135749 A1 4/2020 Hwang et al.
2021/0134736 A1* 5/2021 Jhothiraman ..... H01L 21/76895
2022/0005824 A1* 1/2022 Tanaka ................... H10B 41/10
2022/0020764 A1 1/2022 Oh et al.
2022/0045089 A1* 2/2022 Mizutani ............... H01L 23/528
2022/0059539 A1* 2/2022 Wu ...................... H10B 12/053
2022/0189872 A1 6/2022 Sano et al.
2022/0199637 A1 6/2022 Luo et al.
2022/0302146 A1 9/2022 Shimamura et al.
2022/0302153 A1 9/2022 Tanaka et al.
2022/0328413 A1 10/2022 Kubo et al.
2022/0406379 A1 12/2022 Takeguchi et al.
2022/0406720 A1 12/2022 Hinoue et al.
2022/0406793 A1 12/2022 Takeguchi et al.
2023/0038557 A1 2/2023 Ogawa et al.
2023/0041950 A1 2/2023 Chibvongodze et al.
2023/0044232 A1 2/2023 Kai et al.
2023/0045001 A1 2/2023 Ogawa et al.

OTHER PUBLICATIONS

Endoh et al., "Novel Ultra High-Density Memory with a Stacked-Surrounding Gate Transistor (S-SGT) Structured Cell," IEDM Proc. (2001) 33-36.

U.S. Appl. No. 17/663,951, filed Mar. 2, 2022, SanDisk Technologies LLC.

U.S. Appl. No. 17/804,184, filed May 26, 2022, SanDisk Technologies LLC.

U.S. Appl. No. 18/062,807, filed Dec. 7, 2022, SanDisk Technologies LLC.

U.S. Appl. No. 18/352,726, filed Jul. 14, 2023, SanDisk Technologies LLC.

U.S. Appl. No. 18/352,752, filed Jul. 14, 2023, SanDisk Technologies LLC.

U.S. Appl. No. 18/353,577, filed Jul. 17, 2023, SanDisk Technologies LLC.

U.S. Appl. No. 18/354,283, filed Jul. 18, 2023, SanDisk Technologies LLC.

U.S. Appl. No. 18/354,325, filed Jul. 18, 2023, SanDisk Technologies LLC.

U.S. Appl. No. 18/358,702, filed Jul. 25, 2023, SanDisk Technologies LLC.

U.S. Appl. No. 18/358,727, filed Jul. 25, 2023, SanDisk Technologies LLC.

* cited by examiner hd2
hd1
86
86B
86A
84
80
76
74
88

THREE-DIMENSIONAL MEMORY DEVICE CONTAINING MULTI-LEVEL WORD LINE CONTACT WELLS AND METHODS FOR MANUFACTURING THE SAME

FIELD

The present disclosure relates generally to the field of semiconductor devices, and particularly to a three-dimensional memory device including multi-level word line contact wells and methods of forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a memory device includes an alternating stack of insulating layers and electrically conductive layers, memory openings vertically extending through the alternating stack, memory opening fill structures located in the memory openings and including a respective memory film and a respective vertical semiconductor channel, contact wells vertically extending through a respective subset of layers of the alternating stack that includes a topmost insulating layer of the insulating layers, dielectric fill structures located in the contact wells, and an array of contact via structures vertically extending through the respective dielectric fill structure in each of the contact wells and contacting a top surface of a respective electrically conductive layer within a subset of the electrically conductive layers, the subset of the electrically conductive layers including a plurality of electrically conductive layers that are vertically spaced apart.

According to another aspect of the present disclosure, a method of forming a memory device is provided. The method comprises: forming an alternating stack of insulating layers and spacer material layer layers over a substrate, wherein the spacer material layers are formed as, or are subsequently replaced with, electrically conductive layers; forming a contact well through a subset of layers of the alternating stack that includes a topmost insulating layer among the insulating layers, wherein the contact well comprises a plurality of primary sidewalls each having a respective stepped bottom edge containing at least two horizontally-extending edge segments and at least one vertically-extending edge segment; forming a dielectric fill structure comprising at least one dielectric liner and a dielectric fill material portion in the contact well; forming memory openings through the alternating stack; forming memory opening fill structures in the memory openings, wherein each of the memory opening fill structures comprises a respective memory film and a respective vertical semiconductor channel; and forming an array of contact via structures through the dielectric fill structure and directly on a top surface of a respective electrically conductive layer within a subset of the electrically conductive layers, the subset of the electrically conductive layers comprising a plurality of electrically conductive layers that are vertically spaced apart.

DETAILED DESCRIPTION

Figure 1A:
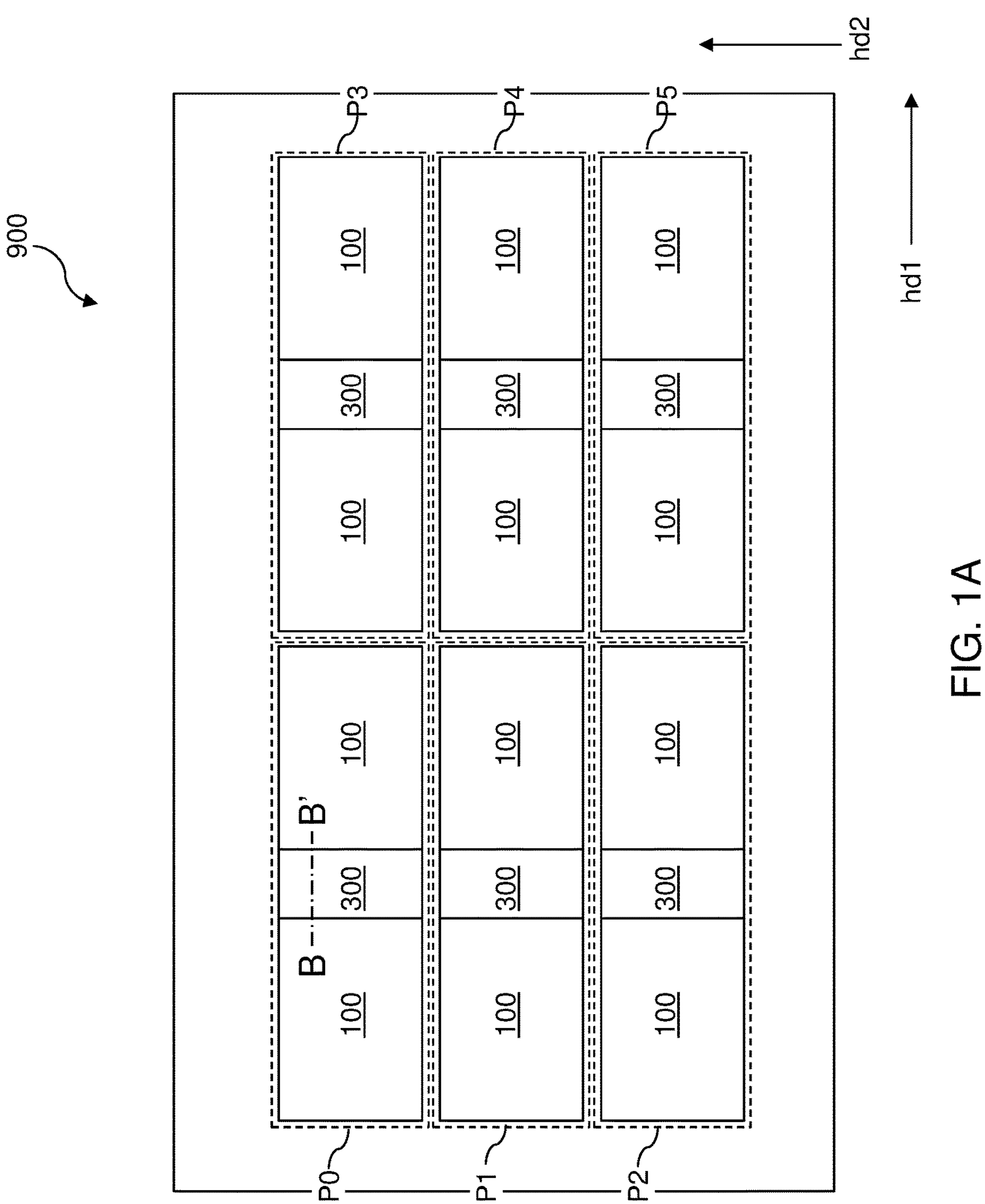
FIG. 1A is a plan view of an exemplary structure including a memory die according to an embodiment of the present disclosure.

As discussed above, the embodiments of the present disclosure are directed to a three-dimensional memory device including multi-level word line contact wells and methods of forming the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar elements. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one, two, or four). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1A, a plan view of an exemplary structure according to an embodiment of the present disclosure is illustrated, which comprises a memory die 900 including a plurality of memory planes (P0, P1, P2, P3, P4, P5, etc.). Each plane includes at least one memory array region 100 and a contact region 300. At least one three-dimensional array of memory elements can be subsequently formed within each memory array region 100, and contact wells and contact via structures are formed within each contact region 300. In one embodiment, interfaces between memory array regions 100 and the contact regions 300 can be perpendicular to a first horizontal direction (e.g., word line direction) hd1, and can be parallel to a second horizontal direction (e.g., bit line direction) hd2.

Figure 1B:
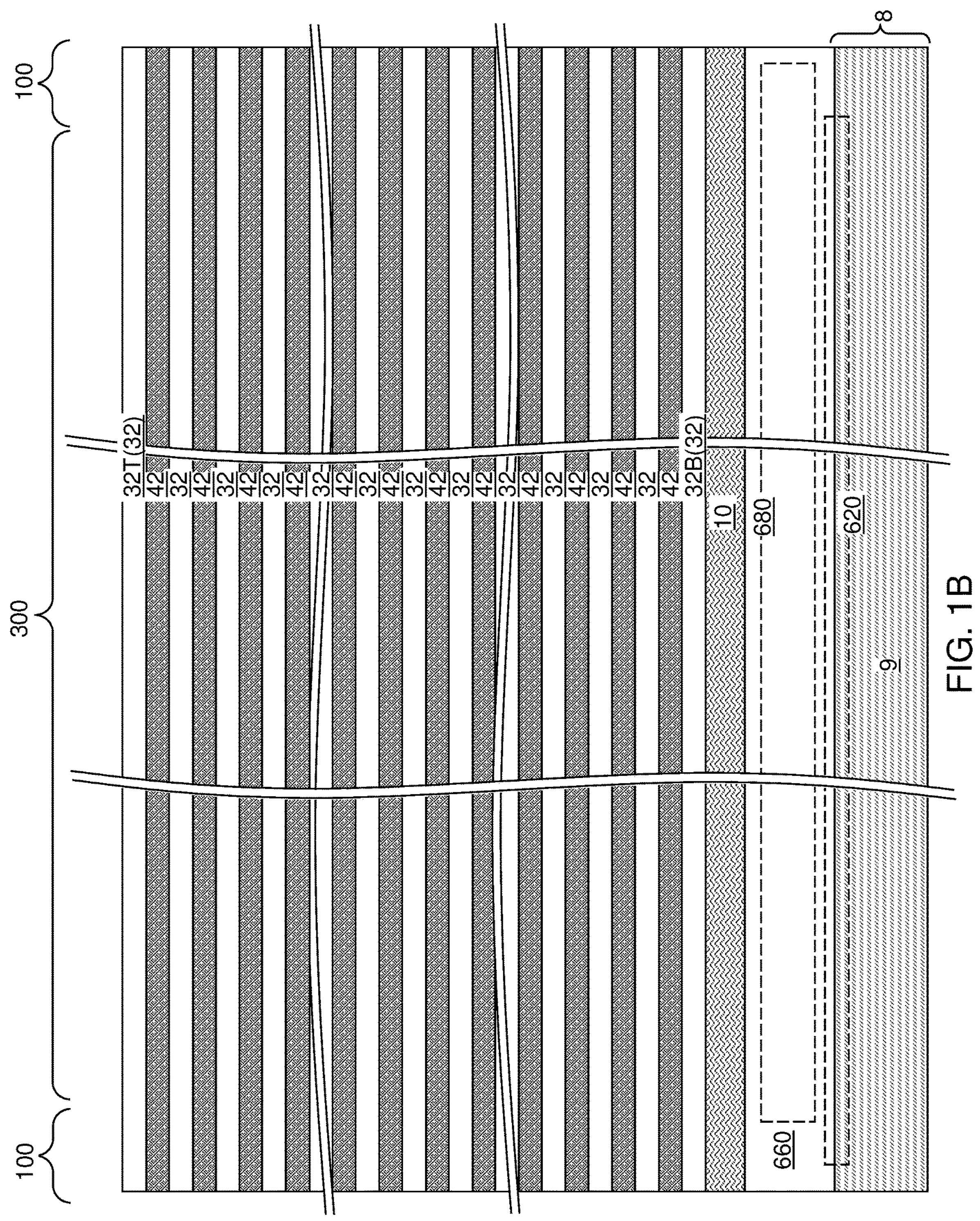
FIG. 1B is a schematic vertical cross-sectional view of the exemplary structure along the vertical plane B-B' of FIG. 1A after formation of optional semiconductor devices, optional lower-level metal interconnect structures, a semiconductor material layer, and an alternating stack of insulating layers and sacrificial material layers according to an embodiment of the present disclosure.

Referring to FIG. 1B, a portion of the exemplary structure is illustrated along the vertical plane B-B' of FIG. 1A after formation of optional semiconductor devices 620, optional lower-level dielectric material layers 660, an optional semiconductor material layer 10, and an alternating stack of insulating layers 32 and sacrificial material layers. The exemplary structure comprises a substrate 8, which may be a semiconductor substrate, an insulating substrate, a conductive substrate, or a combination thereof. The substrate 8 comprises a substrate material layer 9, which may or may not be a semiconductor material layer. In one embodiment, the substrate 8 may comprise a semiconductor substrate consisting essentially of a single crystalline semiconductor material or a polycrystalline semiconductor material. In one embodiment, the substrate 8 may be a commercially available silicon wafer on which a plurality of semiconductor dies, such as a two-dimensional array of semiconductor dies, can be subsequently formed. In this case, the substrate material layer 9 may comprise a doped well in the silicon wafer or an epitaxial silicon layer located on the silicon wafer. In case the substrate 8 comprises a semiconductor substrate, semiconductor devices 620 may optionally be formed on top of the substrate 8. Generally, the semiconductor devices 620 may comprise any type of semiconductor devices known in the art. In one embodiment, the semiconductor devices 620 may comprise complementary metal-oxide-semiconductor (CMOS) field effect transistors of a peripheral circuit for controlling operation of a three-dimensional memory device to be subsequently formed thereabove.

Optionally, metal interconnect structures 680 embedded within dielectric material layers 660 may be formed above the substrate 8. The metal interconnect structures 680 are also referred to as lower-level metal interconnect structures 680, and the dielectric material layers 660 are also referred to lower-level dielectric material layers 660. In case the semiconductor devices 620 are present, the lower-level metal interconnect structures 680 may provide electrical connection to the semiconductor devices 620. In one embodiment, the metal interconnect structures 680 may comprise metal pads (not expressly shown), which may be employed as a contact pad for connection via structures to be subsequently formed. Alternatively, the formation of the semiconductor devices 620, metal interconnect structures 680 and dielectric material layers 660 over the substrate 8 may be omitted. Instead, the semiconductor devices 620 may be formed over a separate substrate and then bonded to the three-dimensional memory device.

In case the lower-level dielectric material layers 660 are present, a semiconductor material layer (e.g., a polysilicon layer) 10 may be formed over the lower-level dielectric material layers 660. The semiconductor material layer 10 may comprise a single semiconductor material layer, or may comprise a vertical stack of multiple semiconductor material sublayers. In one embodiment, the semiconductor material layer 10 may have a doping of a first conductivity type, which may be p-type or n-type. In one embodiment, in-process source-level material layers may be formed in lieu of the semiconductor material layer 10. In this case, the in-process source-level material layers may comprise a vertical stack including a lower source semiconductor layer, a source-level sacrificial layer that is subsequently replaced with a source contact layer, and an upper source semiconductor layer. In case the lower-level dielectric material layers 660 are not employed, the semiconductor material layer 10 may be omitted. While an embodiment is described in which a semiconductor material layer 10 is employed, embodiments are expressly contemplated herein in which the semiconductor material layer is replaced with in-process source-level material layers or is omitted.

An alternating stack of insulating layers 32 and spacer material layers can be formed over the semiconductor material layer 10. In one embodiment, the spacer material layers may comprise sacrificial material layers 42. In this case, an alternating stack (32, 42) of insulating layers 32 and sacrificial material layers 42 can be formed over the semiconductor material layer 10. The insulating layers 32 comprise an insulating material such as undoped silicate glass or a doped silicate glass, and the sacrificial material layers 42 comprise a sacrificial material such as silicon nitride or a silicon-germanium alloy. The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed. The topmost one of the insulating layers 32 is hereafter referred to as a topmost insulating layer 32T. The bottommost one of the insulating layers 32 is hereafter referred to as a bottommost insulating layer 32B.

Each of the insulating layers 32 other than the topmost insulating layer 32 may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32 may have a thickness of about one half of the thickness of other insulating layers 32.

While an embodiment is described in which the spacer material layers are formed as sacrificial material layers 42, the spacer material layers may be formed as electrically conductive layers in an alternative embodiment. Generally, spacer material layers may be formed as or may be subsequently replaced at least partly with electrically conductive layers.

Figure 2A:
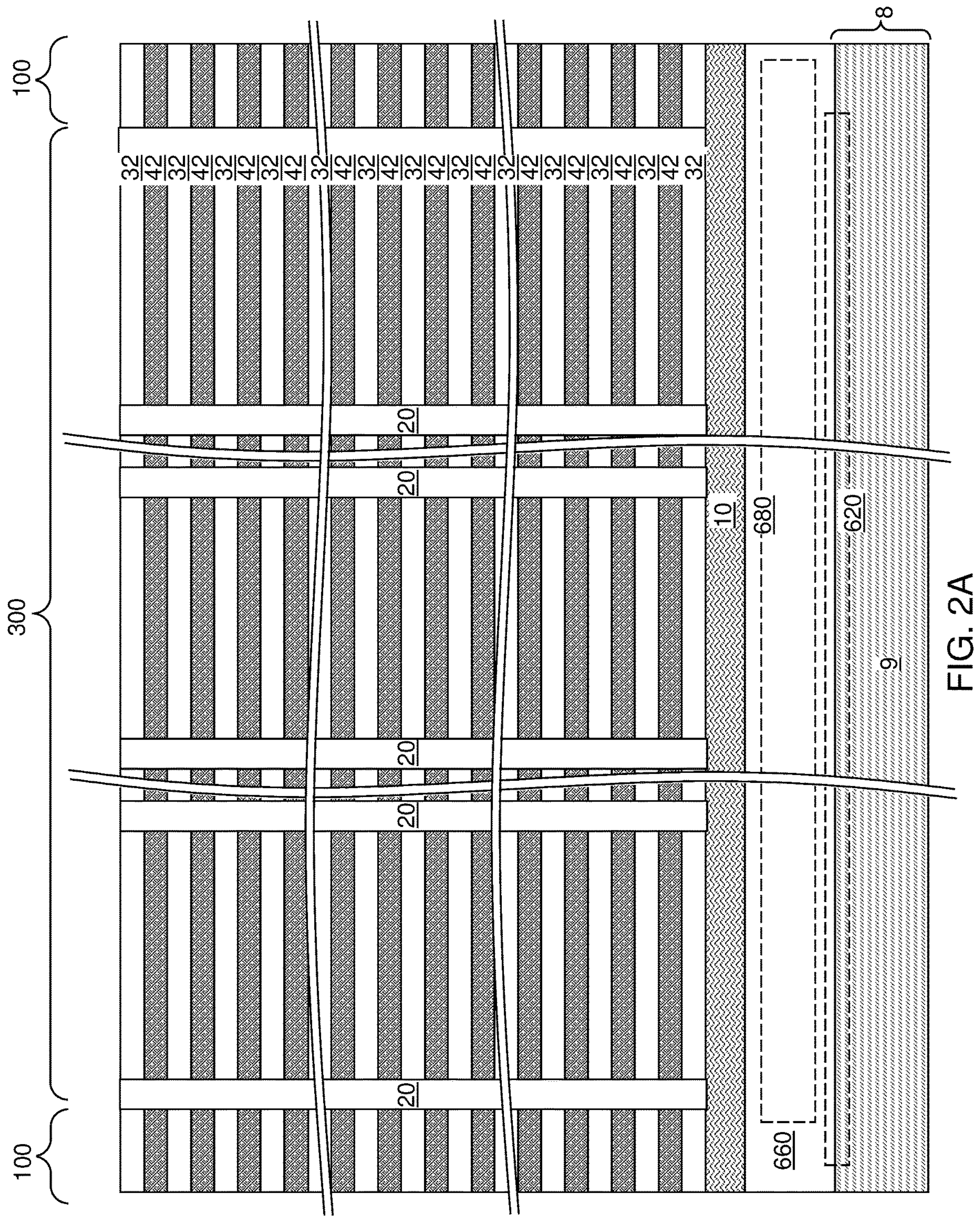
FIG. 2A is a schematic vertical cross-sectional view of the exemplary structure after formation of dielectric support pillar structures according to an embodiment of the present disclosure.
Figure 2B:
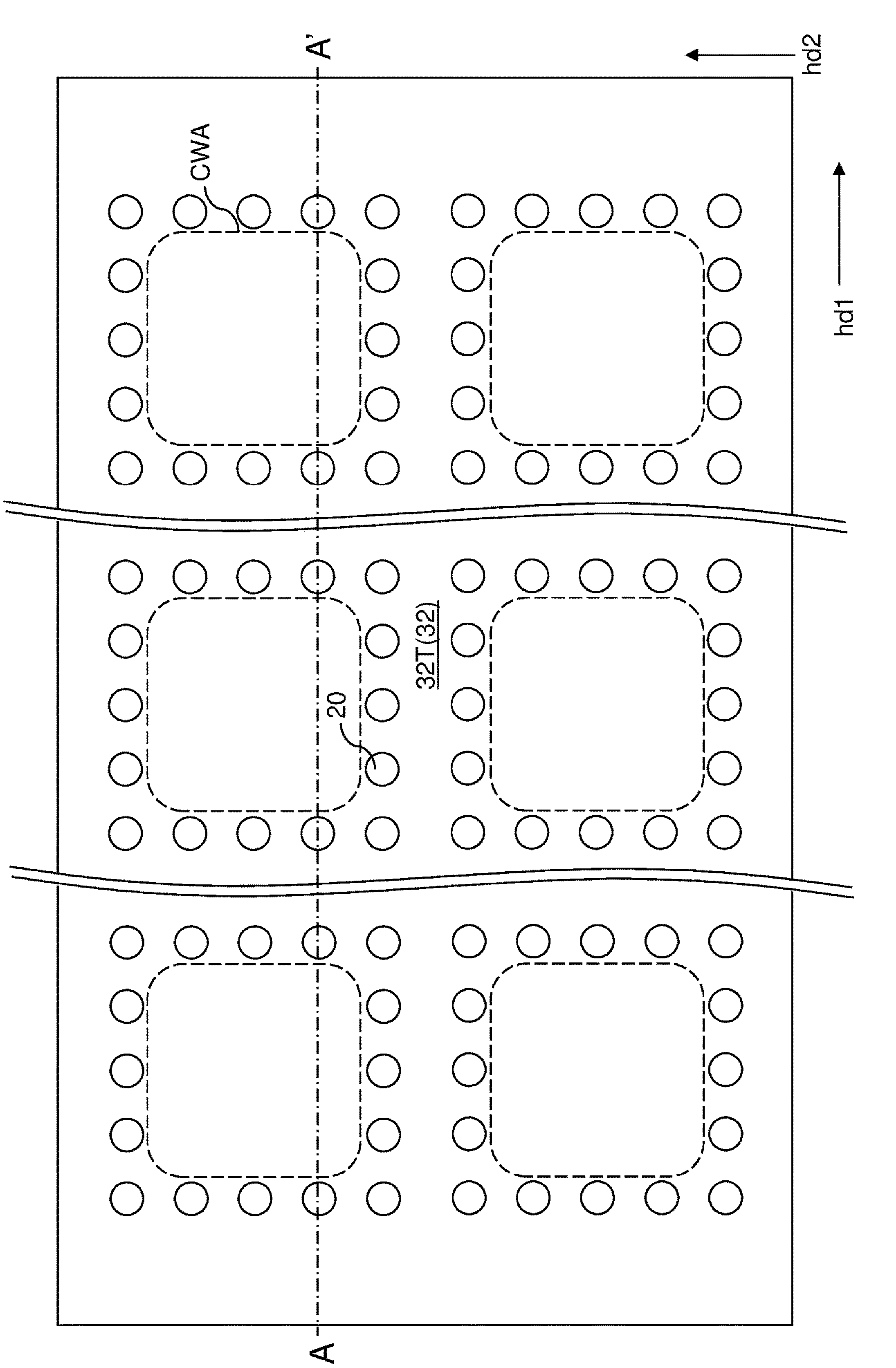
FIG. 2B is a top-down view of the exemplary structure of FIG. 2A. The vertical plane A-A' is the cut plane of the vertical cross-sectional view of FIG. 2A.

Referring to FIGS. 2A and 2B, a photoresist layer (not shown) can be applied over the alternating stack (32, 42), and can be lithographically patterned to form openings within the contact region 300. The pattern of the openings in the photoresist layer can be transferred through the alternating stack (32, 42) by performing an anisotropic etch process. Support openings can be formed through the alternating stack (32, 42). A surface of the semiconductor material layer 10 (if present) can be physically exposed at the bottom of each of the support openings. The photoresist layer can be subsequently removed, for example, by ashing.

A dielectric fill material such as undoped silicate glass (i.e., silicon oxide) or a doped silicate glass can be deposited in the support openings. The dielectric fill material can be removed from above the horizontal plane including the topmost surface of the alternating stack (32, 42) by performing a planarization process, which may employ a recess etch process and/or a chemical mechanical polishing process. Each remaining portion of the dielectric fill material filling the support openings constitutes a support pillar structures 20. The support pillar structures 20 vertically extends through the alternating stack (32, 42), and can be located in the contact region 300.

According to an aspect of the present disclosure shown in FIG. 2B, the support pillar structures 20 can be arranged in a pattern such that an array of areas that are free of the support pillar structures 20 is provided within the contact region 300 in a plan view, such as a top-down view. The areas that are free of the support pillar structures 20 located within the contact region 300 are subsequently employed to form contact wells, and as such, are herein referred to as contact well areas CWA. Each contact well area CWA can be laterally surrounded by a respective subset of the support pillar structures 20. In one embodiment, the contact well areas CWA may comprise a plurality of rows of contact well areas CWA. Each row of contact well areas CWA may comprise a respective plurality of contact well areas CWA that are arranged along the first horizontal direction hd1. The plurality of rows of contact well areas CWA may be laterally spaced apart from each other along the second horizontal direction hd2. In one embodiment, the contact well areas CWA may be arranged as a two-dimensional array of contact well areas CWA, such as a rectangular array of contact well areas CWA.

Figure 3A:
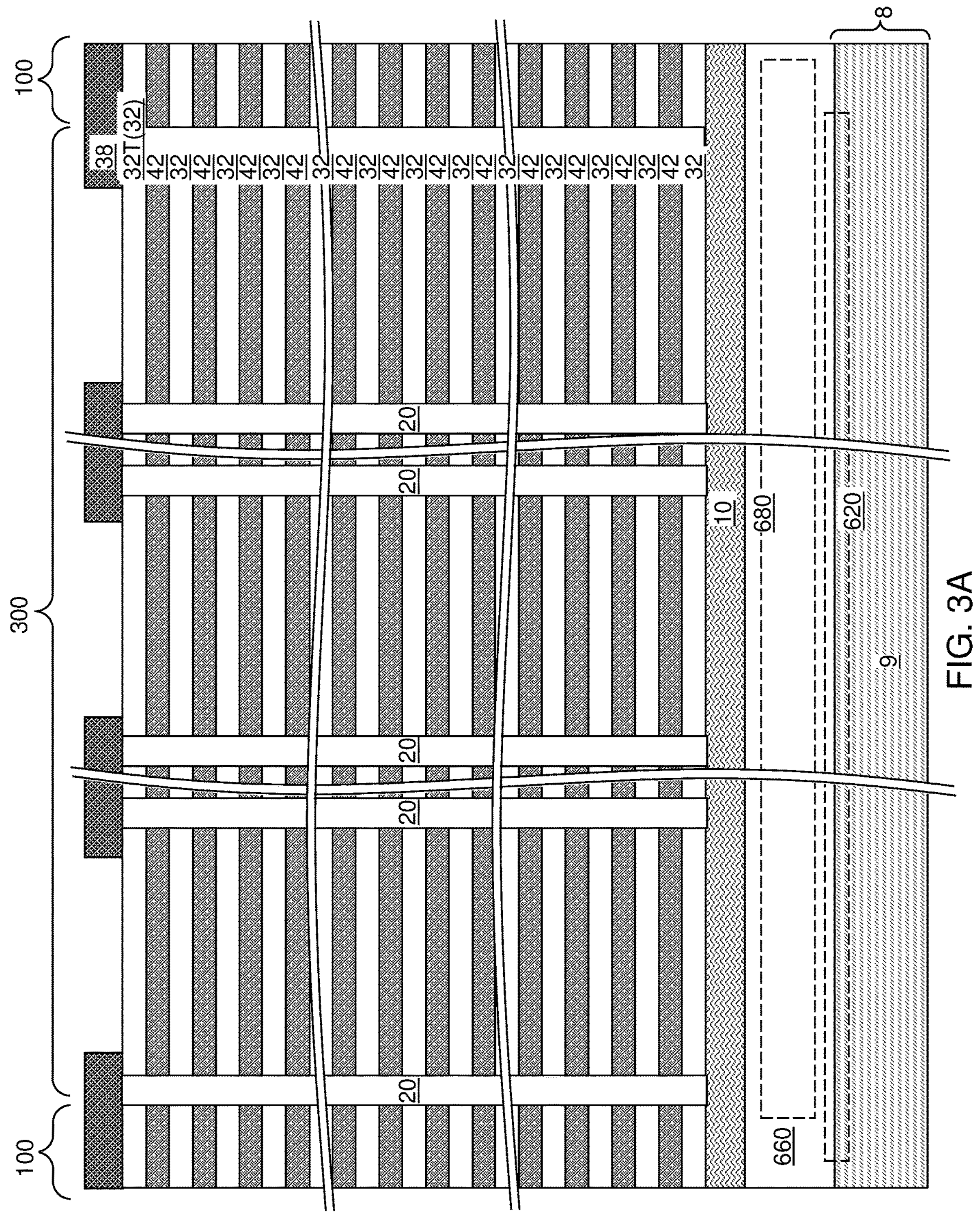
FIG. 3A is a schematic vertical cross-sectional view of the exemplary structure after formation of a patterned hard mask layer according to an embodiment of the present disclosure.
Figure 3B:
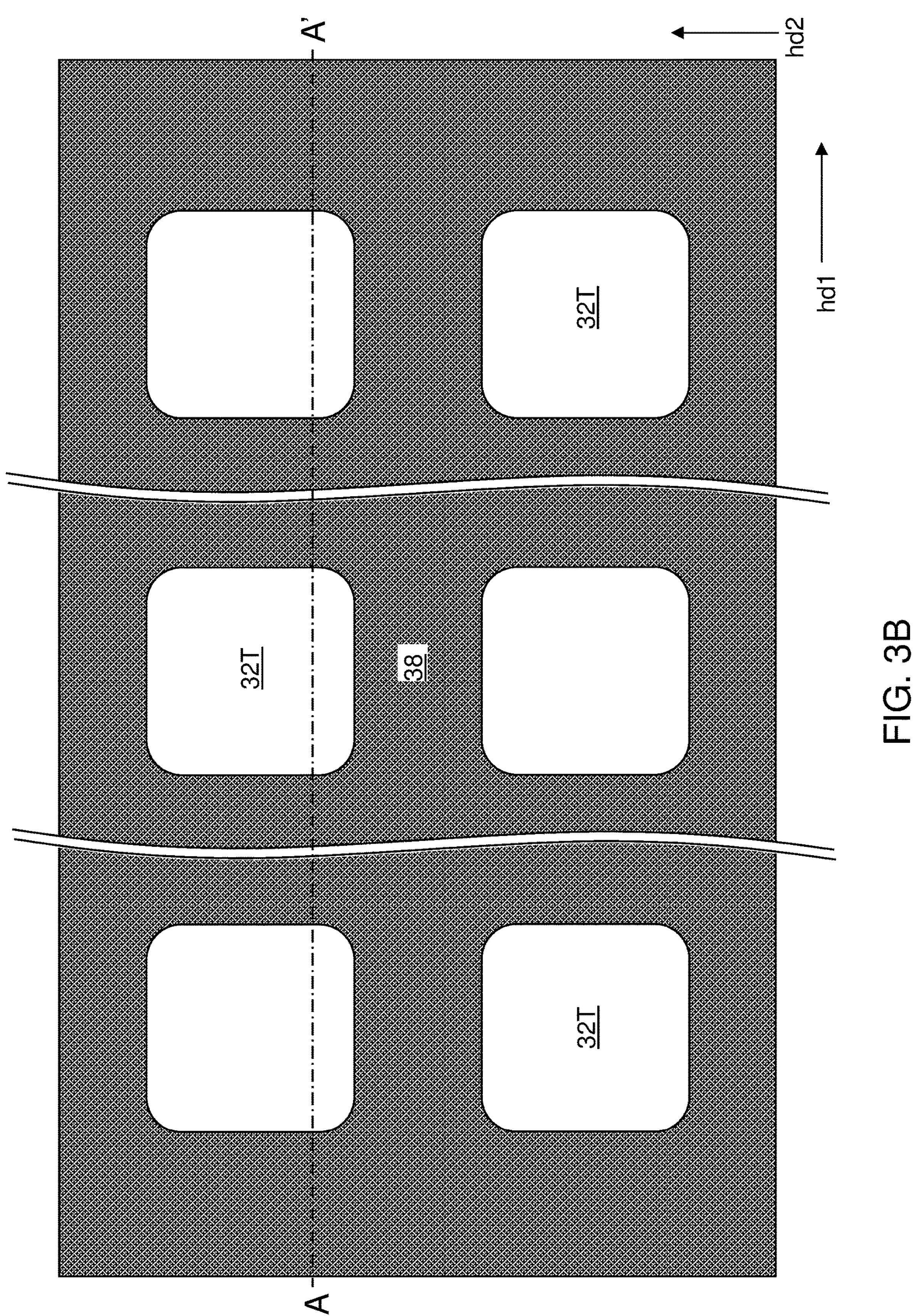
FIG. 3B is a top-down view of the exemplary structure of FIG. 3A. The vertical plane A-A' is the cut plane of the vertical cross-sectional view of FIG. 3A.

Referring to FIGS. 3A and 3B, a hard mask layer 38 may be formed above the alternating stack (32, 42). The hard mask layer 38 comprises a material that can function as an etch mask material during subsequent anisotropic etch processes. The hard mask layer 38 may comprise a carbon hard mask material, a metal or metal alloy hard mask material, a semiconductor hard mask material, or a metal oxide (e.g., aluminum oxide) hard mask material.

A photoresist layer (not shown) can be applied over the hard mask layer 38, and can be lithographically patterned to form openings in the contact well areas CWA. An anisotropic etch process can be performed to transfer the pattern in the photoresist layer through the hard mask layer 38. Openings are formed in the hard mask layer 38 such that each opening in the hard mask layer 38 is formed within a respective contact well area CWA, i.e., an area that is free of the support pillar structures 20 and may be laterally surrounded by a respective subset of the support pillar structures 20. The photoresist layer can be subsequently removed.

Figure 4A:
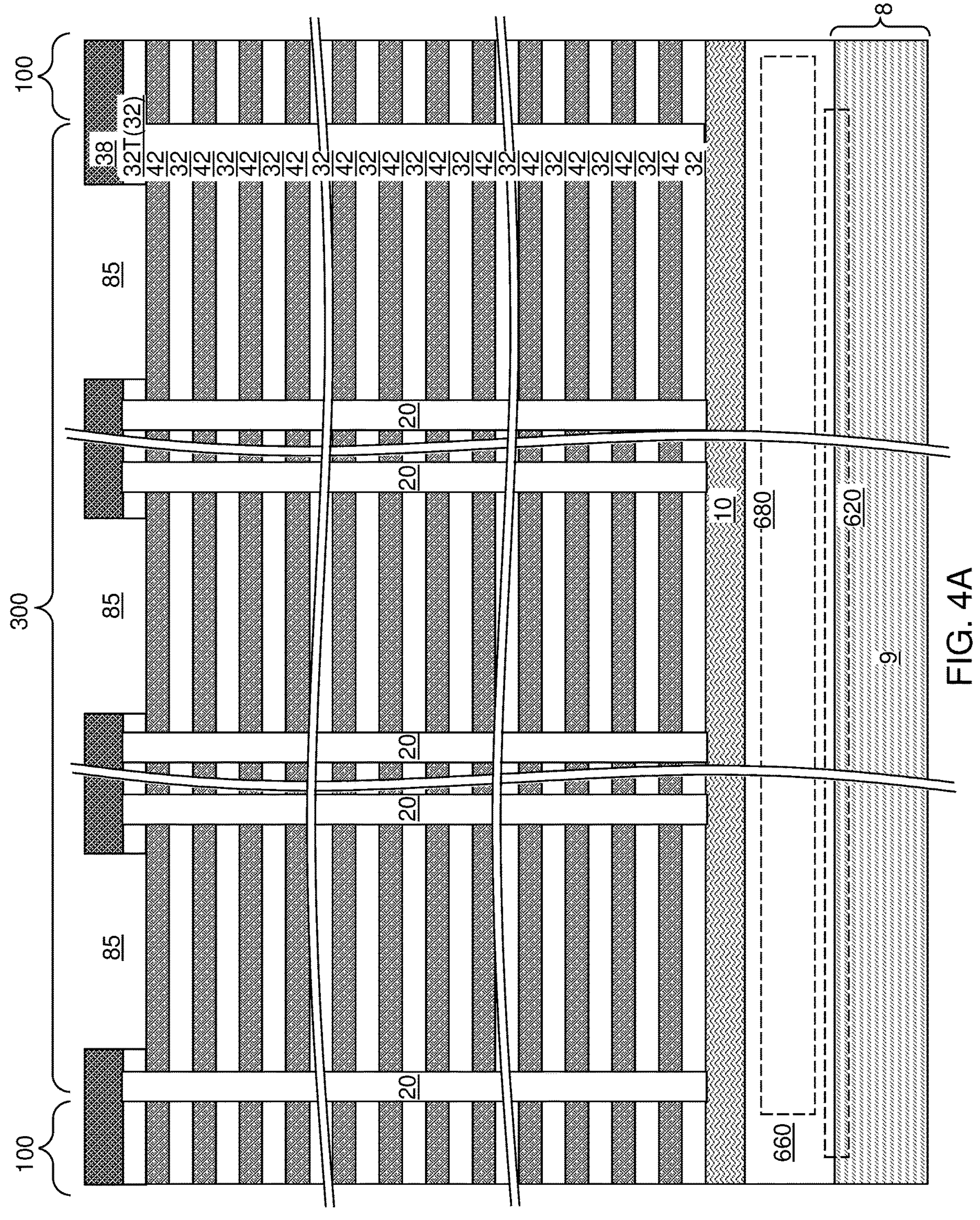
FIG. 4A is a schematic vertical cross-sectional view of the exemplary structure after formation of contact wells underneath openings in the patterned hard mask layer according to an embodiment of the present disclosure.
Figure 4B:
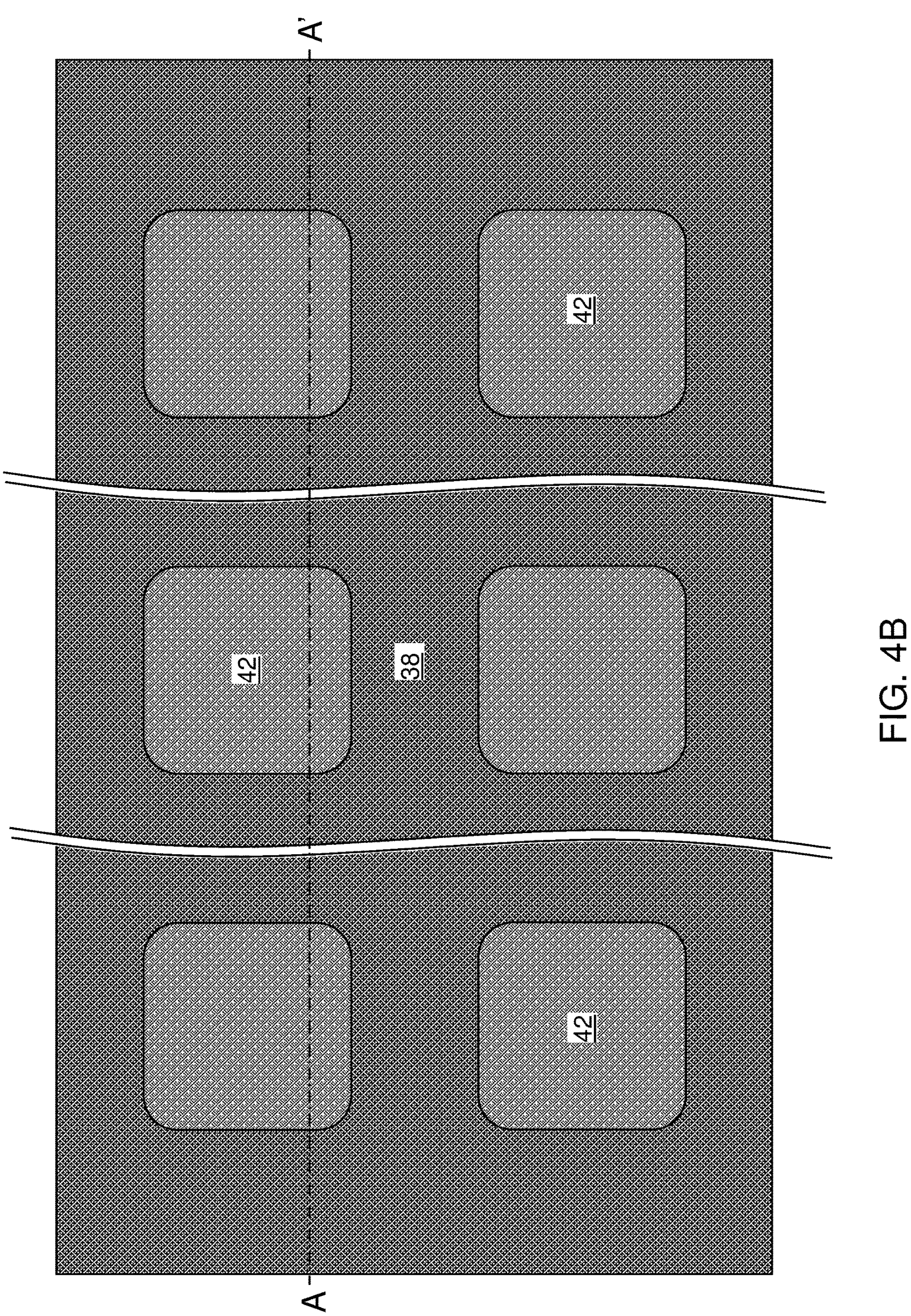
FIG. 4B is a top-down view of the exemplary structure of FIG. 4A. The vertical plane A-A' is the cut plane of the vertical cross-sectional view of FIG. 4A.

Referring to FIGS. 4A and 4B, a first anisotropic etch process can be performed to transfer the pattern of the openings in the hard mask layer 38 through the topmost insulating layer 32T within the alternating stack (32, 42). Contact wells 85 are formed in volumes from which the material of the topmost insulating layer 32T is removed. In one embodiment, each contact well 85 may comprise a pair of first sidewalls that laterally extend along the first horizontal direction hd1 and a pair of second sidewalls that laterally extend along the second horizontal direction hd2. The pair of first sidewalls may be adjoined directly to the pair of second sidewalls directly, or indirectly through laterally-concave and vertically-straight sidewalls located at corner regions.

Figure 5A:
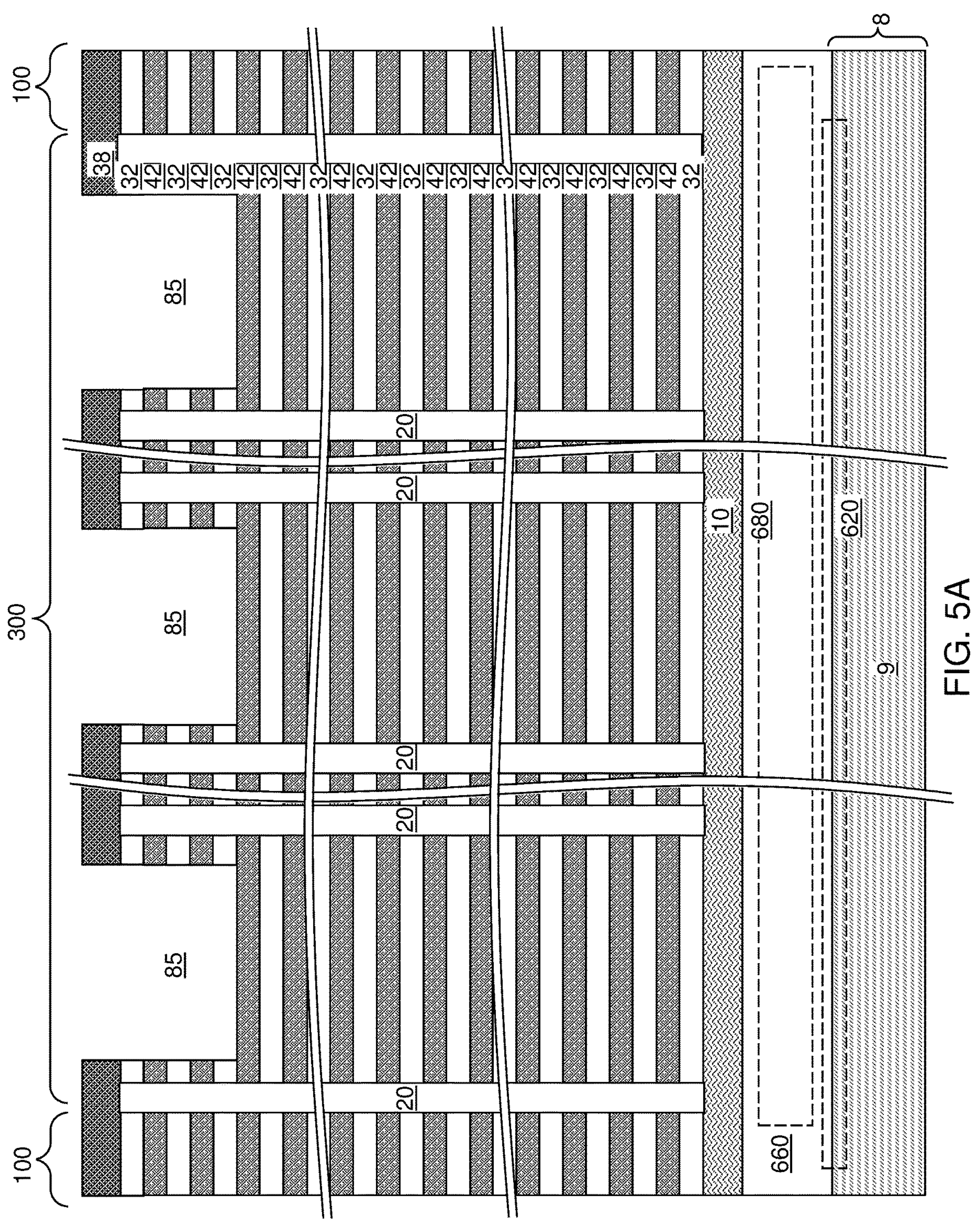
FIG. 5A is a schematic vertical cross-sectional view of the exemplary structure after formation of a first patterned photoresist layer and performing a first anisotropic etch process that vertically extends first areas of the contact wells according to an embodiment of the present disclosure.
Figure 5B:
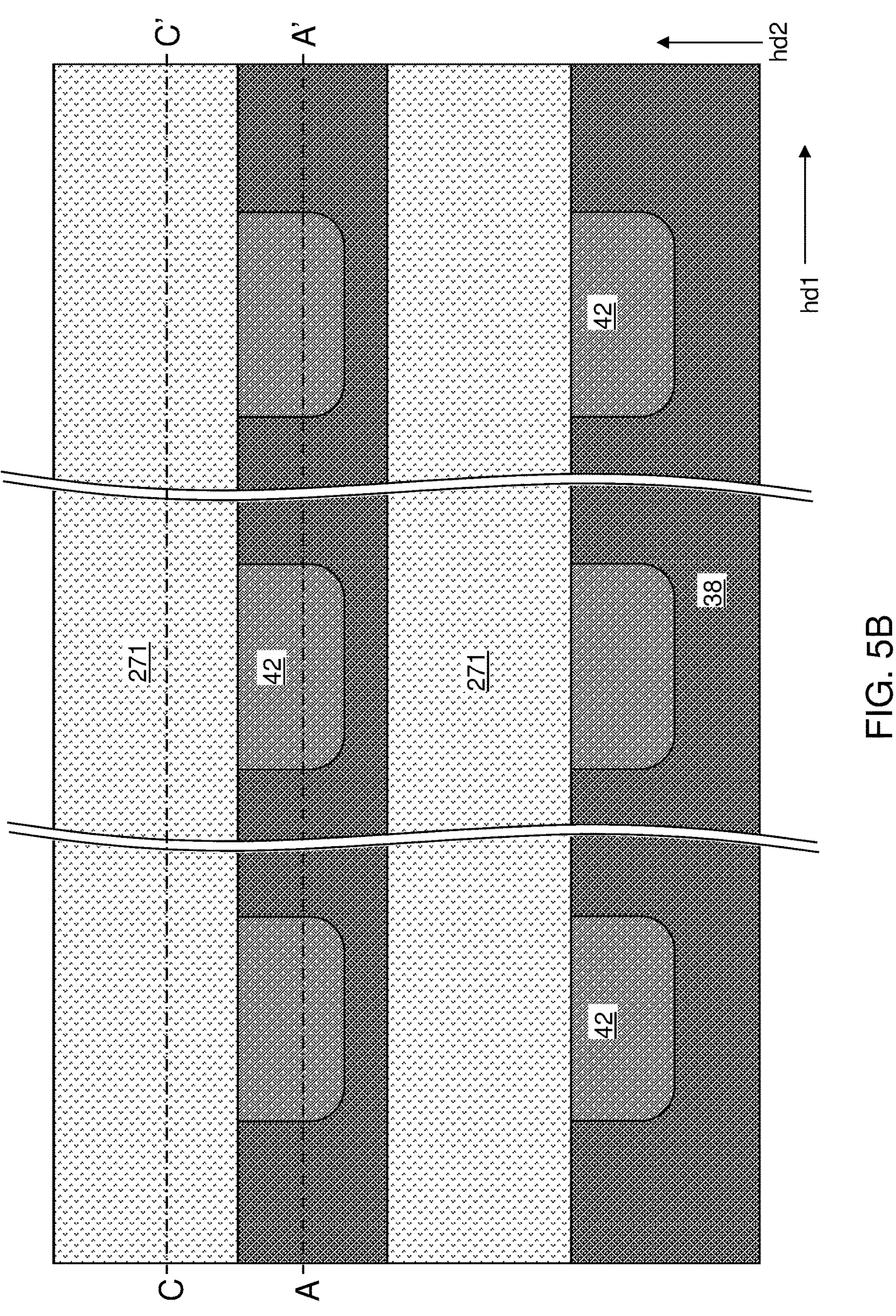
FIG. 5B is a top-down view of the exemplary structure of FIG. 5A. The vertical plane A-A' is the cut plane of the vertical cross-sectional view of FIG. 5A.
Figure 5C:
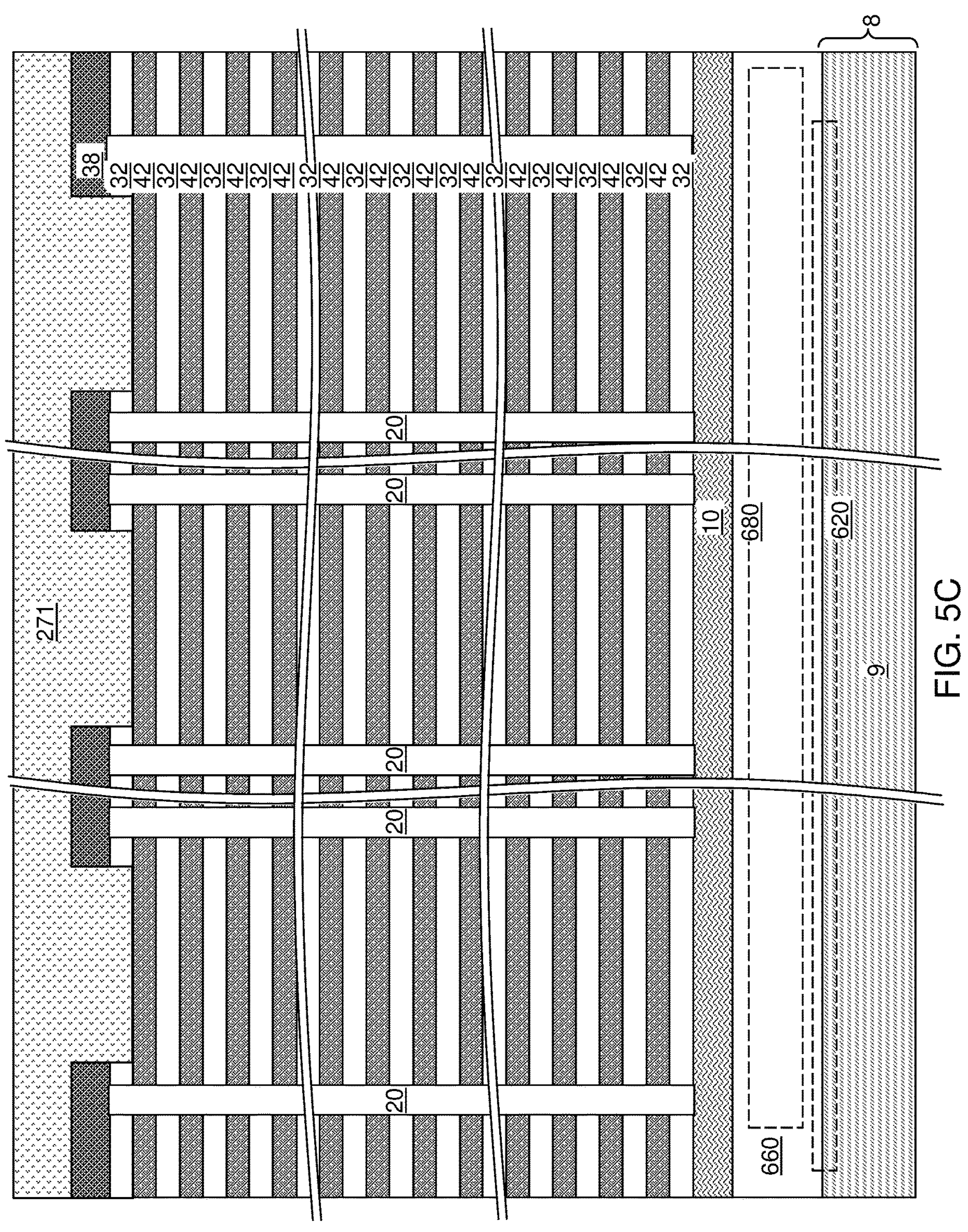
FIG. 5C is a vertical cross-sectional view of the exemplary structure along the vertical plane C-C' of FIG. 5B.

Referring to FIGS. 5A-5C, a first photoresist layer 271 can be applied over the alternating stack (32, 42), and can be lithographically patterned to form edges that laterally extend along the first horizontal direction hd1. In one embodiment, the first photoresist layer 271 may be patterned into a line-and-space pattern such that each remaining strip of the first photoresist layer 271 covers about one half of each contact well 85 within a respective underlying row of contact wells 85 that are arranged along the first horizontal direction hd1. In one embodiment, the patterned strips of the first photoresist layer 271 may have straight edges that laterally extend along the first horizontal direction hd1 and straddle a respective row of openings in the hard mask layer 38. Each of the contact wells 85 may comprise a first area that is not covered by any portion of the first photoresist layer 271, and a second area that is covered by a respective overlying patterned strip of the first photoresist layer 271. In one embodiment, the size of the second area can be about the same as the size of the first area within each contact well 85 in a plan view.

A first anisotropic etch process can be performed to vertically extends the first areas of the contact wells 85 that are not covered by the first photoresist layer 271 by an vertical etch distance, which can be an integer multiple of the sum of the thickness of a sacrificial material layer 42 and an insulating layer 32. Generally, the first anisotropic etch process etches at least one first pair of an insulating layer 32 and a spacer material layer (such as a sacrificial material layer 42) within the alternating stack (32, 42) that is not masked by the patterned hard mask layer 38 or the first patterned photoresist layer 271. The combination of the hard mask layer 38 and the first photoresist layer 271 functions as a composite etch mask for the first anisotropic etch process. In the illustrated example, the first areas of the contact wells 85 that are not covered by the first photoresist layer 271 are vertically extended by a vertical etch distance that equals twice the sum of the thickness of a sacrificial material layer 42 and the thickness of an insulating layer 32. The first photoresist layer 271 can be subsequently removed. A stepped bottom surface having two horizontally-extending surfaces and a vertically-extending connecting surface can be formed at the bottom of each contact well 85.

Figure 6A:
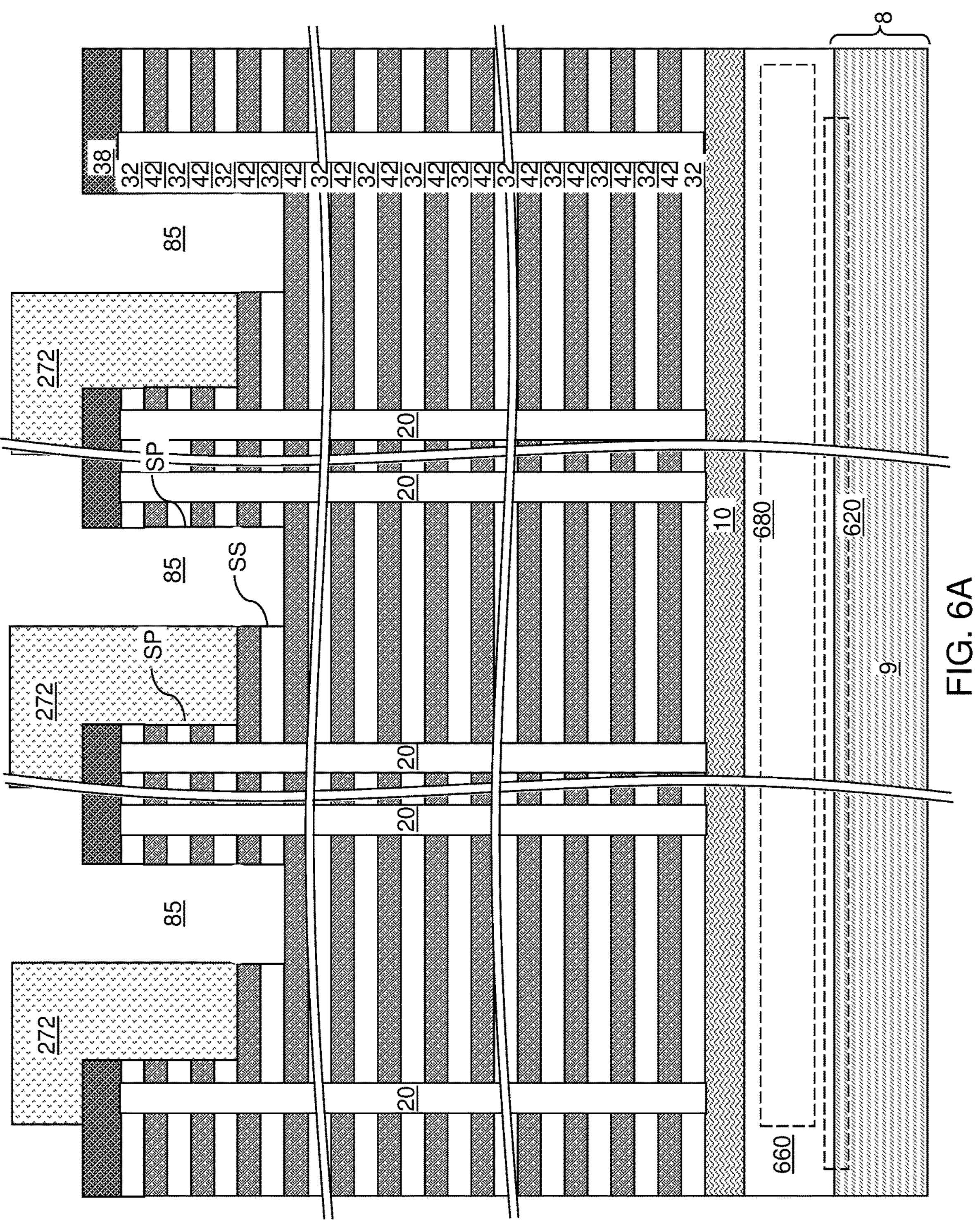
FIG. 6A is a schematic vertical cross-sectional view of the exemplary structure after formation of a second patterned photoresist layer and performing a second anisotropic etch process that vertically extends second areas of the contact wells according to an embodiment of the present disclosure.
Figure 6B:
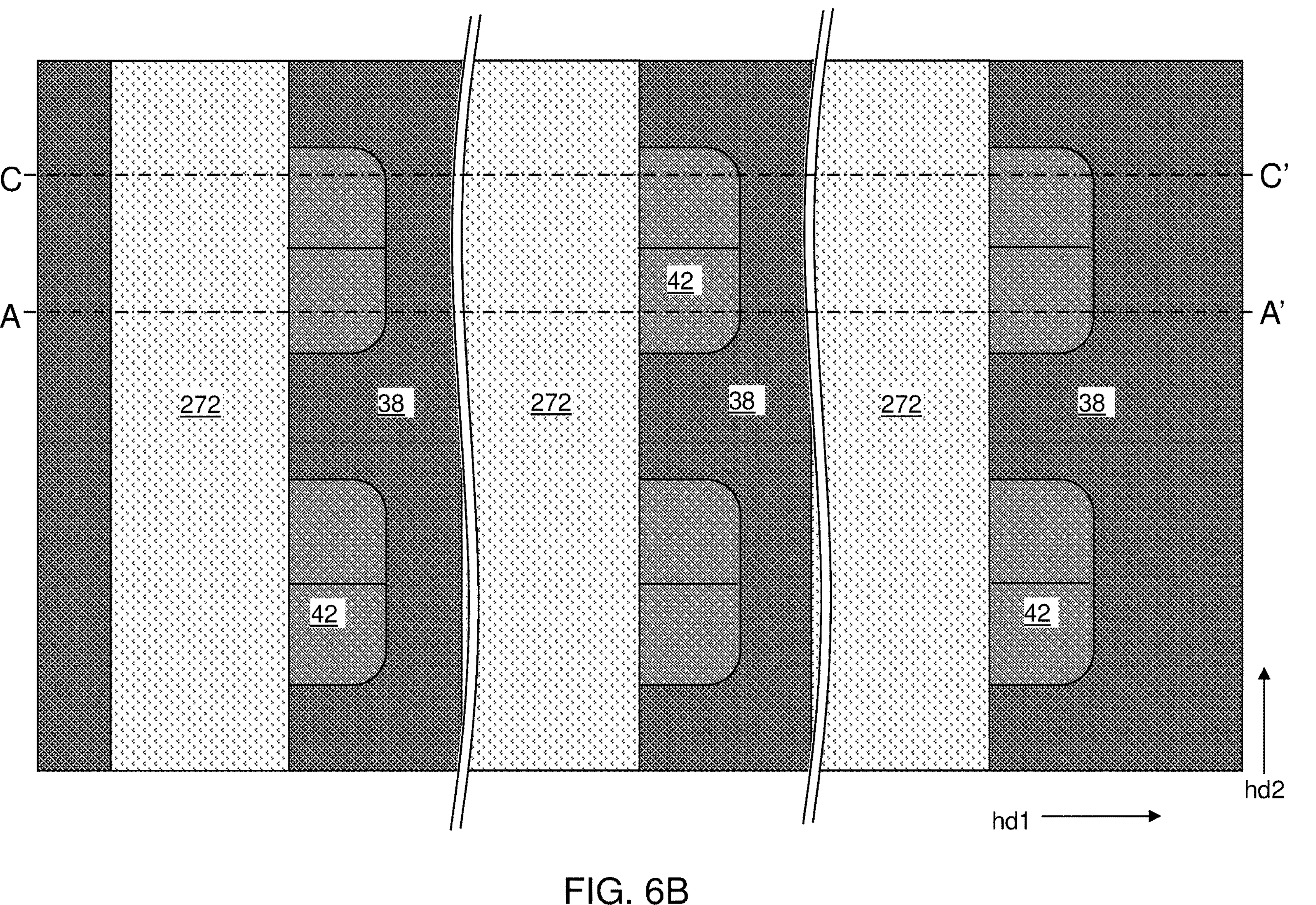
FIG. 6B is a top-down view of the exemplary structure of FIG. 6A. The vertical plane A-A' is the cut plane of the vertical cross-sectional view of FIG. 6A.
Figure 6C:
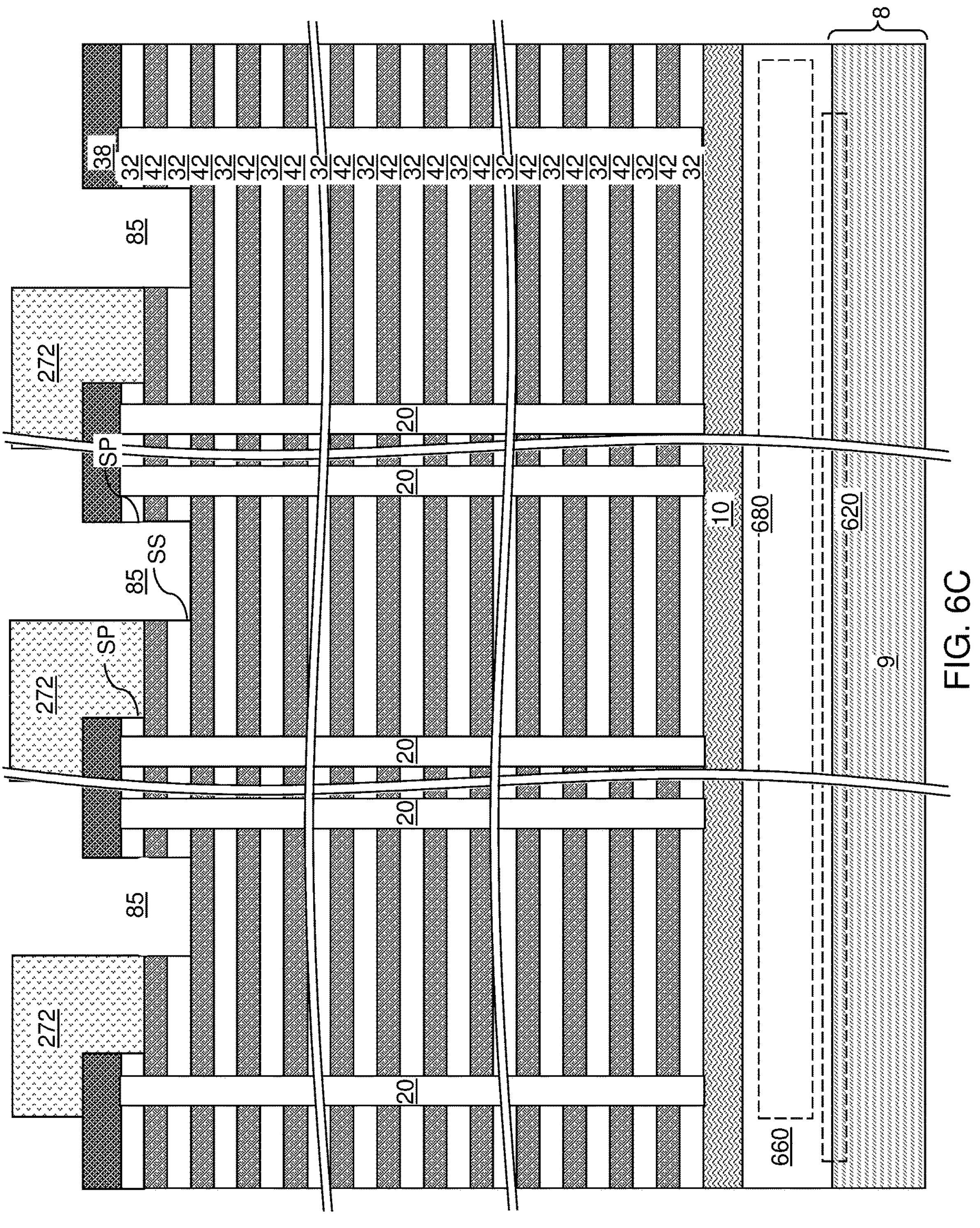
FIG. 6C is a vertical cross-sectional view of the exemplary structure along the vertical plane C-C' of FIG. 6B.

Referring to FIGS. 6A-6C, a second photoresist layer 272 can be applied over the alternating stack (32, 42), and can be lithographically patterned to form edges that laterally extend along the second horizontal direction hd2, which is different from the first horizontal direction hd1. In one embodiment, the second horizontal direction hd2 may be perpendicular to the first horizontal direction hd1. In one embodiment, the second photoresist layer 272 may be patterned into a line-and-space pattern such that each remaining strip of the second photoresist layer 272 covers about one half of each contact well 85 within a respective underlying column of contact wells 85 that are arranged along the second horizontal direction hd2. In one embodiment, the patterned strips of the second photoresist layer 272 may have straight edges that laterally extend along the second horizontal direction hd2 and straddle a respective column of openings in the hard mask layer 38. Each of the contact wells 85 may comprise a first area that is not covered by any portion of the second photoresist layer 272, and a second area that is covered by a respective overlying patterned strip of the second photoresist layer 272. In one embodiment, the size of the second area can be about the same as the size of the first area within each contact well 85 in a plan view.

A second anisotropic etch process can be performed to vertically extends the first areas of the contact wells 85 that are not covered by the second photoresist layer 272 by a vertical etch distance, which can be an integer multiple of the sum of the thickness of a sacrificial material layer 42 and an insulating layer 32. Generally, the second anisotropic etch process etches at least one second pair of an insulating layer 32 and a spacer material layer (such as a sacrificial material layer 42) within the alternating stack (32, 42) that is not masked by the patterned hard mask layer 38 or the second patterned photoresist layer 272. The combination of the hard mask layer 38 and the second photoresist layer 272 functions as a composite etch mask for the second anisotropic etch process. In the illustrated example, the first areas of the contact wells 85 that are not covered by the second photoresist layer 272 are vertically extended by an vertical etch distance that equals the sum of the thickness of a sacrificial material layer 42 and the thickness of an insulating layer 32. The second photoresist layer 272 can be subsequently removed, for example, by ashing. A stepped bottom surface having four horizontally-extending surfaces and four vertically-extending connecting surfaces can be formed at the bottom of each contact well 85.

While an embodiment is described in which only one first photoresist layer 271 is employed during the processing steps described with reference to FIGS. 5A-5C and only one second photoresist layer 272 is employed during the processing steps described with reference to FIGS. 6A-6C, alternative embodiments are expressly contemplated herein in which a plurality of photoresist layers is employed during the processing steps described with reference to FIGS. 5A-5C and/or during the processing steps described with reference to FIGS. 6A-6C. Generally, M horizontally-extending surfaces adjoined by (M−1) vertically-extending surfaces can be formed at the bottom of each contact well 85 during the processing steps described with reference to FIGS. 5A-5C by employing M first photoresist layers 271, each of which is patterned into line-and-space patterns that laterally extend along the first horizontal direction hd1. The integer M is greater than 1. Further, M×N horizontally-extending surfaces adjoined by N×(M−1)+(N−1)×M vertically-extending surfaces can be formed at the bottom of each contact well 85 during the processing steps described with reference to FIGS. 6A-6C by employing N second photoresist layers 272, each of which is patterned into line-and-space patterns that laterally extend along the first horizontal direction hd1. The vertically-extending surfaces are also referred to as secondary sidewalls SS. The integer N is greater than 1. In the illustrated example, the integer M is 2, and the integer N is 2.

Generally, each contact well 85 can be formed with a plurality of bottom (i.e., horizontal) surface segments (such as M×N bottom surface segments) that are vertically spaced apart from each other. Each of the contact wells 85 may comprises a plurality of primary sidewalls SP that are parallel to the first horizontal direction hd1 or to the second horizontal direction hd2, and have a respective top edge within the top periphery of a respective contact well 85. Each of the primary sidewalls SP has a respective stepped bottom edge containing at least two horizontally-extending edge segments and at least one vertically-extending edge segment. Each primary sidewall SP that laterally extends along the first horizontal direction hd1 may contain M horizontally-extending edge segments and (M−1) vertically-extending edge segment(s). Each primary sidewall SP that laterally extends along the second horizontal direction hd2 may contain N horizontally-extending edge segments and (N−1) vertically-extending edge segment(s). Each horizontally-extending edge segment within a stepped bottom edges of a contact well 85 may coincide with an edge of a respective bottom surface segment of the plurality of bottom surface segments of the contact well 85. Horizontal surface segments of M×N different sacrificial material layers 42 can be physically exposed at the bottom of each contact well 85. In the illustrated embodiment, top surfaces of four different sacrificial material layers 42 are physically exposed at the bottom of each contact well 85.

Figure 7A:
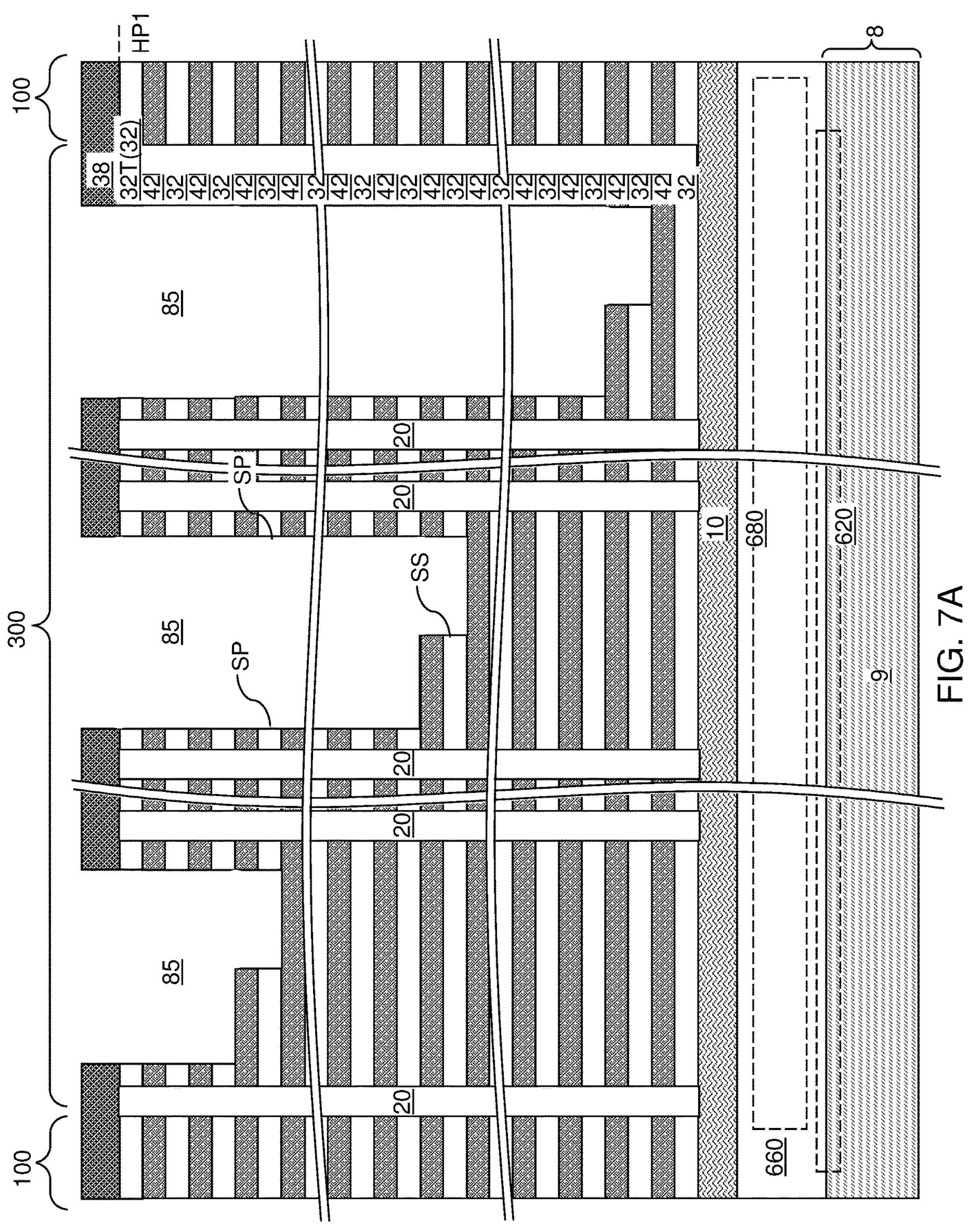
FIG. 7A is a schematic vertical cross-sectional view of the exemplary structure after vertically extending the contact wells by different recess depths according to an embodiment of the present disclosure.
Figure 7B:
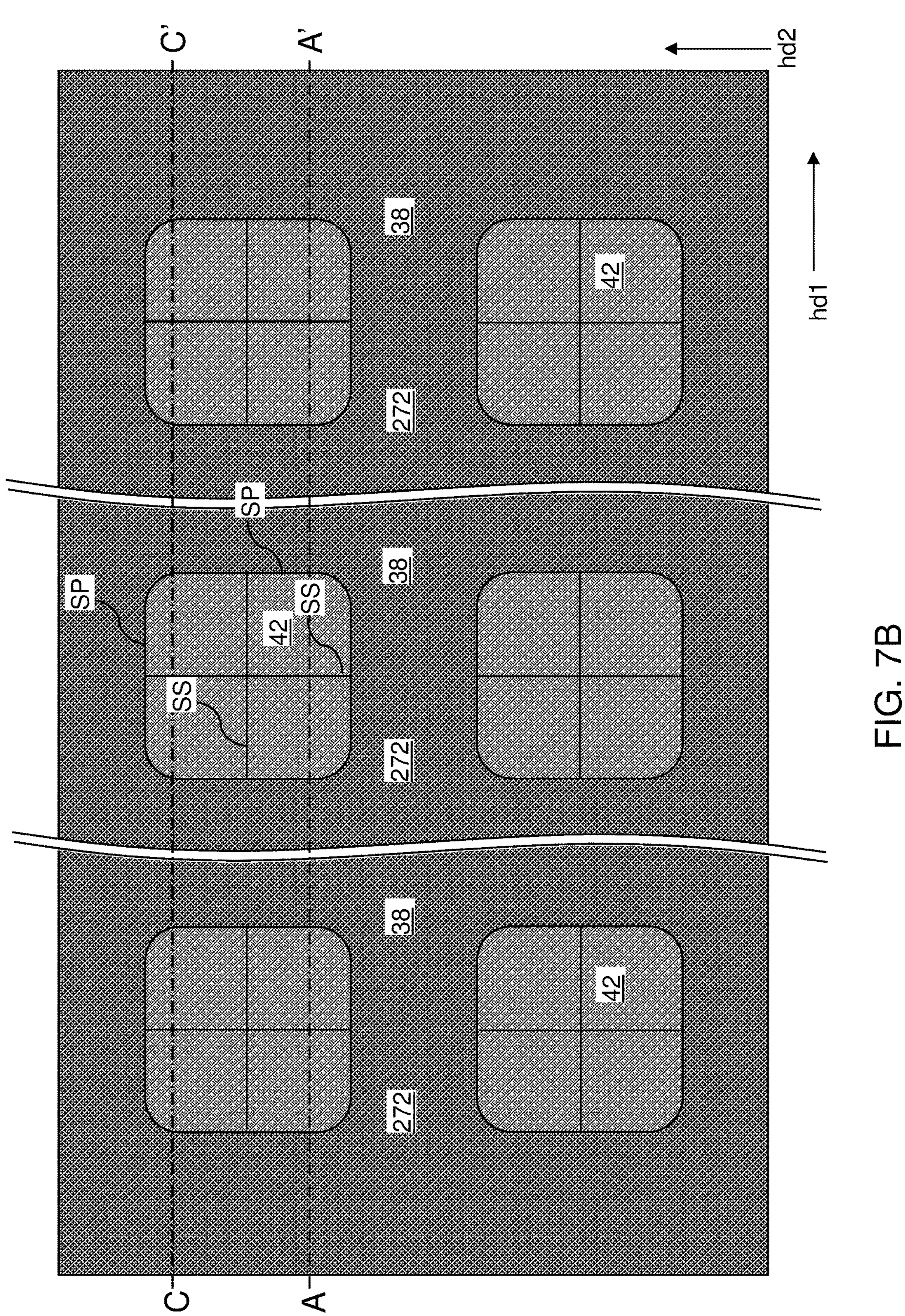
FIG. 7B is a top-down view of the exemplary structure of FIG. 7A. The vertical plane A-A' is the cut plane of the vertical cross-sectional view of FIG. 7A.
Figure 7C:
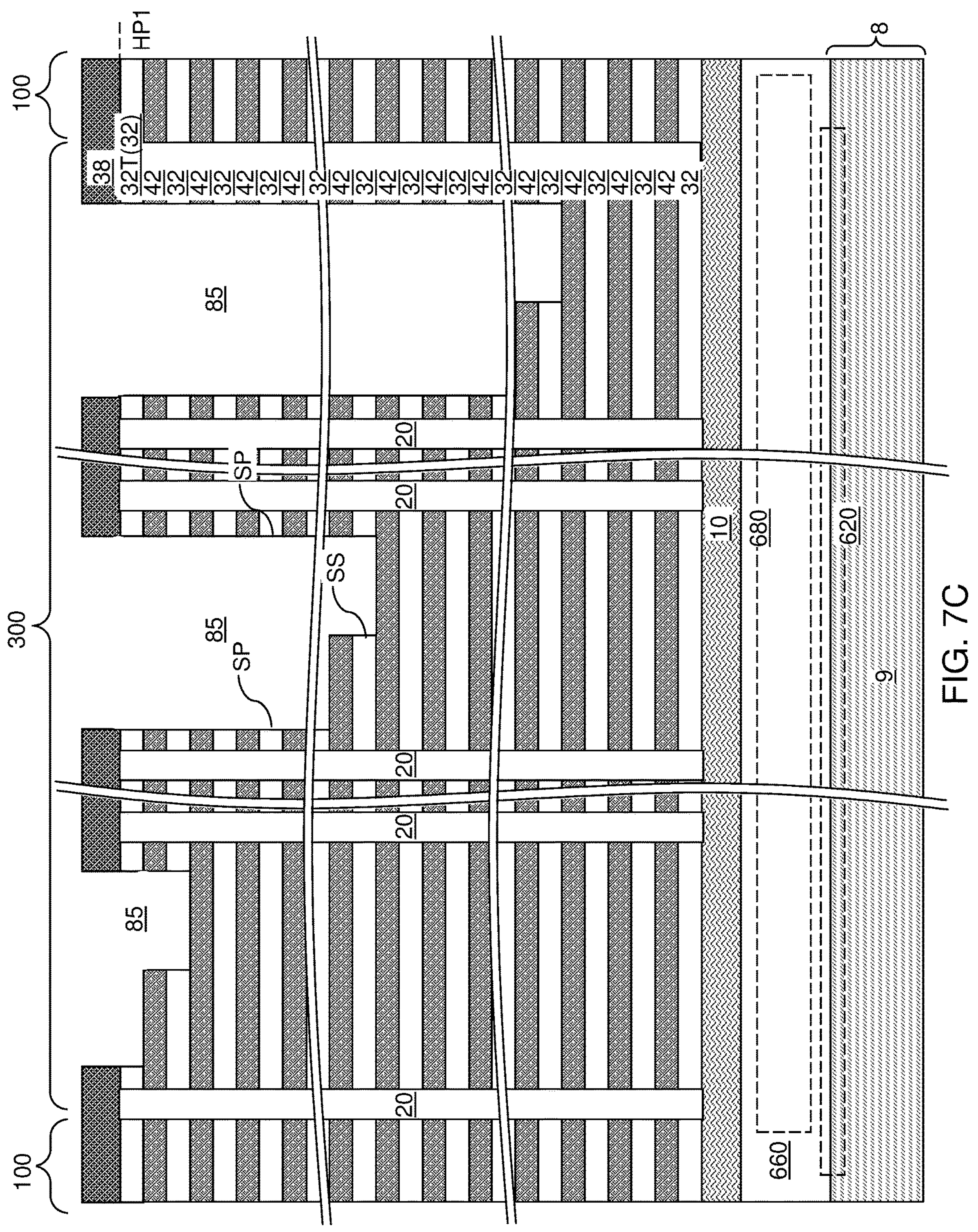
FIG. 7C is a vertical cross-sectional view of the exemplary structure along the vertical plane C-C' of FIG. 7B.
Figure 8A:
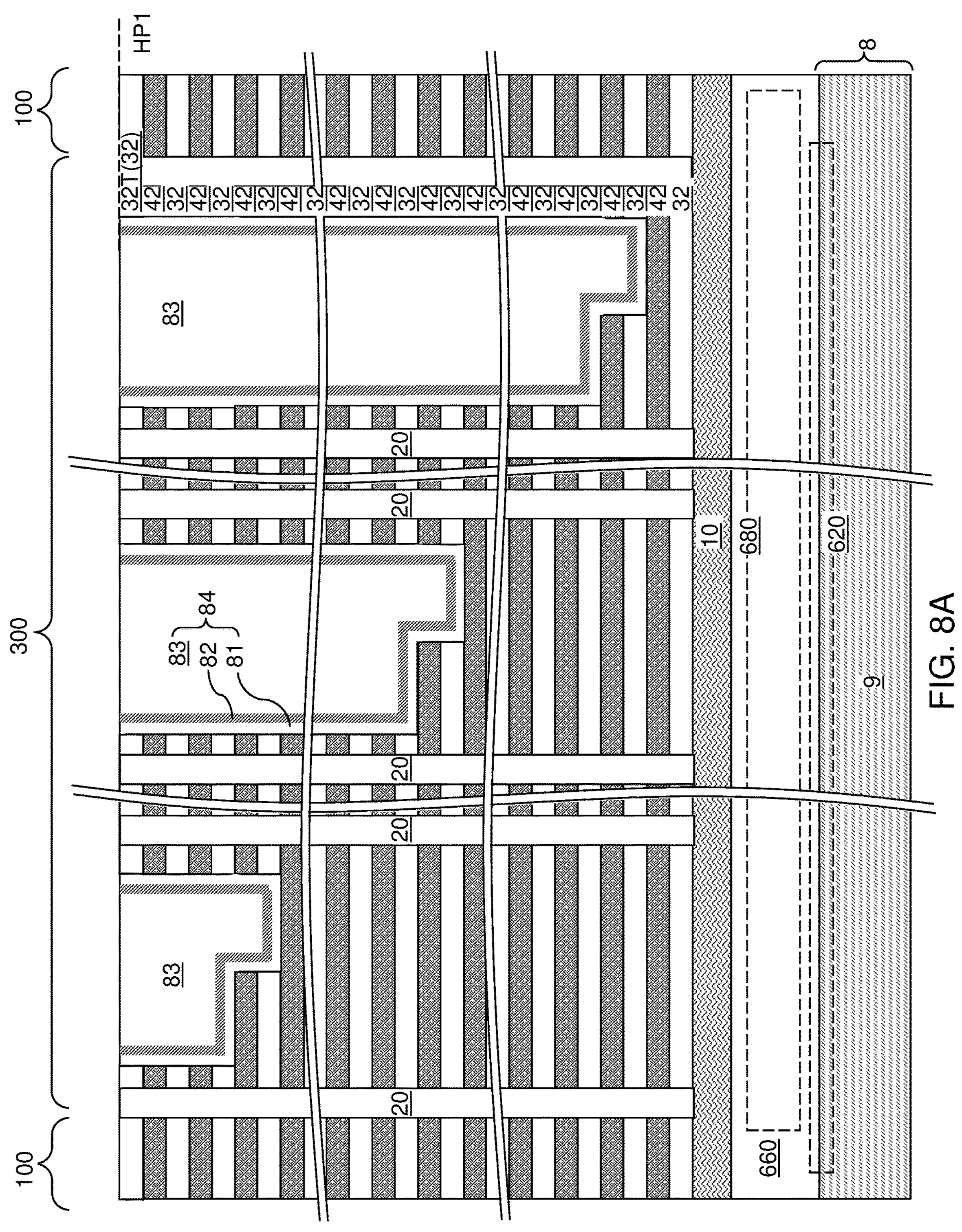
FIG. 8A is a schematic vertical cross-sectional view of the exemplary structure after formation of dielectric fill structures in the contact wells according to an embodiment of the present disclosure.
Figure 8B:
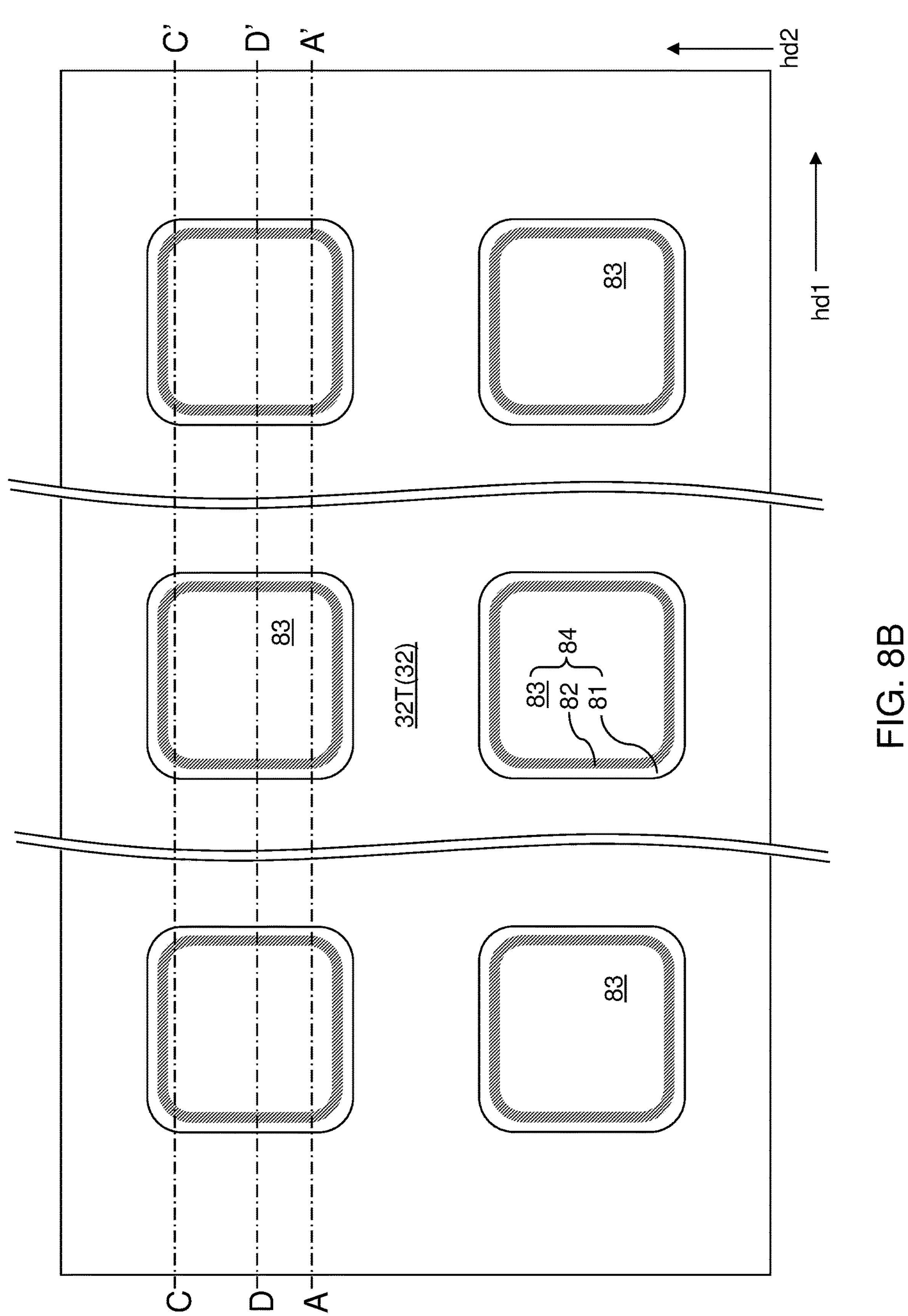
FIG. 8B is a top-down view of the exemplary structure of FIG. 8A. The vertical plane A-A' is the cut plane of the vertical cross-sectional view of FIG. 8A.
Figure 8C:
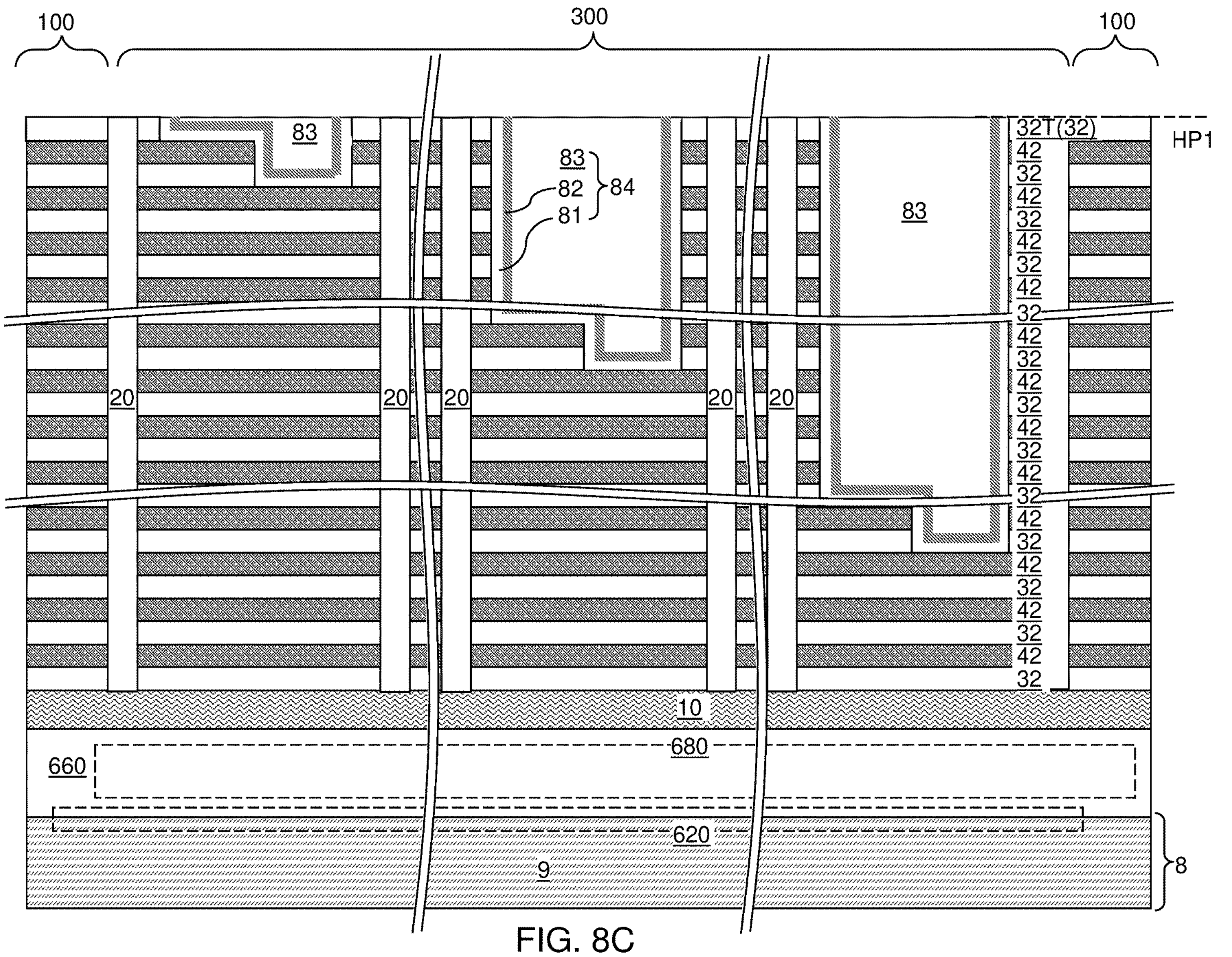
FIG. 8C is a vertical cross-sectional view of the exemplary structure along the vertical plane C-C' of FIG. 8B.
Figure 8D:
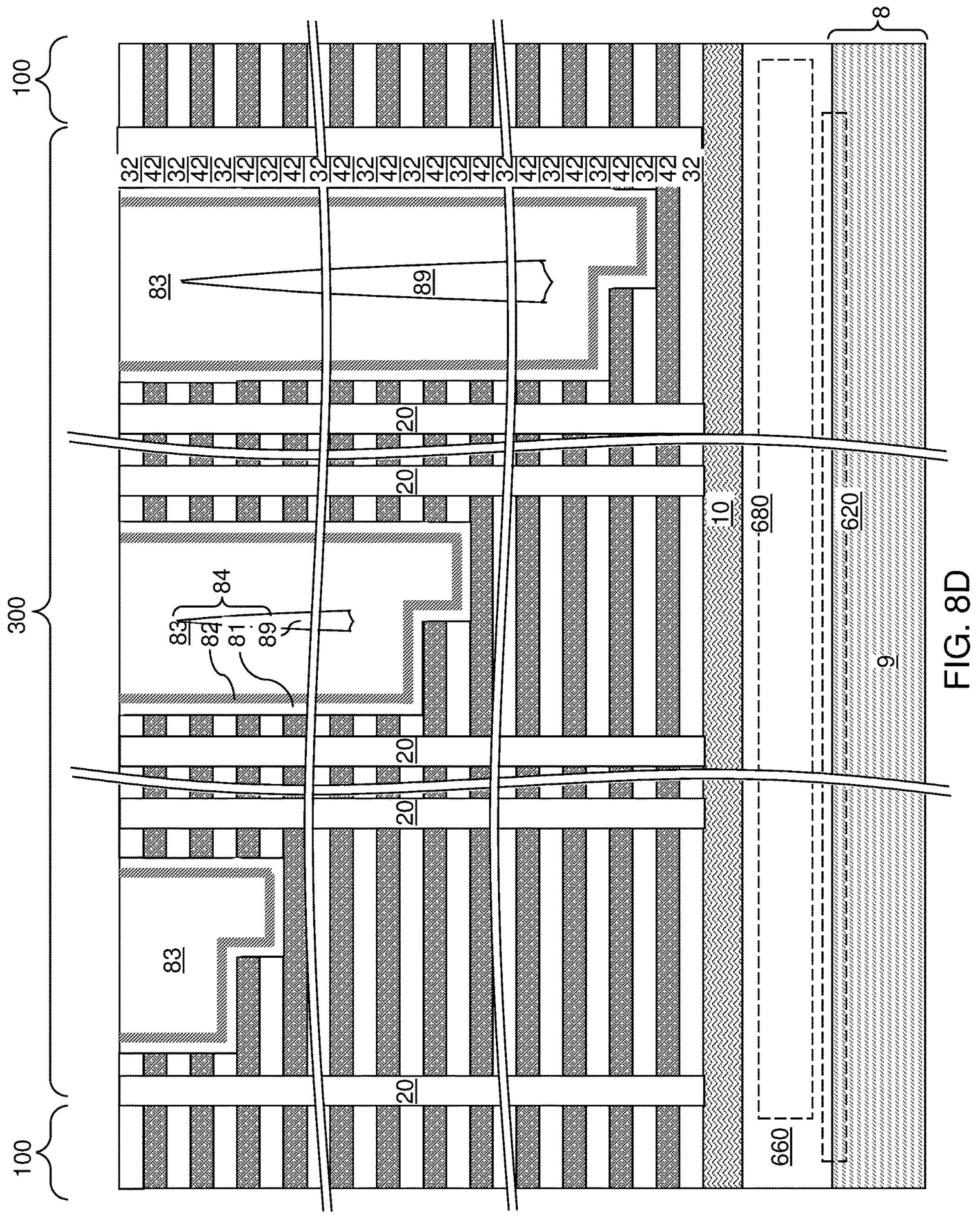
FIG. 8D is a vertical cross-sectional view of the exemplary structure along the vertical plane D-D' of FIG. 8B.

Referring to FIGS. 7A-7C, the various contact wells 85 located within a respective row of contact wells 85 may be vertically extended by different vertical extension distances. In one embodiment, the different vertical extension distances may be integer multiples of the product of M and N, and the sum of the thickness of an insulating layer 32 and the thickness of a sacrificial material layer 42. In one embodiment, one contact well 85 within each row of contact wells 85 may not be vertically extended so that a set of M×N (e.g., four) topmost sacrificial material layers 42 has top surface segments that are physically exposed to a contact well 85.

Generally, the contact wells 85 may be vertically extended by performing multiple iterations of a combination of a respective masking process and a respective anisotropic etch process. Each iteration of the combination of the respective masking process and the respective anisotropic etch process can be employed to etch through a respective subset of sacrificial material layers 42 and a subset of the first insulating layers 32 underneath a selected subset of the contact wells 85 that is selected for the iteration. Each masking process forms a respective patterned photoresist layer (not shown) that masks a respective subset of the contact wells 85 without masking a respective complementary subset of the contact wells 85. Each anisotropic etch process etches a respective number (which is a respective integer multiple of the number M×N) of pairs of a sacrificial material layers 42 and an insulating layer 32 underneath a respective subset of the contact wells 85 that is not masked by a respective patterned photoresist layer. In one embodiment, the number of etched sacrificial material layers 42 and etched insulating layers 32 underneath unmasked contact wells 85 may be a non-negative integer power of 2, i.e., 2, 4, 8, 16, 32, 64, etc. Thus, the number of pairs of an insulating layer 32 and a sacrificial material layer 42 that is etched through during each anisotropic etch process may be the product of M×N and a non-negative integer power of 2, i.e., 2×M×N, 4×M×N, 8×M×N, 16×M×N, 32×M×N, 64×M×N, etc. By employing a combination of various masking patterns for the patterned photoresist layers, the depths of the contact wells 85 can be varied to physically expose of the top surfaces of all sacrificial material layers 42 within the alternating stack (32, 42) underneath each row of contact wells 85.

Each contact well 85 vertically extends through a respective subset of layers of the alternating stack (32, 42) that includes a topmost insulating layer 32T of the insulating layers 32. Each contact well 85 comprises a plurality of primary sidewalls SP, each having a respective stepped bottom edge containing at least two horizontally-extending edge segments and at least one vertically-extending edge segment. Each contact well 85 is formed with a plurality of bottom surface segments (such as M×N bottom surface segments) that are vertically spaced apart from each other. Each horizontally-extending edge segment within the stepped bottom edges of the contact well 85 coincides with an edge of a respective bottom surface segment of the plurality of bottom surface segments.

In one embodiment, each of the primary sidewalls SP comprises a respective top edge located entirely within a first horizontal plane HP1, and the top edges of the primary sidewalls SP are adjoined to each other to define a top periphery of the contact well 85. The first horizontal plane HP1 may include the top surface of a topmost layer within the alternating stack (32, 42), such as the top surface of the topmost insulating layer 32T. In one embodiment, each contact well 85 comprises a plurality of bottom surface segments (such as M×N bottom surface segments) that are vertically spaced apart from each other, and each horizontally-extending edge segment within the stepped bottom edges of the contact well 85 coincides with an edge of a respective bottom surface segment of the plurality of bottom surface segments.

In one embodiment, each contact well 85 comprises a plurality of secondary sidewalls SS (such as M×(N−1)+(M−1)×N secondary sidewalls SS) that are not vertically coincident with any of the plurality of primary sidewalls SP.

In one embodiment, a top periphery of each contact well 85 can be located entirely within a first horizontal plane HP1 including a top surface of a topmost layer within the alternating stack (32, 42). In one embodiment, each primary sidewall SP of the plurality of primary sidewalls SP can be parallel to the first horizontal direction hd1 or perpendicular to the first horizontal direction hd1.

Referring to FIGS. 8A-8D, at least one dielectric material can be deposited in the contact wells 85, and excess portions of the at least one dielectric material can be removed from above the first horizontal plane HP1 including the topmost surface of the alternating stack (32, 42). For example, at least one dielectric liner (81, 82) can be conformally deposited at a peripheral region of the contact wells 85 and over the topmost surface of the alternating stack (32, 42). The at least one dielectric liner (81, 82) can include a first dielectric liner 81 that includes a first dielectric material that is different from the material of the sacrificial material layers 42 and can function as an etch stop material during subsequent removal of the sacrificial material layers 42. For example, the first dielectric liner 81 may comprise a silicon oxide liner. The thickness of the first dielectric liner 81 may be in a range from 6 nm to 100 nm, although lesser and greater thicknesses may also be employed. The at least one dielectric liner (81, 82) can further include a second dielectric liner 82 that includes a second dielectric material that is different from the first dielectric material and can function as an etch stop material during subsequent anisotropic etch process employed to form contact via cavities. For example, the second dielectric liner 82 may comprise silicon nitride or a dielectric metal oxide. The thickness of the second dielectric liner 82 may be in a range from 10 nm to 100 nm, although lesser and greater thicknesses may also be employed.

Subsequently, a dielectric fill material, such as undoped silicate glass (i.e., silicon oxide), a doped silicate glass, or organosilicate glass can be deposited in volumes of the contact wells 85 that are not filled by the at least one dielectric liner (81, 82) to form dielectric fill material portions 83. In some embodiments, an optional air gap 89 that is encapsulated by the dielectric fill material portions 83 may be formed within a subset of the contact wells 85 having a high aspect ratio (i.e., a height to width ratio). Alternatively, the air gaps 89 may be omitted. Portions of the dielectric fill material and the at least one dielectric liner (81, 82) can be removed from above a horizontal plane located at, or above, a topmost surface of the alternating stack (32, 42) by performing a planarization process, such as a chemical mechanical polishing process. In one embodiment, the hard mask layer 38 may be employed as a planarization stopping layer, such as a polishing stop layer. Further, the dielectric fill material and the at least one dielectric liner (81, 82) can be recessed, for example, by performing a recess etch process such that remaining portions of the dielectric fill material which comprise the dielectric fill material portion 83 and the at least one dielectric liner (81, 82) have top surfaces at the first horizontal plane HP1 including the topmost surface of the alternating stack (32, 42).

Each combination of the dielectric fill material portion 83 and the at least one dielectric liner (81, 82) that fill a respective contact well 85 constitutes a dielectric fill structure 84. Each dielectric fill structure 84 may comprise at least one dielectric liner (81, 82) and the dielectric fill material portion 83. In one embodiment, each dielectric fill material portion 83 comprises a dielectric fill material selected from undoped silicate glass, a doped silicate glass, and organosilicate glass. Each at least one dielectric liner (81, 82) can be located at a peripheral region of a respective contact well 85, and each dielectric fill material portion 83 can be laterally surrounded by the at least one dielectric liner (81, 82).

In one embodiment, each of the insulating layers 32 may have a first thickness, each of the sacrificial material layers 42 may have a second thickness, and the horizontally-extending portions of the at least one dielectric liner (81, 82) may be vertically offset from each other by integer multiples of a sum of the first thickness and the second thickness. In one embodiment, the at least one dielectric liner (81, 82) within each dielectric fill structure 84 comprises a silicon oxide liner as a first dielectric liner 81, which is in direct contact with the plurality of primary sidewalls SP of the contact well 85 and a plurality of bottom surface segments of the contact well 85, and further comprises a second dielectric liner 82 comprising a dielectric material other than silicon oxide and contacting inner sidewalls of the silicon oxide liner 81.

The hard mask layer 38 can be subsequently removed by performing a selective etch process (or an ashing process for a carbon hard mask material) that removes the material of the hard mask layer 38 selective to the materials of the topmost insulating layer 32T and the dielectric fill material portions 83. In one embodiment, top surfaces of the dielectric fill structures 84 in each contact well 85 may be formed within a same horizontal plane, such as the first horizontal plane HP1.

FIGS. 9A-9F are sequential schematic vertical cross-sectional views of a memory opening 49 within the exemplary structure during formation of a memory opening fill structure 58 according to an embodiment of the present disclosure.

Figures 9A, 9B:
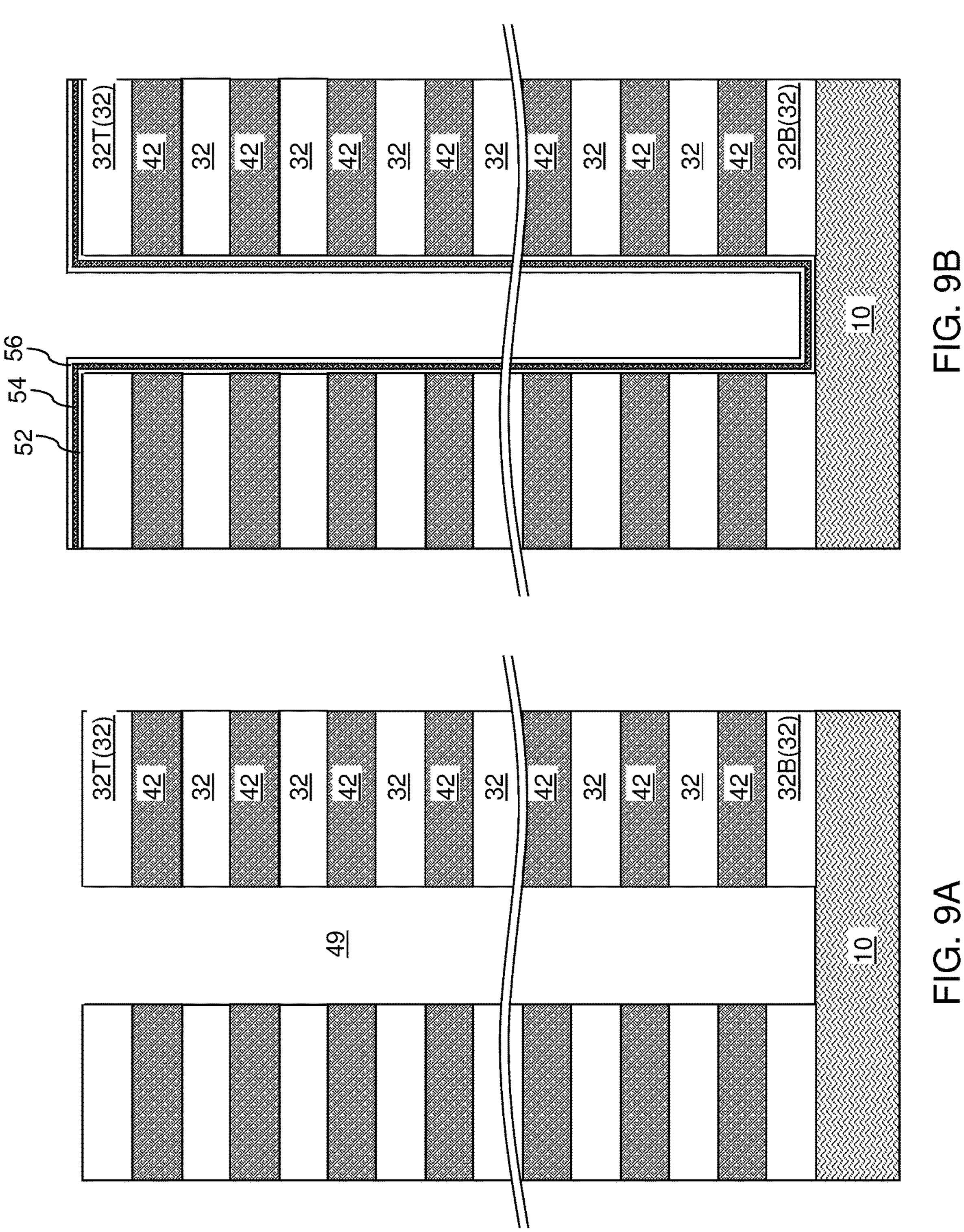
FIGS. 9A-9F are sequential schematic vertical cross-sectional views of a memory opening within the exemplary structure during formation of a memory opening fill structure according to an embodiment of the present disclosure.

Referring to FIG. 9A, at least one two-dimensional array of memory openings 49 can be formed within each memory array region 100. For example, a photoresist layer (not shown) can be applied over the topmost surface of the alternating stack (32, 42), and can be lithographically patterned to form arrays of discrete openings in the memory array regions 100. An anisotropic etch process can be performed to transfer the pattern of the openings in the photoresist layer through the alternating stack (32, 42). Each vertically-extending cavity that extends through the alternating stack (32, 42) constitutes a memory opening 49. Each memory opening 49 may vertically extend through each layer within the alternating stack (32, 42), and a surface of the semiconductor material layer 10 (if present) can be physically exposed at the bottom of each memory opening 49.

Referring to FIG. 9B, a layer stack including a memory material layer 54 can be conformally deposited. In an illustrative example, the layer stack may comprise an optional blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride), a ferroelectric material, a phase change memory material, or any other memory material that can store data bits by inducing a change in the electrical resistivity, ferroelectric polarization, or any other measurable physical property. In case the memory material layer 54 comprise a charge storage material, the optional dielectric liner 56 may comprise a tunneling dielectric layer.

Figures 9C, 9D:
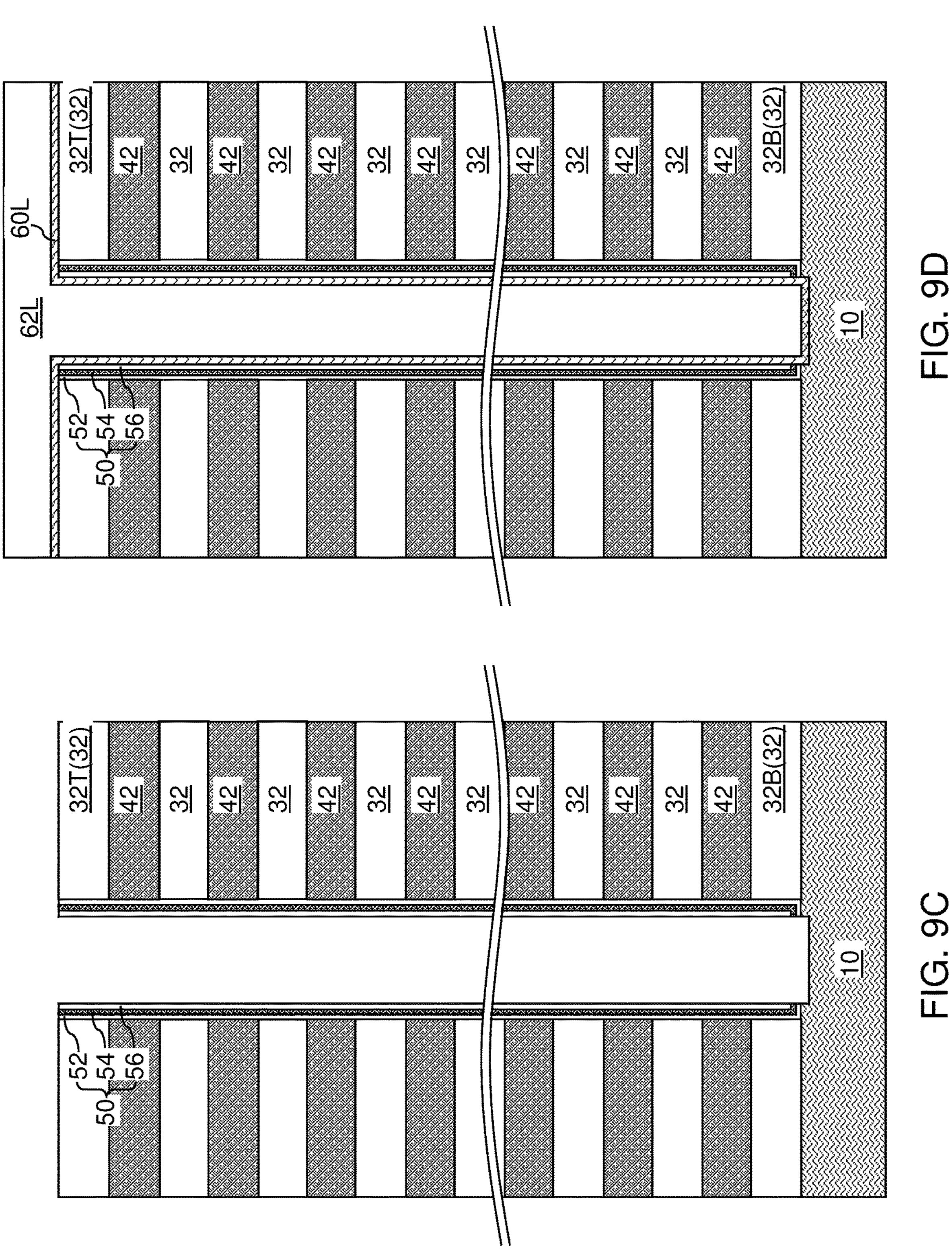

Referring to FIG. 9C, an optional sacrificial cover layer (such as a thin silicon layer; not shown) may be optionally deposited over the optional dielectric liner 56 (and/or over the memory material layer 54). An anisotropic etch process can be performed to remove horizontally-extending portions of the sacrificial cover layer, the optional dielectric liner 56, the memory material layer 54, and the blocking dielectric layer 52 at the bottom of each of the memory openings 49 and from above the topmost surface of the alternating stack (32, 42). A surface of the semiconductor material layer 10 can be physically exposed at the bottom of each memory opening 49. Remaining vertically-extending portions of the sacrificial cover layer can be subsequently removed by performing an isotropic etch process that etches the material of the sacrificial cover layer selective to the material of the optional dielectric liner 56 or the memory material layer 54. Each combination of remaining portions of the optional dielectric liner 56, the memory material layer 54, and the blocking dielectric layer 52 in a memory opening 49 constitutes a memory film 50.

Referring to FIG. 9D, a semiconductor channel material layer 60L can be deposited over the memory films 50 in the memory openings 49 by performing a conformal deposition process. If the semiconductor channel material layer 60L is doped, the semiconductor channel material layer 60L may have a doping of a first conductivity type, which may be p-type or n-type. In one embodiment, the first semiconductor material comprises a first doped silicon material (e.g., amorphous silicon or polysilicon) having a doping of the first conductivity type. In an illustrative example, the atomic concentration of dopants of the first conductivity type in the semiconductor channel material layer 60L may be in a range from $1.0\times10^{13}/cm^3$ to $3.0\times10^{17}/cm^3$, such as $1.0\times10^{14}/cm^3$ to $3.0\times10^{16}/cm^3$, although lesser and greater atomic concentrations may also be employed. A dielectric core layer 62L comprising a dielectric fill material can be deposited in remaining volumes of the memory openings 49 and over the alternating stack (32, 42).

Figures 9E, 9F:
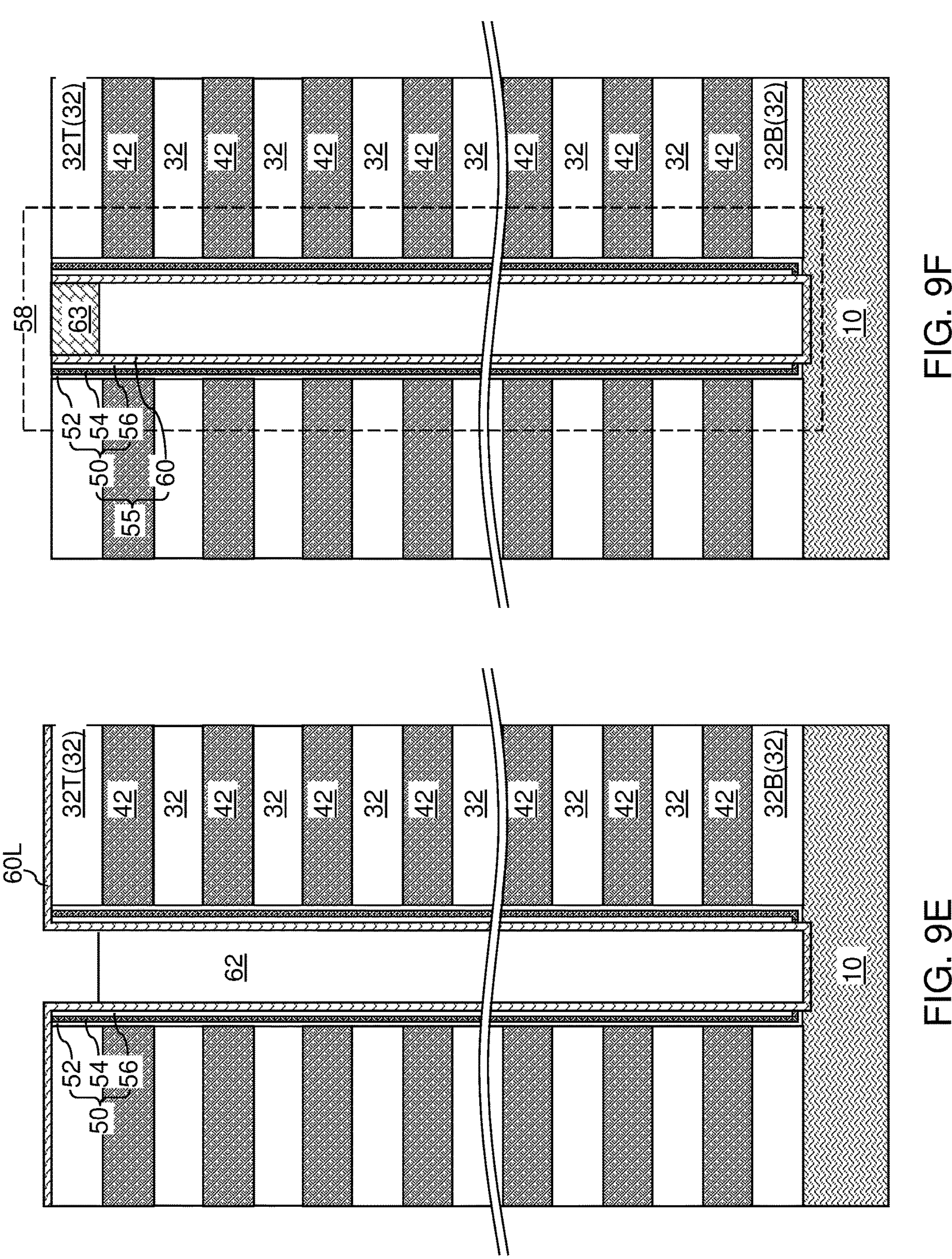

Referring to FIG. 9E, the dielectric core layer 62L can be vertically recessed such that each remaining portion of the dielectric core layer 62L has a top surface at, or about, the horizontal plane including the bottom surface of the topmost insulating layers 32T. Each remaining portion of the dielectric core layer 62L constitutes a dielectric core 62.

Referring to FIG. 9F, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination of a memory stack structure 55, a dielectric core 62, and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42, or generally speaking, at levels of spacer material layers that may be formed as, or may be subsequently replaced at least partly with, electrically conductive layers.

Figure 10:
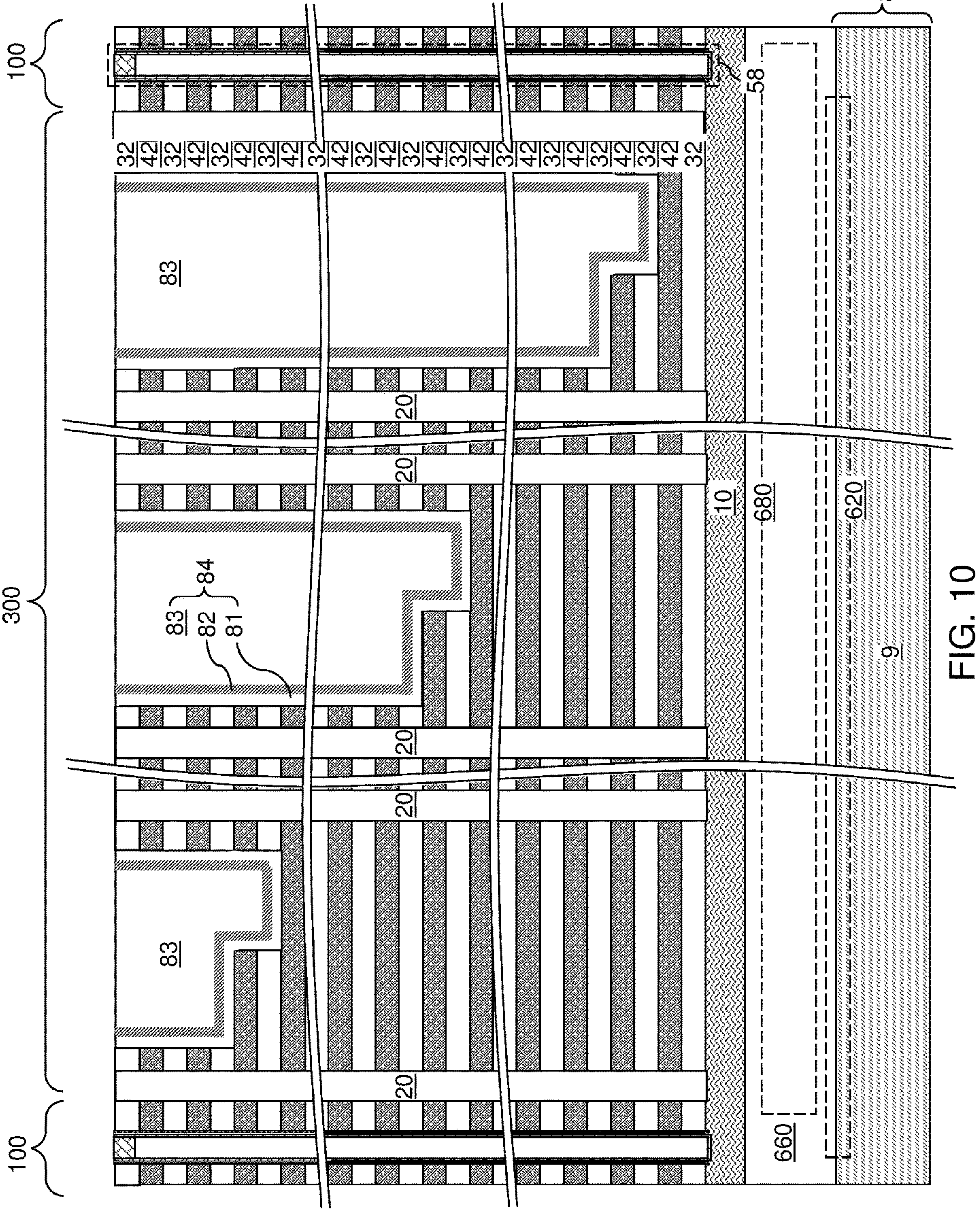
FIG. 10 is a schematic vertical cross-sectional view of the exemplary structure after formation of memory opening fill structures according to an embodiment of the present disclosure.

Referring to FIG. 10, the exemplary structure is illustrated after formation of memory opening fill structures 58 within the memory openings 49. Each of the memory opening fill structures 58 may comprise a memory film 50 and a vertical semiconductor channel 60.

Figure 11A:
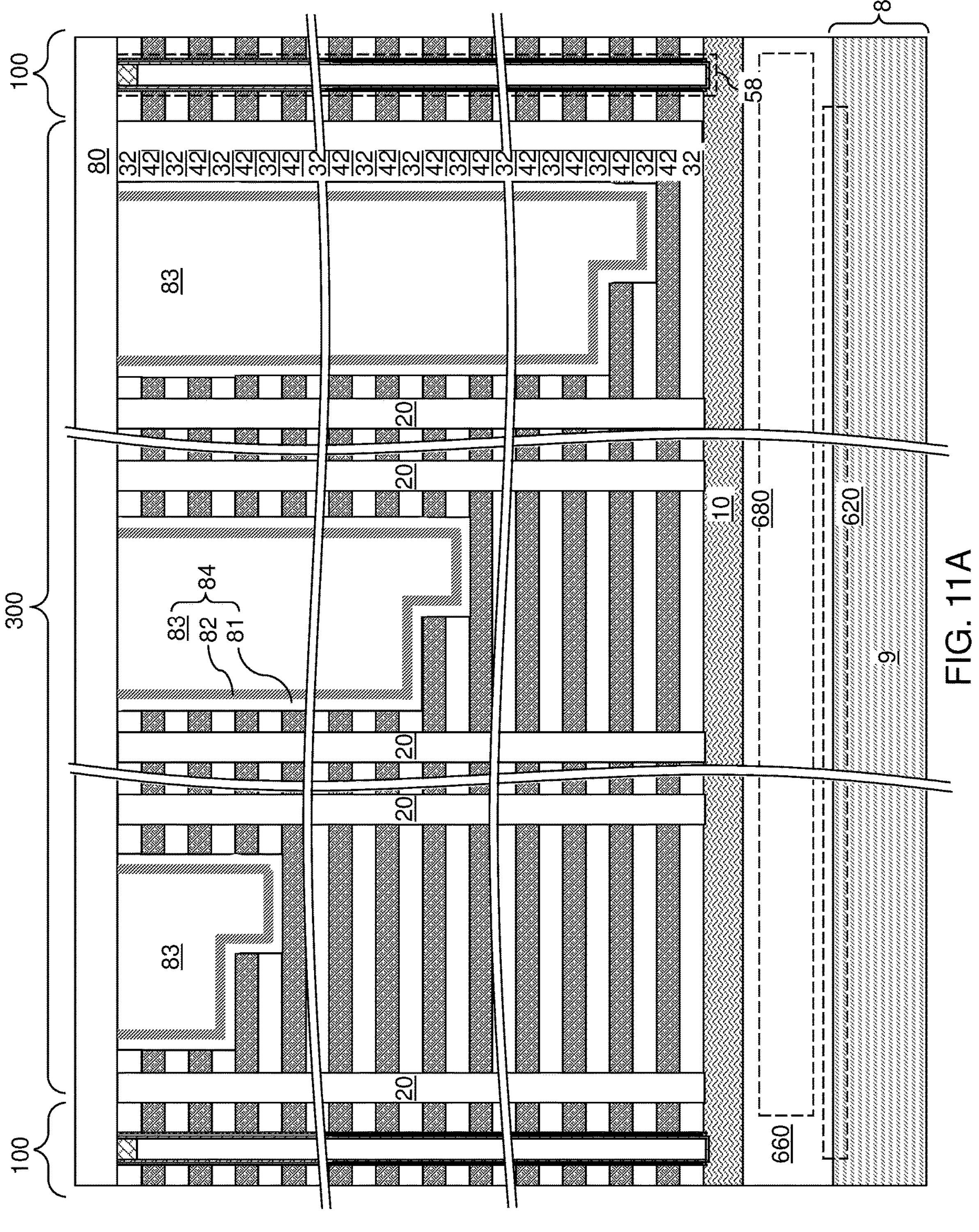
FIG. 11A is a schematic vertical cross-sectional view of the exemplary structure after formation of a contact-level dielectric layer and isolation trenches according to an embodiment of the present disclosure.
Figure 11B:
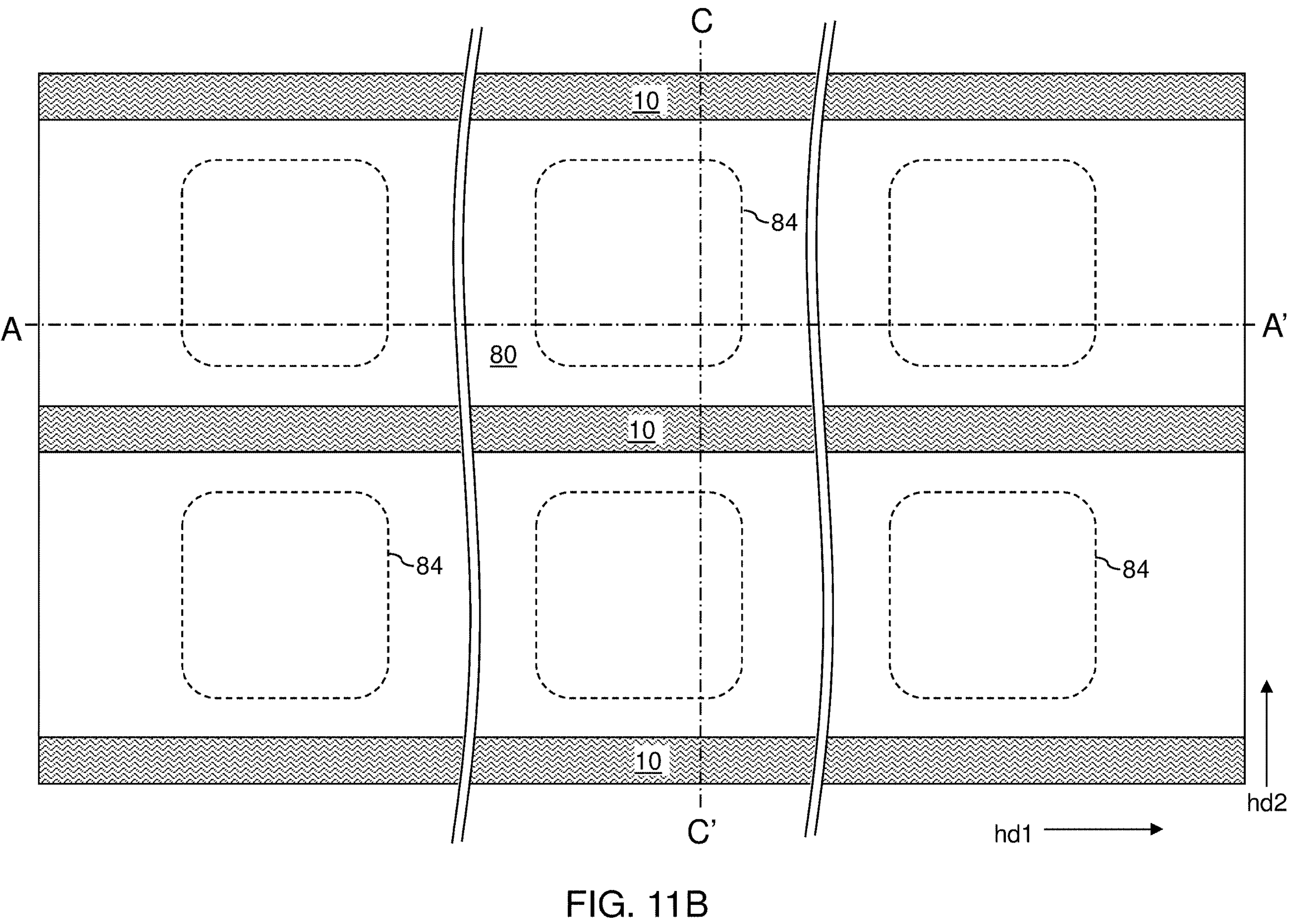
FIG. 11B is a top-down view of the exemplary structure of FIG. 11A. The vertical plane A-A' is the cut plane of the vertical cross-sectional view of FIG. 11A.
Figure 11C:
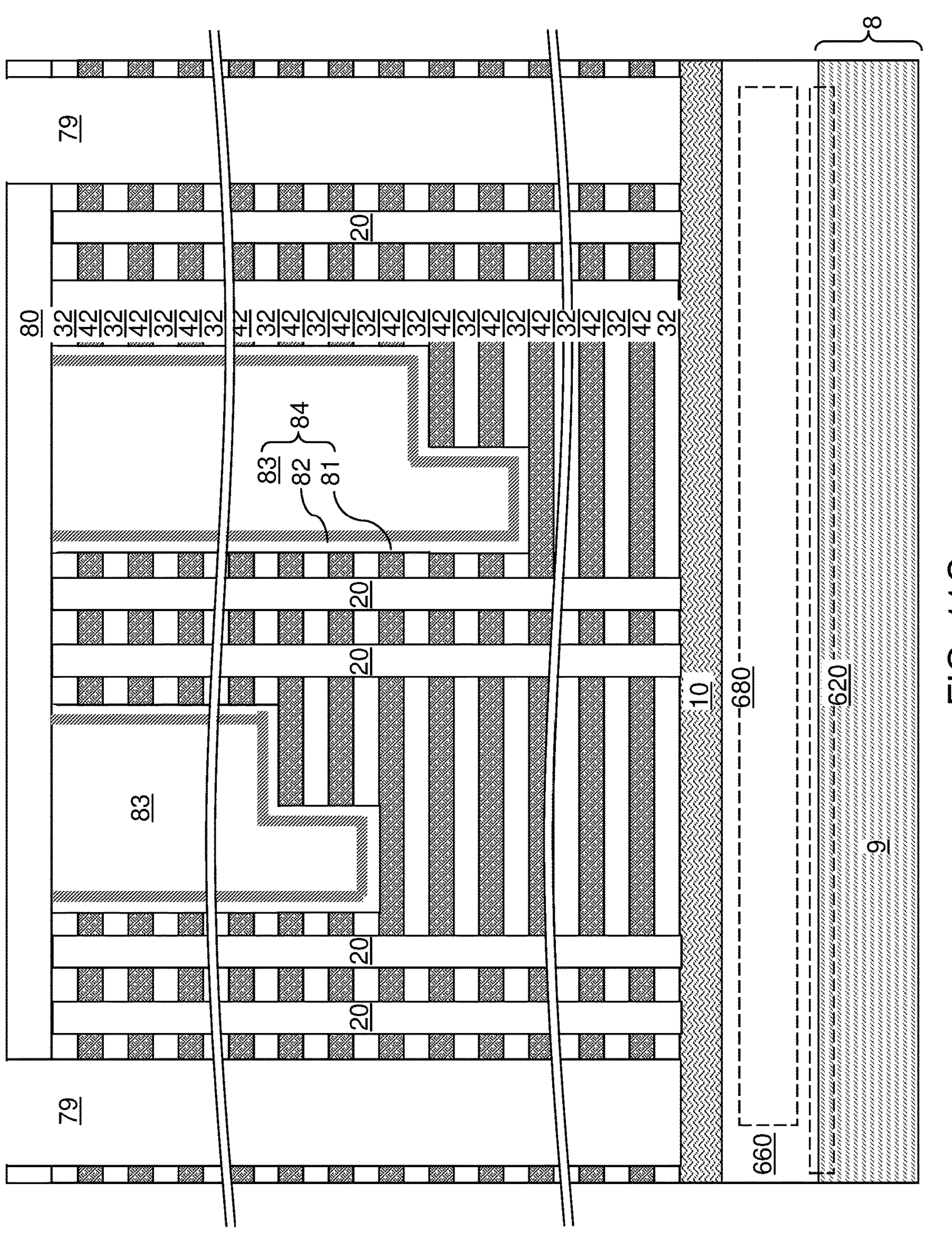
FIG. 11C is a vertical cross-sectional view of the exemplary structure along the vertical plane C-C' of FIG. 11B.

Referring to FIGS. 11A-11C, a contact-level dielectric layer 80 can be formed over the alternating stack (32, 42). The contact-level dielectric layer 80 includes a dielectric material that is different from the dielectric material of the sacrificial material layers 42. For example, the contact-level dielectric layer 80 can include silicon oxide. The contact-level dielectric layer 80 can have a thickness in a range from 50 nm to 500 nm, although lesser and greater thicknesses can also be employed.

A photoresist layer (not shown) can be applied over the contact-level dielectric layer 80, and is lithographically patterned to form elongated openings that laterally extend along the first horizontal direction hd1. The elongated openings can be formed in areas between neighboring rows of dielectric fill structures 84 and between neighboring clusters of memory opening fill structures 58. The pattern in the photoresist layer can be transferred through the contact-level dielectric layer 80 and the alternating stack (32, 42) employing an anisotropic etch to form lateral isolation trenches 79, which vertically extend from the top surface of the contact-level dielectric layer 80 at least to the top surface of the semiconductor material layer 10, and laterally extend through the contact region 300 and neighboring memory array regions 100.

In one embodiment, the lateral isolation trenches 79 can laterally extend along the first horizontal direction hd1 (which may be a word line direction), and can be laterally spaced apart from each other along the second horizontal direction hd2 (which can be a bit line direction) that is perpendicular to the first horizontal direction hd1. The memory opening fill structures 58 can be arranged in rows that extend along the first horizontal direction hd1 between the lateral isolation trenches 79. The elongated area between two nearest neighbor (i.e., neighboring) lateral isolation trenches 79 may comprise a memory block. Multiple rows of memory opening fill structures 58 can be located between a neighboring pair of lateral isolation trenches 79. In one embodiment, the lateral isolation trenches 79 can include a source contact opening in which a source contact via structure can be subsequently formed. The photoresist layer can be removed, for example, by ashing. The alternating stack (32, 42) as formed at the processing steps of FIG. 1B is divided into multiple alternating stacks (32, 42) (e.g., memory blocks) that are laterally spaced apart along the second horizontal direction hd2 by the lateral isolation trenches 79. Optionally, dopants of the second conductivity type can be implanted into physically exposed surface portions of the semiconductor material layer 10 by an ion implantation process to form source regions (not illustrated).

Figure 12A:
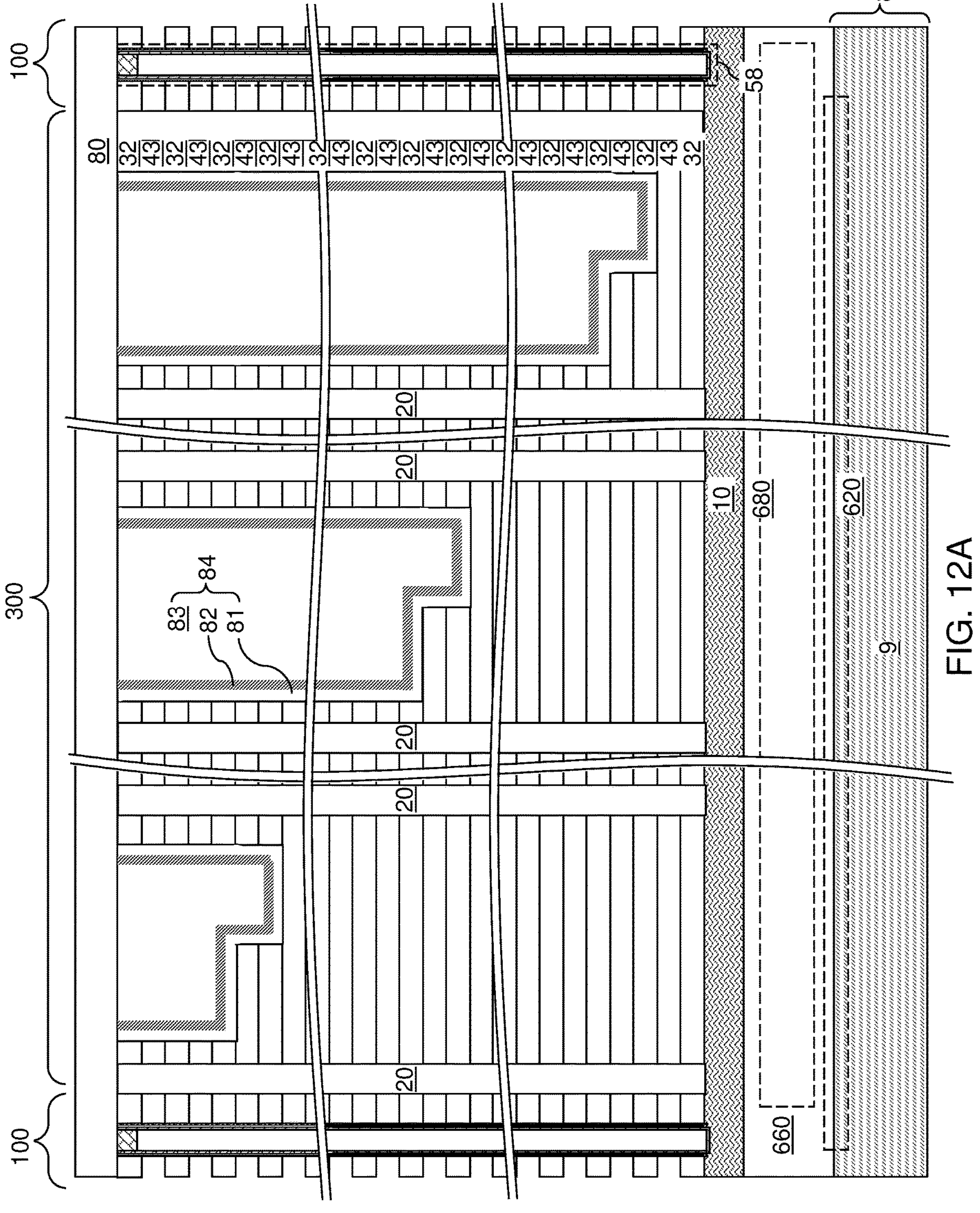
FIG. 12A is a schematic vertical cross-sectional view of the exemplary structure after formation of lateral recesses according to an embodiment of the present disclosure.
Figure 12B:
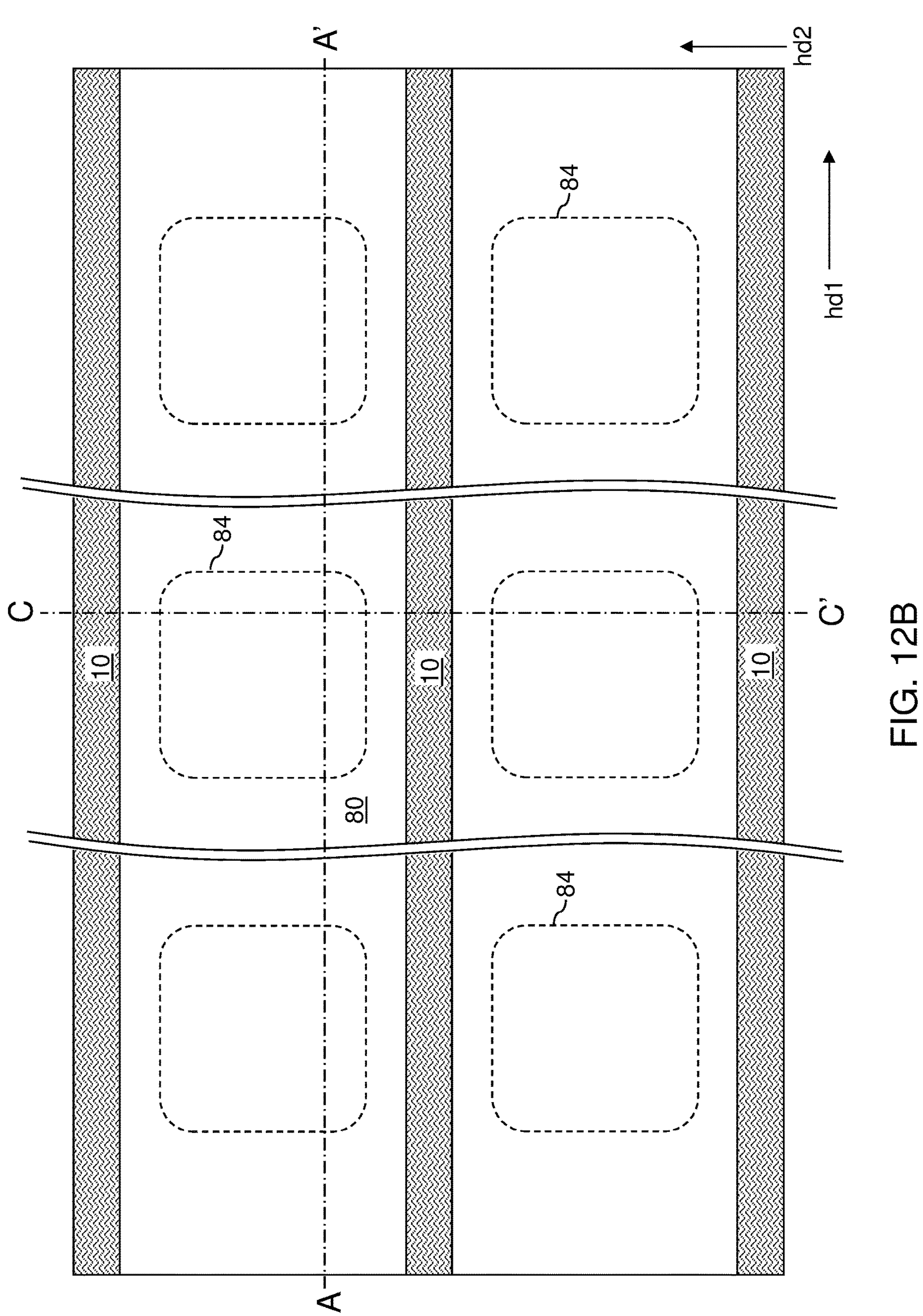
FIG. 12B is a top-down view of the exemplary structure of FIG. 12A. The vertical plane A-A' is the cut plane of the vertical cross-sectional view of FIG. 12A.
Figure 12C:
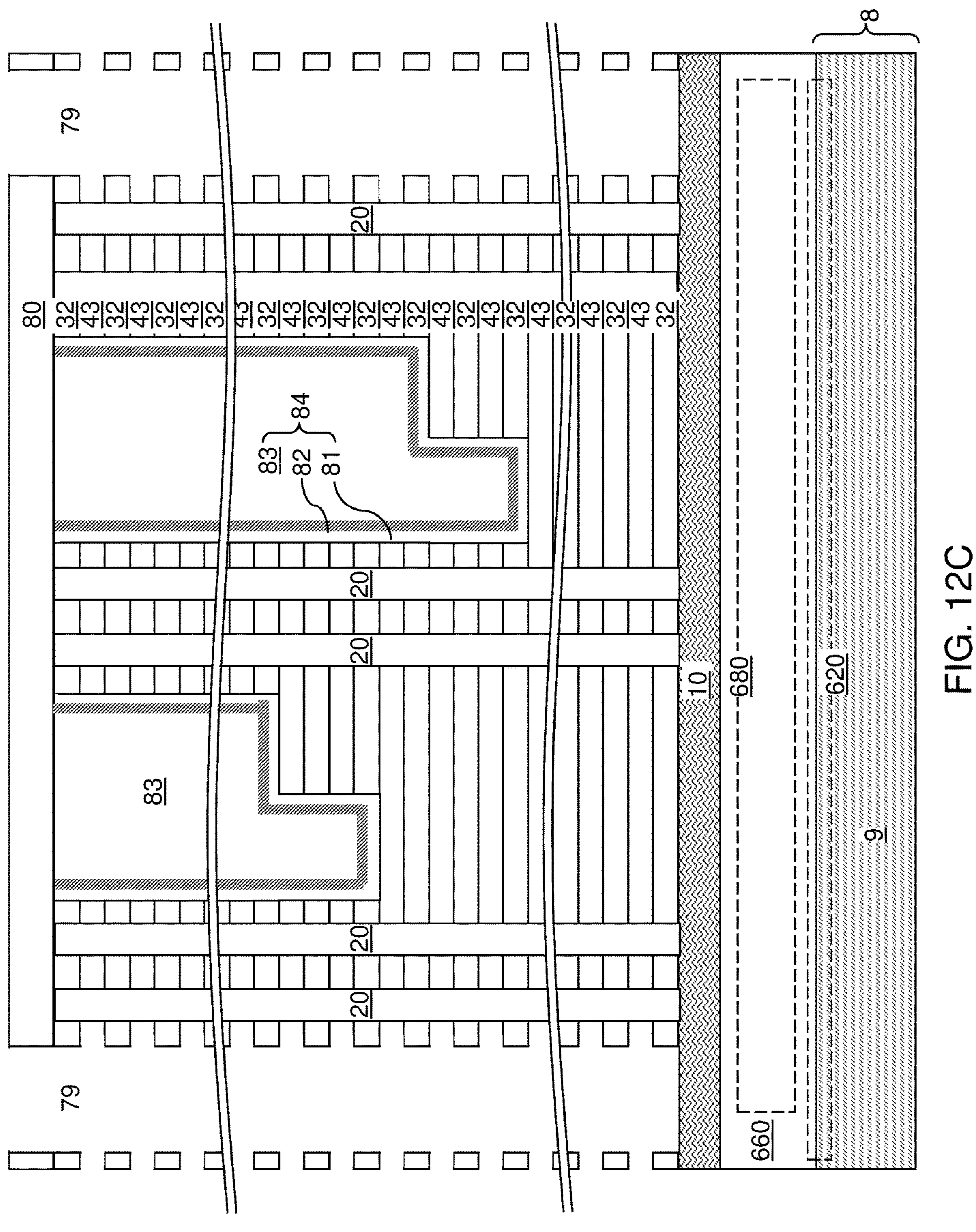
FIG. 12C is a vertical cross-sectional view of the exemplary structure along the vertical plane C-C' of FIG. 12B.

Referring to FIGS. 12A-12C, an etchant that selectively etches the sacrificial material layers 42 with respect to the insulating layers 32, the support pillar structures 20, and the first dielectric liners 81 can be introduced into the lateral isolation trenches 79. Lateral recesses 43 are formed in volumes from which the sacrificial material layers 42 are removed. The removal of the sacrificial material layers 42 can be selective to the dielectric materials of the insulating layers 32, the support pillar structures 20, and the first dielectric liners 81, the semiconductor material of the semiconductor material layer 10, and the material of the outermost layer of the memory films 50 (such as the blocking dielectric layers 52).

The etch process that etches the sacrificial material layers 42 selective to the insulating layers 32, the support pillar structures 20, the first dielectric liners 81, the semiconductor material layer 10, and the outermost layer of the memory films 50 can be a wet etch process employing a wet etch solution, or can be a gas phase (dry) etch process in which the etchant is introduced in a vapor phase into the lateral isolation trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the memory opening fill structures 58, and the dielectric fill structures 84 provide structural support while the lateral recesses 43 are present within volumes previously occupied by the sacrificial material layers 42.

Each lateral recess 43 can be a laterally extending cavity having a lateral dimension that is greater than the vertical extent of the cavity. In other words, the lateral dimension of each lateral recess 43 can be greater than the height of the lateral recess 43. A plurality of lateral recesses 43 can be formed in the volumes from which the sacrificial material layers 42 are removed. Each of the plurality of lateral recesses 43 can extend substantially parallel to the top surface of the semiconductor material layer 10. A lateral recess 43 can be vertically bounded by a top surface of an underlying insulating layer 32 and a bottom surface of an overlying insulating layer 32. In one embodiment, each lateral recess 43 can have a uniform height throughout.

Referring to FIGS. 13A-13D, a backside blocking dielectric layer 44 can be optionally formed in the lateral recesses 43 by a conformal deposition process. The backside blocking dielectric layer 44 may comprise a dielectric material, such as a dielectric metal oxide material (e.g., aluminum oxide). The thickness of the backside blocking dielectric layer 44 may be in a range from 3 nm to 10 nm, although lesser and greater thicknesses may also be employed.

At least one conductive material can be conformally deposited in the lateral recesses 43. The at least one conductive material may comprise, for example, a combination of a metallic barrier material and a metallic fill material. The metallic barrier material may comprise, for example, TiN, TaN, WN, MoN, TiC, TaC, WC, or a combination thereof. The metallic fill material may comprise, for example, Ti, Ta, Mo, Co, Ru, W, Cu, other transition metals, and/or alloys or layer stacks thereof. Excess portions of the at least one conductive material that are deposited in the lateral isolation trenches 79 or above the contact-level dielectric layer 80 can be removed by performing an etch-back process, which may comprise an isotropic etch process and/or an anisotropic etch process. Each remaining portion of the at least one conductive material filling a respective one of the lateral recesses 43 constitutes an electrically conductive layer 46. In one embodiment, each electrically conductive layer 46 may comprise a metallic barrier liner 46A including a portion of the metallic barrier material, and a metallic fill material portion 46B including a portion of the metallic fill material.

An alternating stack of insulating layers 32 and electrically conductive layers 46 can be formed between each neighboring pair of lateral isolation trenches 79. A plurality of alternating stacks of insulating layers 32 and electrically conductive layers 46 of respective memory blocks can be laterally spaced apart from each other by the lateral isolation trenches 79. In one embodiment, each of the insulating layers 32 and the electrically conductive layers 46 within an alternating stack (32, 42) in a memory block may comprise lengthwise sidewalls that laterally extend along the first horizontal direction hd1.

Figure 13A:
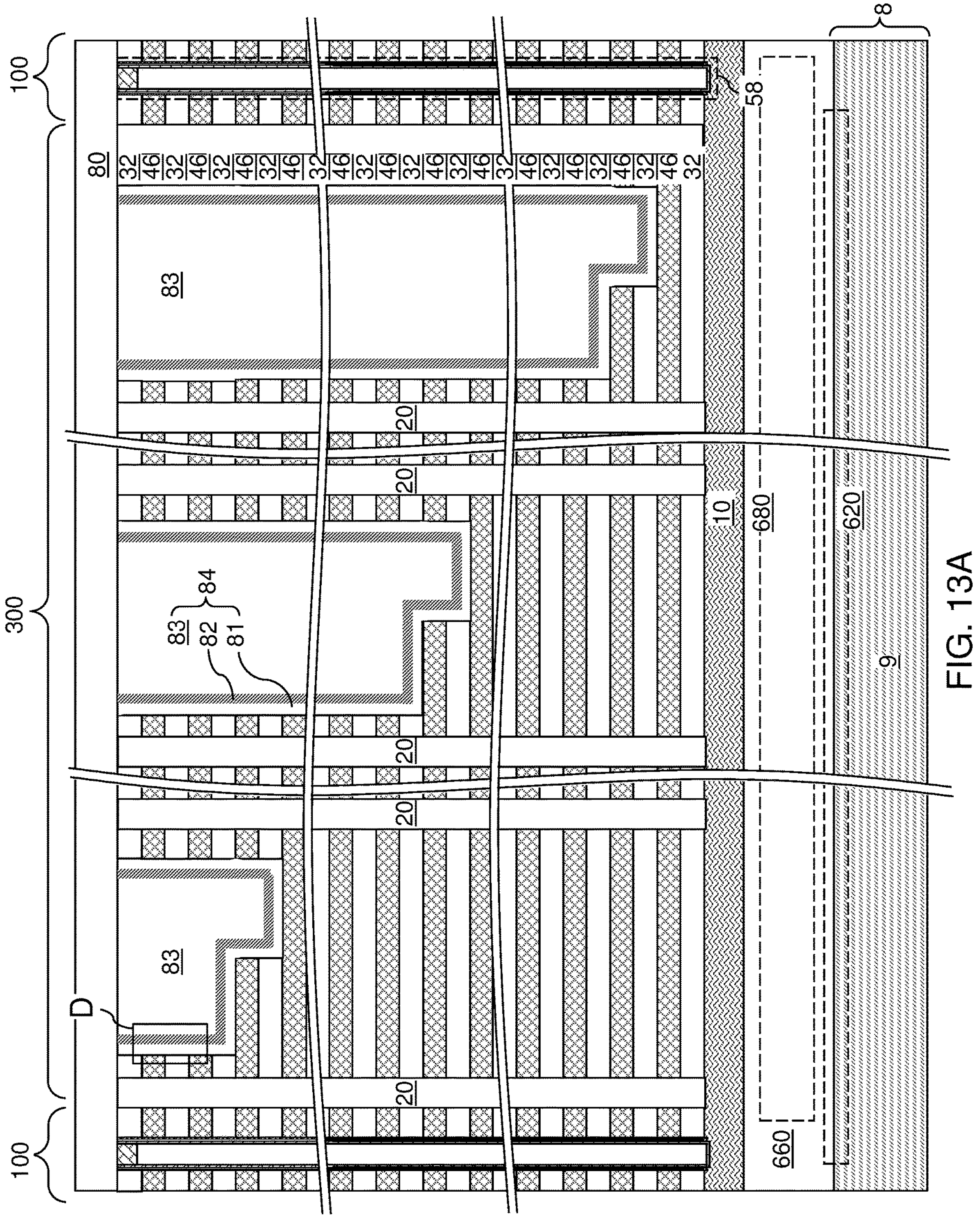
FIG. 13A is a schematic vertical cross-sectional view of the exemplary structure after formation of electrically conductive layers according to an embodiment of the present disclosure.
Figure 13B:
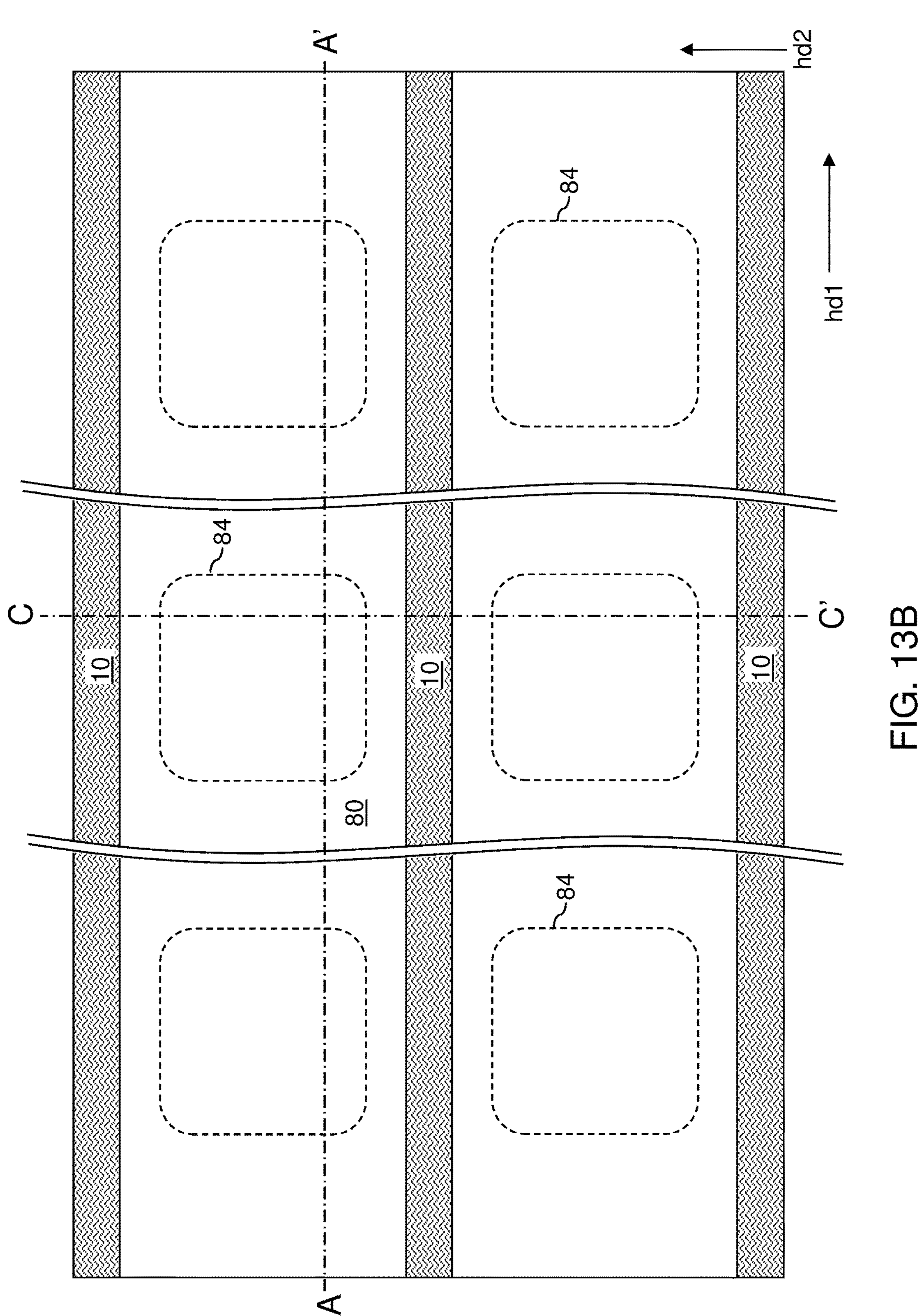
FIG. 13B is a top-down view of the exemplary structure of FIG. 13A. The vertical plane A-A' is the cut plane of the vertical cross-sectional view of FIG. 13A.
Figure 13C:
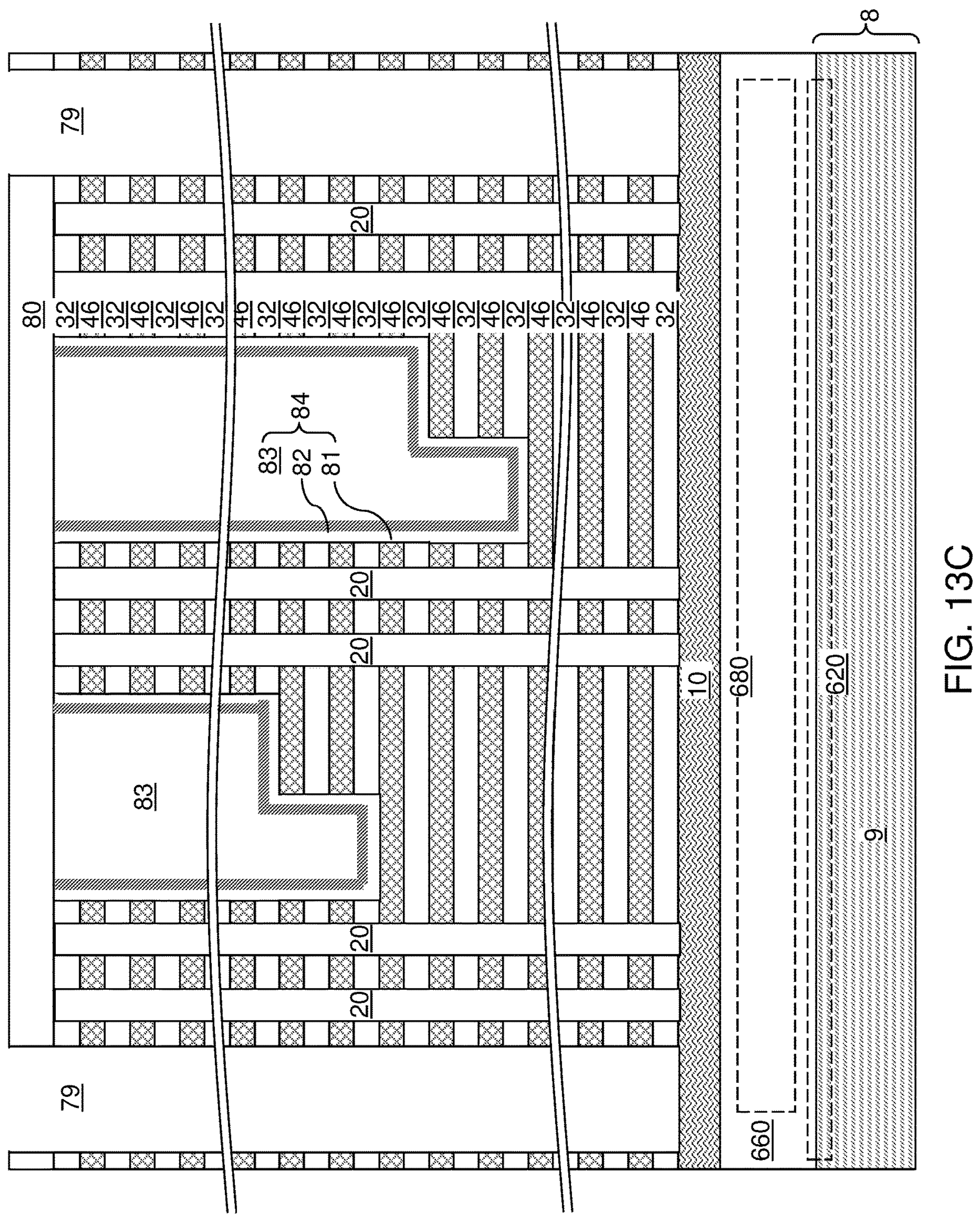
FIG. 13C is a vertical cross-sectional view of the exemplary structure along the vertical plane C-C' of FIG. 13B.
Figure 13D:
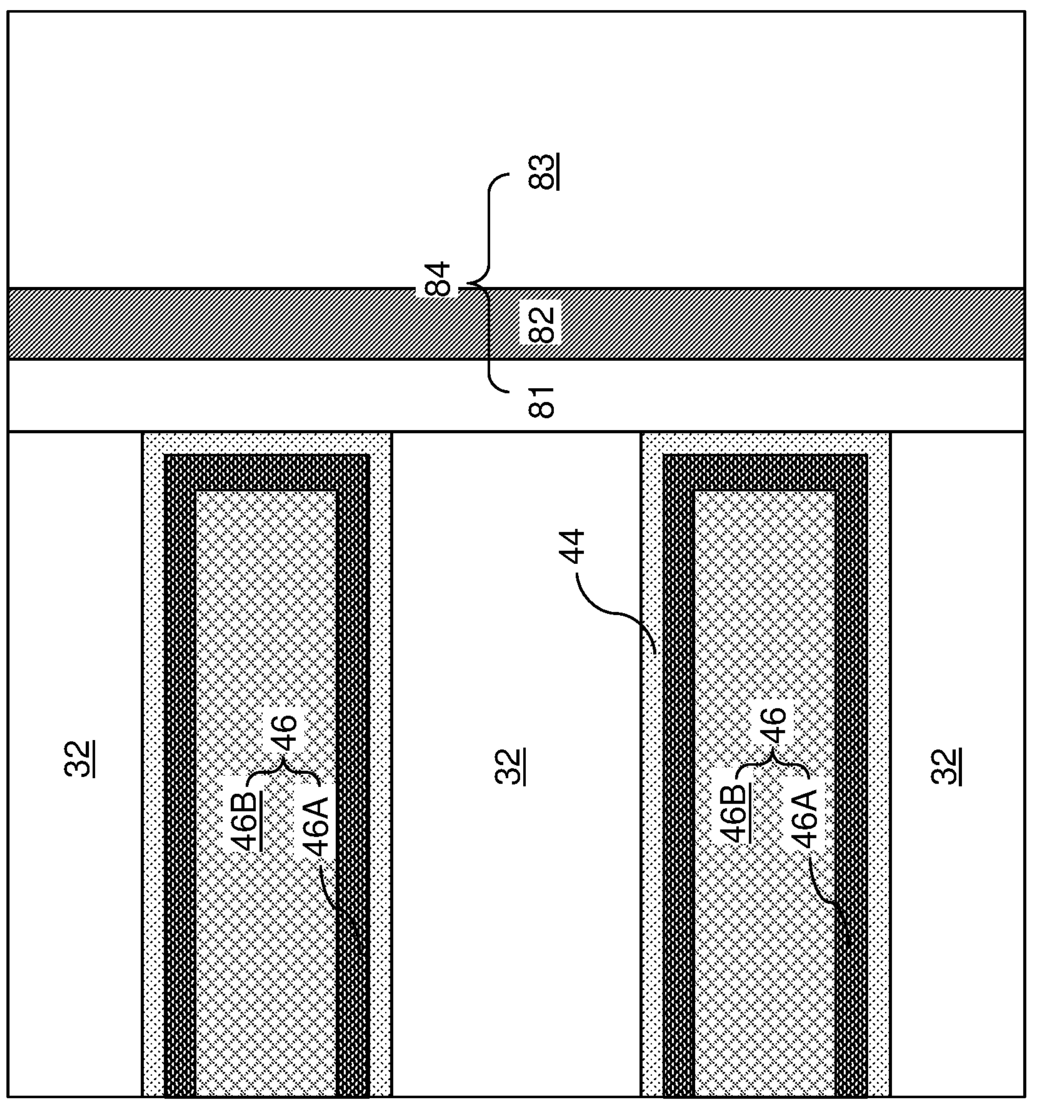
FIG. 13D is a magnified vertical cross-sectional view of a region of a first configuration of the exemplary structure of FIGS. 13A-13C.

Each dielectric fill structure 84 is in direct contact with each insulating layer 32 within a respective alternating stack (32, 46) that overlies a horizontal plane including a bottommost surface of the dielectric fill structure 84. In one embodiment, each electrically conductive layer 46 within an alternating stack (32, 46) that overlies the horizontal plane including the bottommost surface of a dielectric fill structure 84 can be laterally spaced from the dielectric fill structure 84 by a vertically-extending portion of a respective backside blocking dielectric layer 44 as illustrated in FIG. 13D, which illustrates a first configuration of the exemplary structure.

Figure 13E:
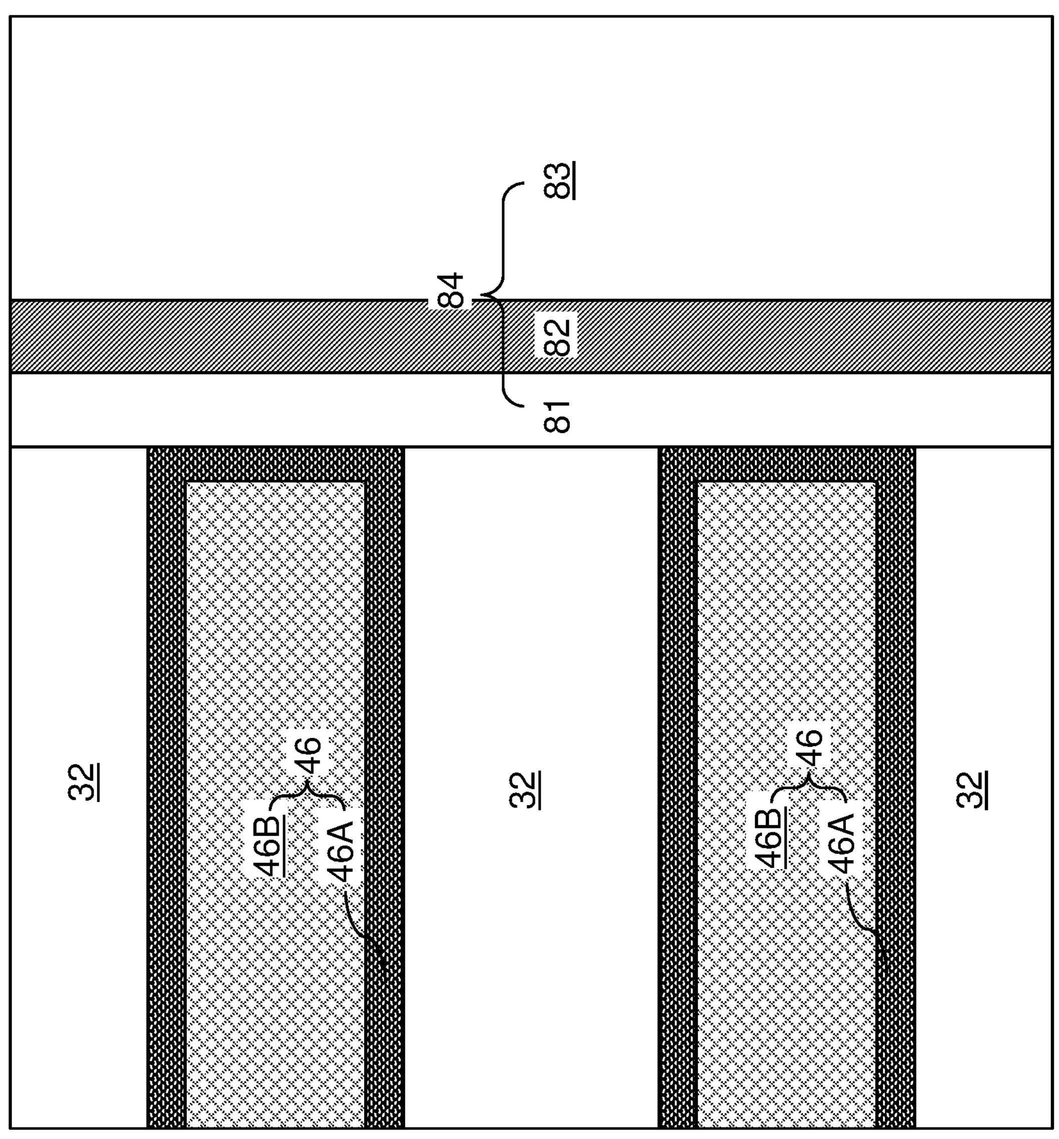
FIG. 13E is a magnified vertical cross-sectional view of a region of a second configuration of the exemplary structure of FIGS. 13A-13C.

Referring to FIG. 13E, a second configuration of the exemplary structure is illustrated, which is derived from the first exemplary structure by omitting formation of the backside blocking dielectric layer 44. In this case, a dielectric fill structure 84 can be in direct contact with each insulating layer 32 and each electrically conductive layer 46 within an alternating stack (32, 46) that overlie a horizontal plane including a bottommost surface of the dielectric fill structure 84.

Figure 14A:
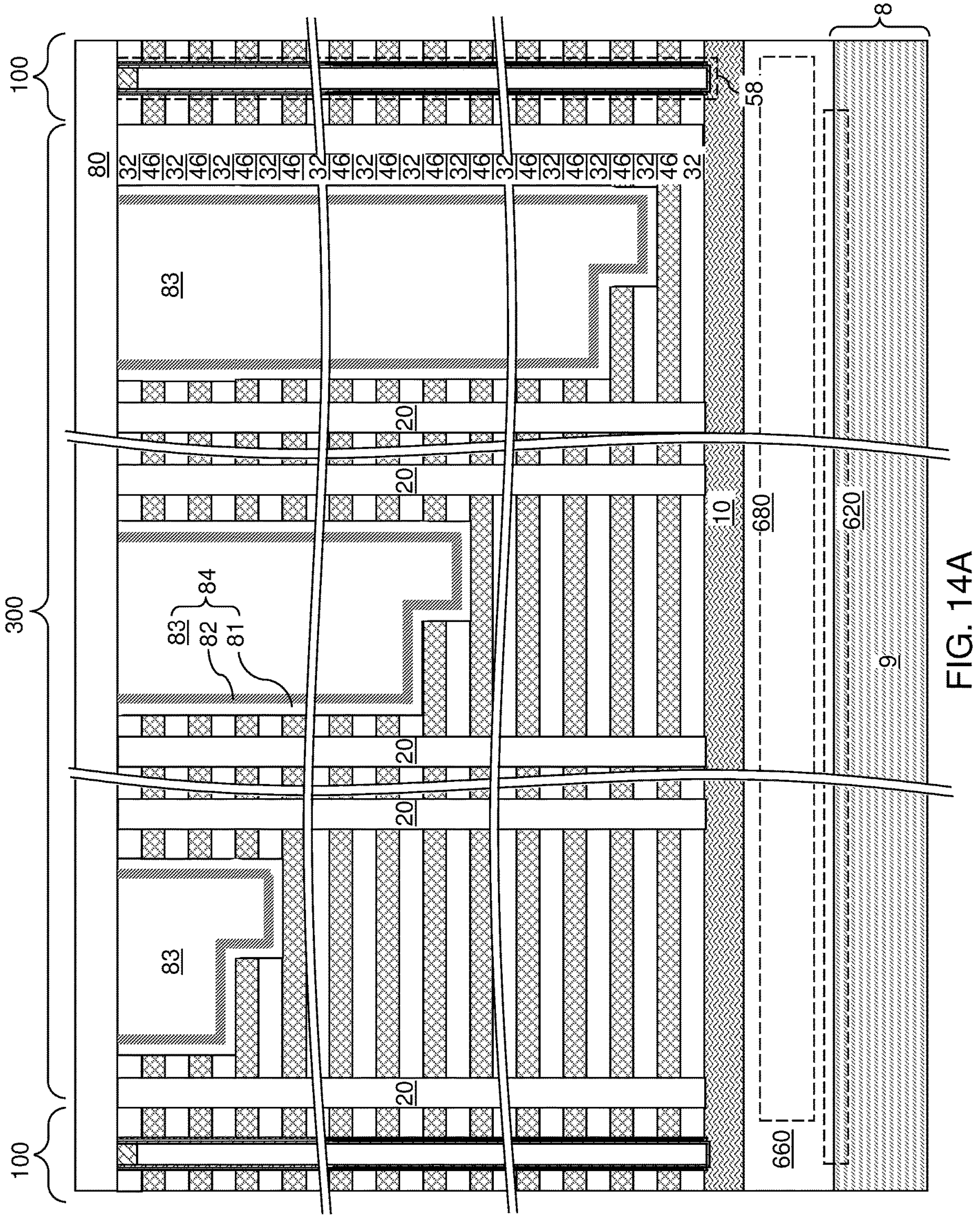
FIG. 14A is a schematic vertical cross-sectional view of the exemplary structure after formation of isolation trench fill structures according to an embodiment of the present disclosure.
Figure 14B:
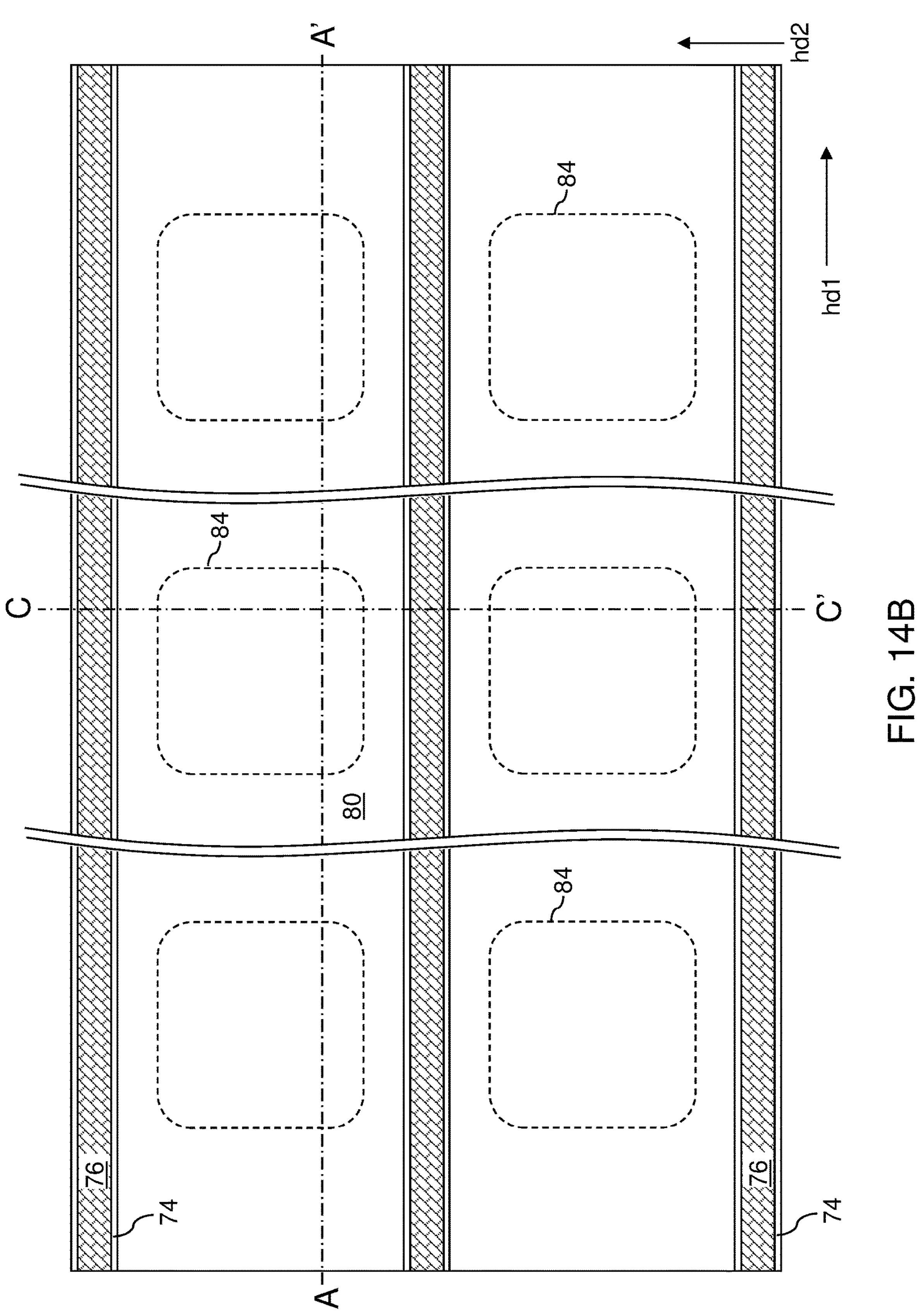
FIG. 14B is a top-down view of the exemplary structure of FIG. 14A. The vertical plane A-A' is the cut plane of the vertical cross-sectional view of FIG. 14A.
Figure 14C:
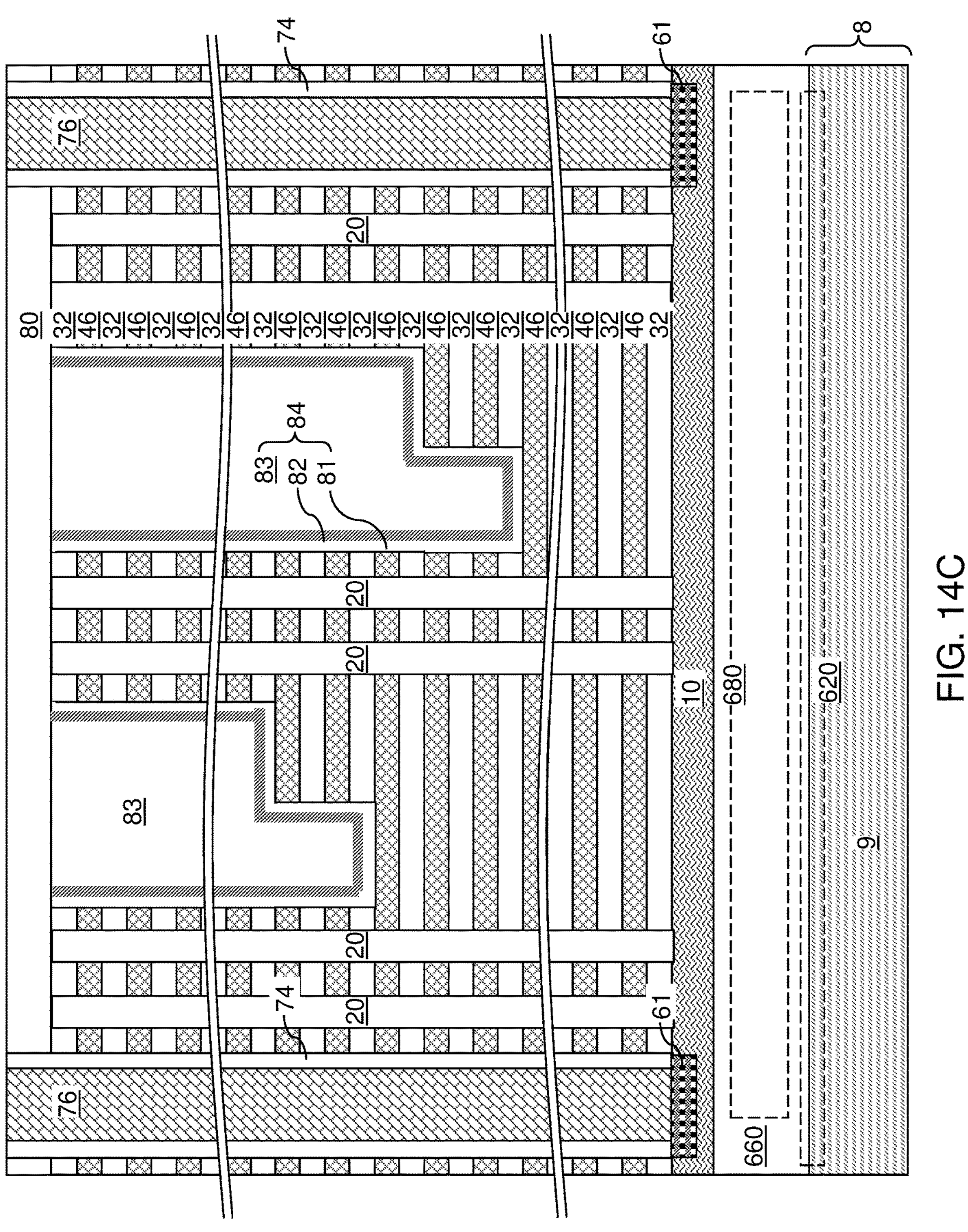
FIG. 14C is a vertical cross-sectional view of the exemplary structure along the vertical plane C-C' of FIG. 14B.

Referring to FIGS. 14A-14C, an insulating material may be conformally deposited and anisotropically etched to form an insulating spacer at the periphery of each of the lateral isolation trenches 79. At least one conductive fill material may be deposited in remaining volumes of the lateral isolation trenches 79 to form a conductive wall structure 76. Each contiguous combination of a conductive wall structure 76 and an insulating spacer 74 constitutes an isolation trench fill structure (74, 76) that fills a respective lateral isolation trench 79.

Figure 15A:
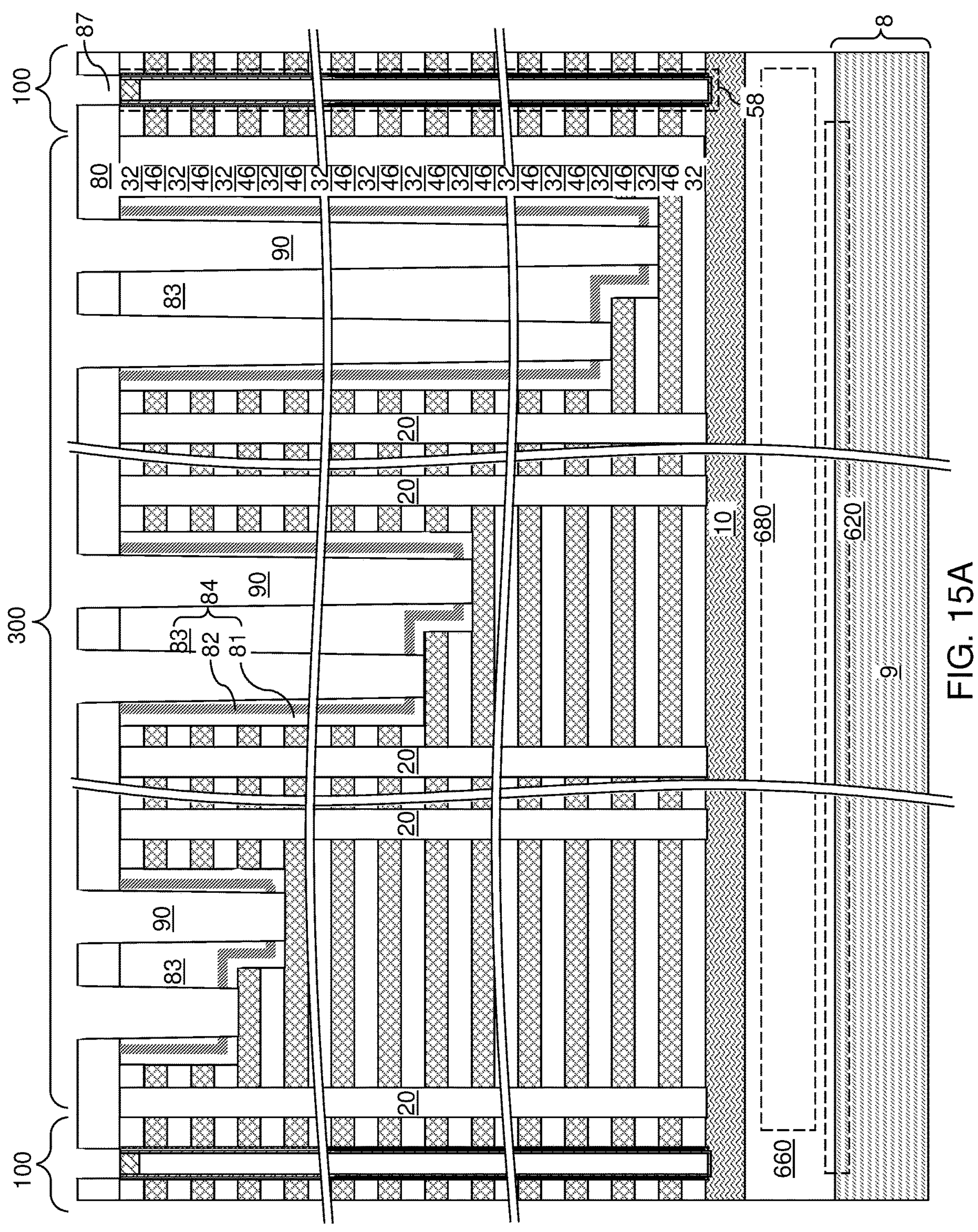
FIG. 15A is a schematic vertical cross-sectional view of the exemplary structure after formation of contact via cavities according to an embodiment of the present disclosure.
Figure 15B:
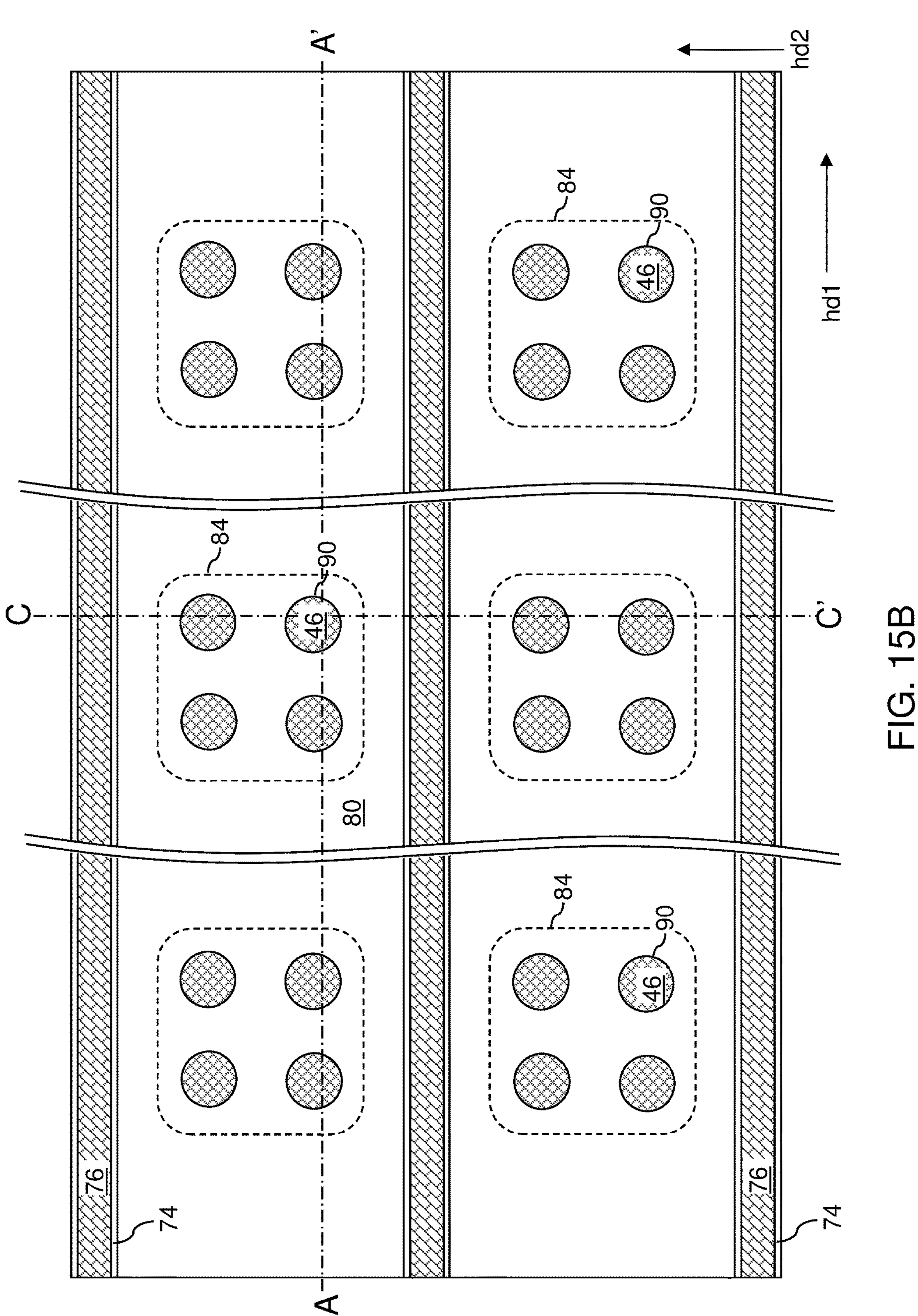
FIG. 15B is a top-down view of the exemplary structure of FIG. 15A. The vertical plane A-A' is the cut plane of the vertical cross-sectional view of FIG. 15A.
Figure 15C:
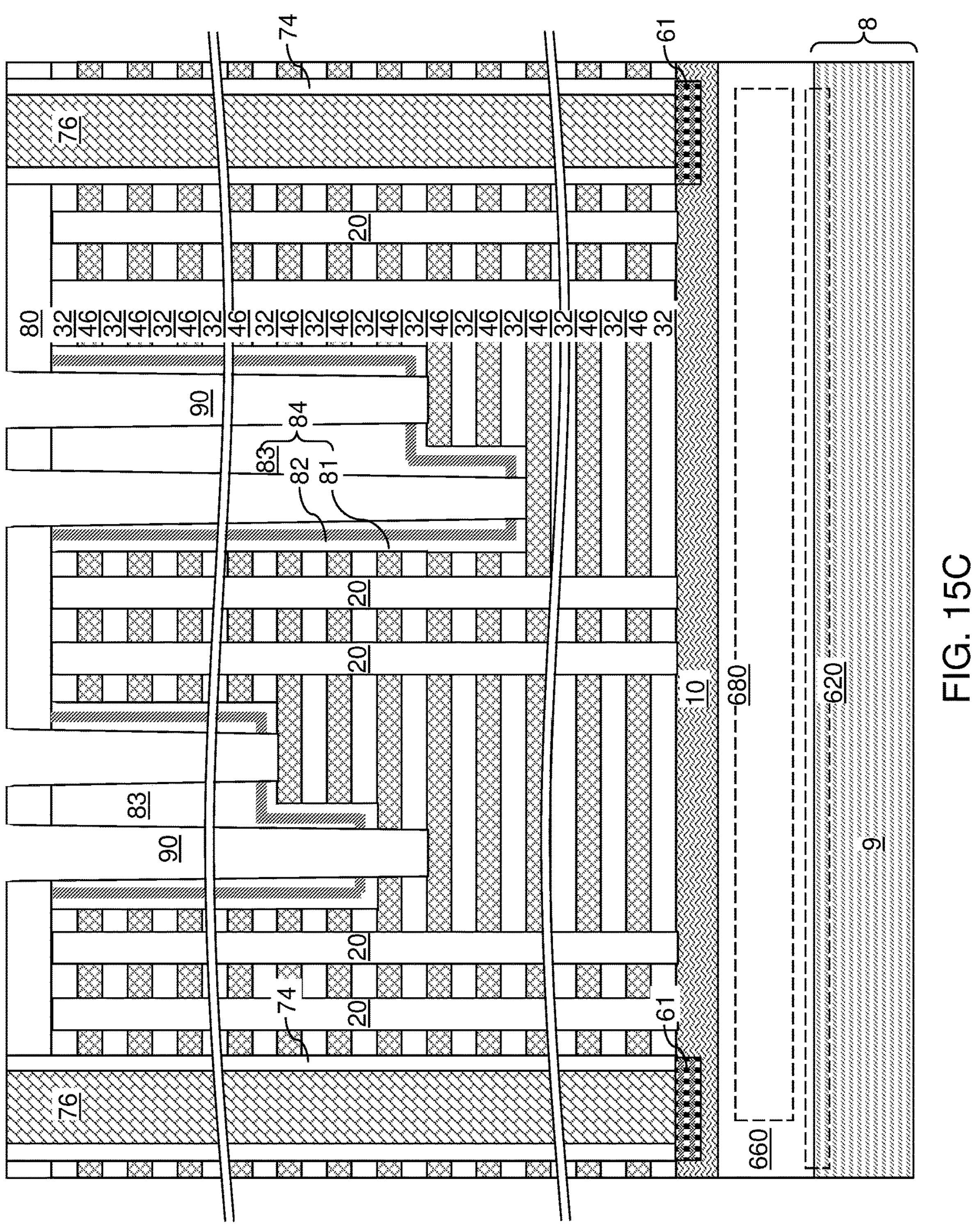
FIG. 15C is a vertical cross-sectional view of the exemplary structure along the vertical plane C-C' of FIG. 15B.
Figure 16A:
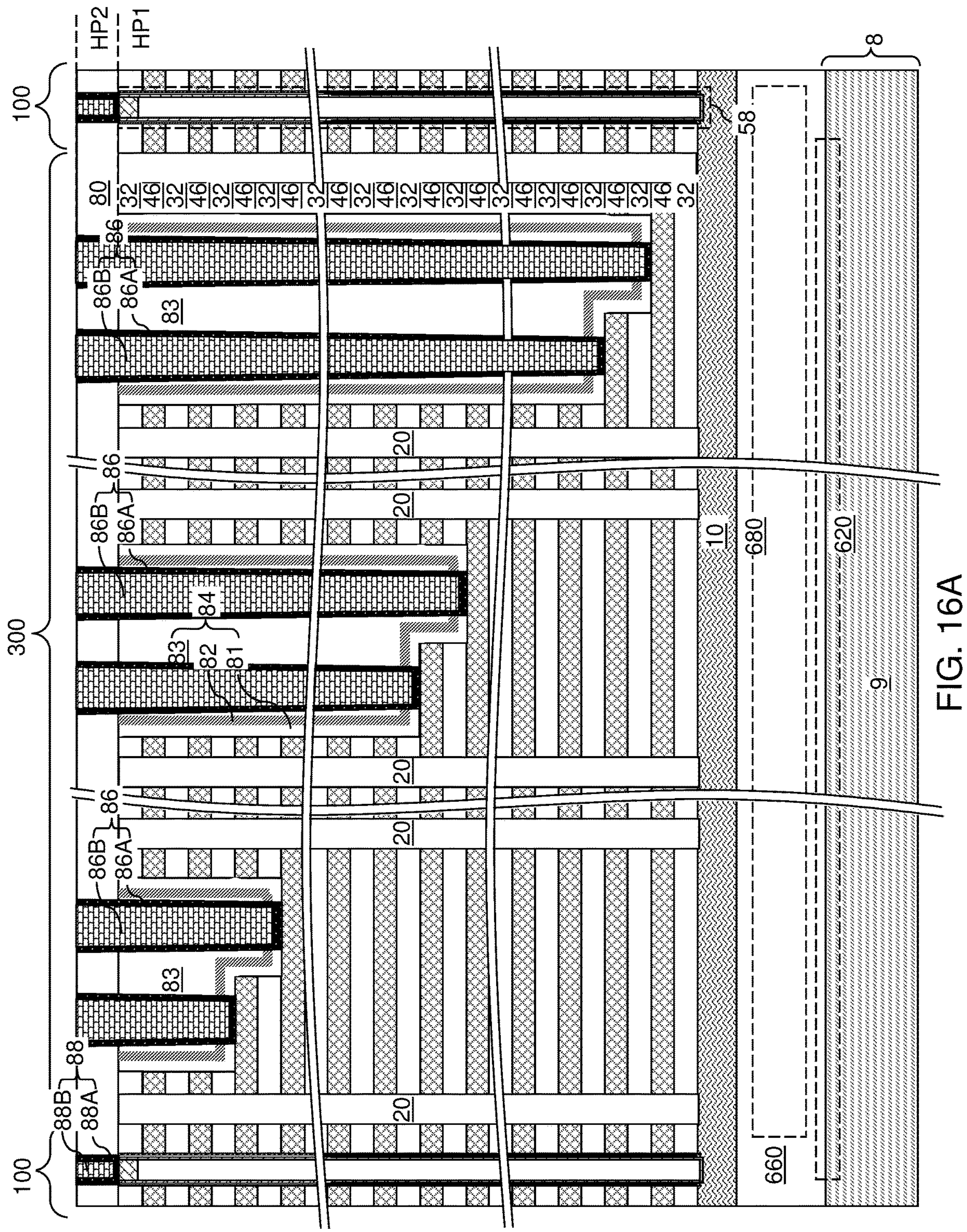
FIG. 16A is a schematic vertical cross-sectional view of the exemplary structure after formation of contact via structures according to an embodiment of the present disclosure.
Figure 16B:
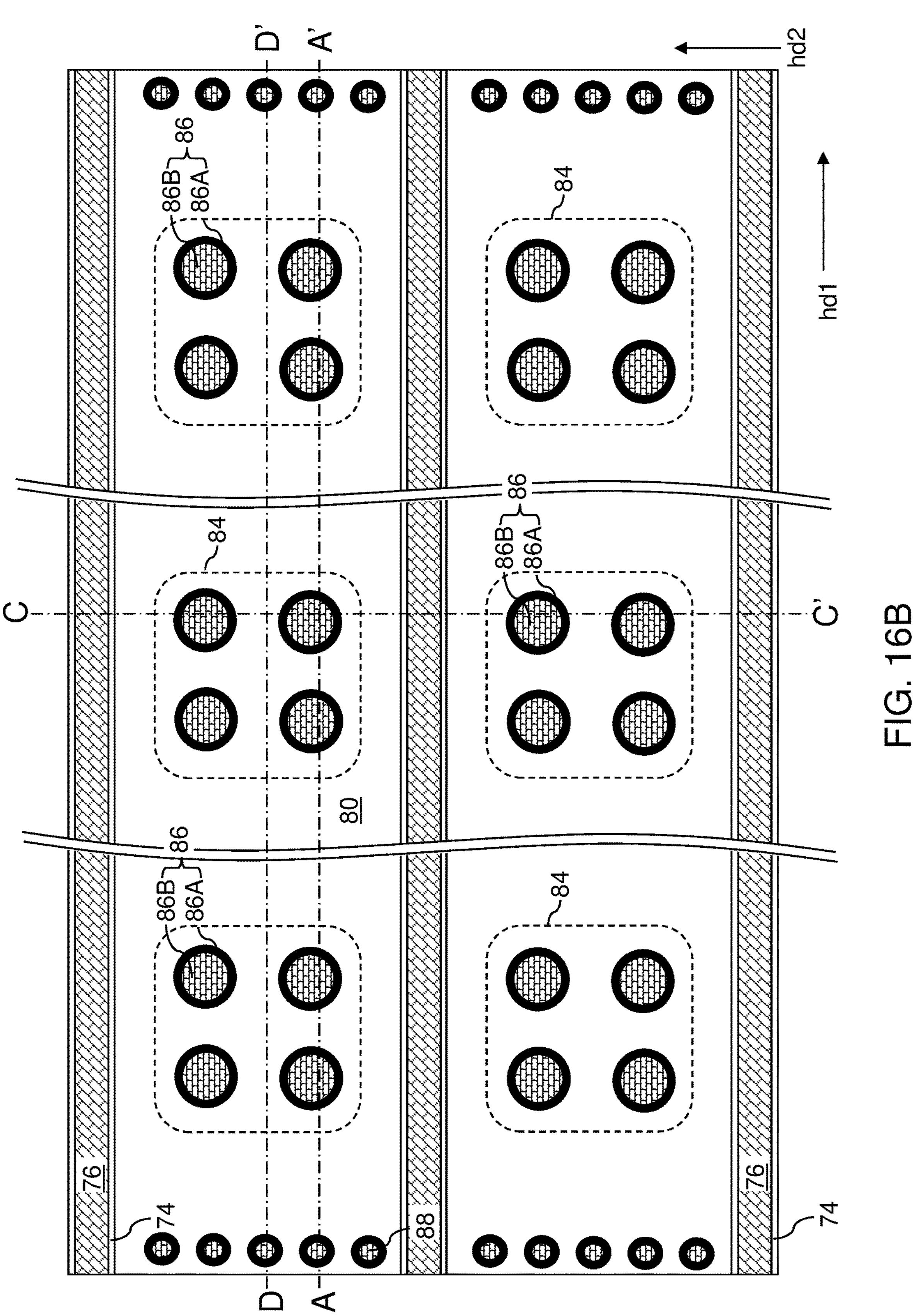
FIG. 16B is a top-down view of the exemplary structure of FIG. 16A. The vertical plane A-A' is the cut plane of the vertical cross-sectional view of FIG. 16A.
Figure 16C:
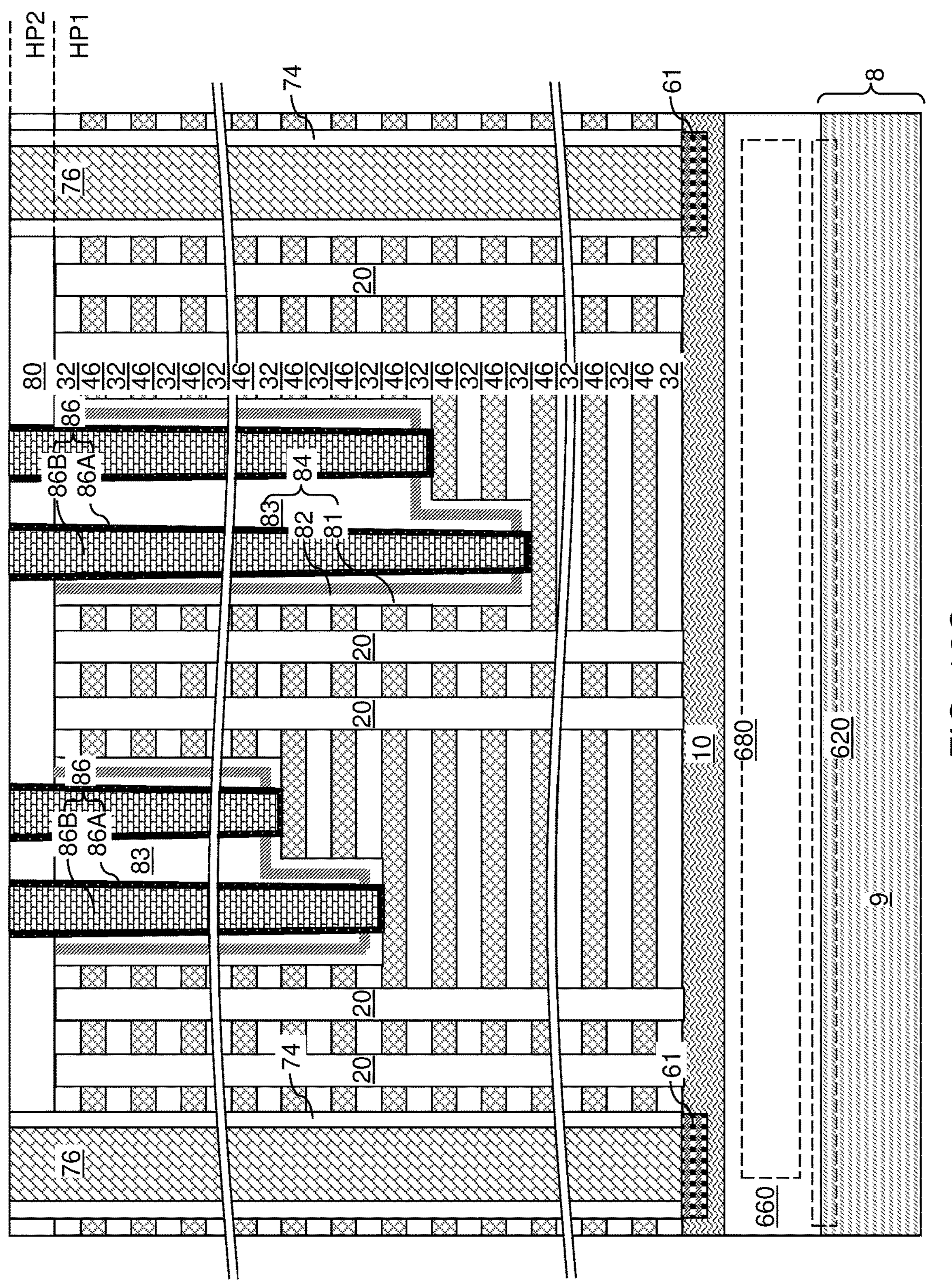
FIG. 16C is a vertical cross-sectional view of the exemplary structure along the vertical plane C-C' of FIG. 16B.
Figure 16D:
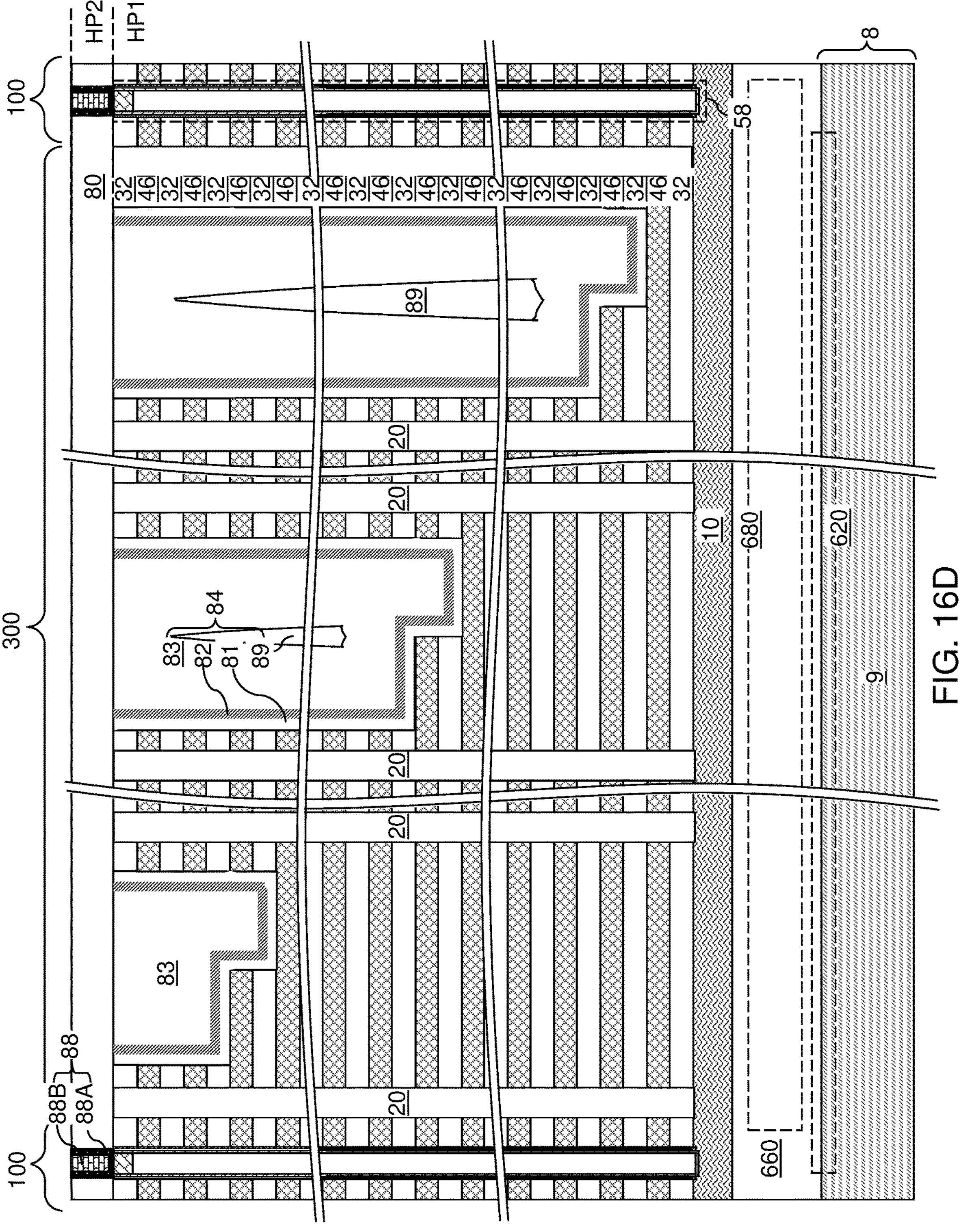
FIG. 16D is a vertical cross-sectional view of the exemplary structure along the vertical plane D-D' of FIG. 16B.

Referring to FIGS. 15A-15C, a first photoresist layer (not shown) can be applied over the contact-level dielectric layer 80, and can be lithographically patterned to form openings over the memory opening fill structures 58. An anisotropic etch process can be performed to form drain contact via cavities 87 underneath the openings in the first photoresist layer. A top surface of a drain region 63 can be physically exposed at the bottom of each drain contact via cavity 87. The first photoresist layer can be subsequently removed, for example, by ashing.

A second photoresist layer (not shown) can be applied over the contact-level dielectric layer 80, and can be lithographically patterned to form discrete openings therein. Specifically, an M×N array of discrete openings can be formed in the photoresist layer over each dielectric fill structure 84. Each of the discrete openings in the photoresist layer may be formed entirely within the area of a respective underlying horizontally-extending surface segment of a bottom surface of a dielectric fill structure 84. In one embodiment, at least one of the discrete openings in the photoresist layer may have a periphery that is located entirely within the periphery of a respective horizontally-extending portion of a second dielectric liner 82 within a respective underlying dielectric fill structure 84.

An anisotropic etch process can be performed to etch through portions of the contact-level dielectric layer 80, the dielectric fill material portions 83, the second dielectric liners 82, and the first dielectric liners 81 that are not masked by the patterned photoresist layer. The anisotropic etch process may comprise a first anisotropic etch step that etches the materials of the contact-level dielectric layer 80 and the dielectric fill material portions 83 selective to the material of the second dielectric liners 82, a second anisotropic etch step that etches the material of the second dielectric liners 82 selective to the material of the first dielectric liners 81, and a third anisotropic etch step that etches the material of the first dielectric liners 81 and the backside blocking dielectric layers 44 (if present) selective to the materials of the electrically conductive layers 46. Alternatively, a single anisotropic etch process or two anisotropic etch processes may be performed to etch the above layers. Contact via cavities 90 (which are also referred to as layer contact via cavities 90) are formed in volumes from which the materials of the contact-level dielectric layer 80, the dielectric fill material portions 83, the second dielectric liners 82, the first dielectric liners 81, and the optional backside blocking dielectric layers 44 are etched. A top surface of an electrically conductive layer 46 can be physically exposed at the bottom of each of the contact via cavities 90. Each electrically conductive layer 46 may have a respective top surface segment that is physically exposed to an overlying contact via cavity 90. The second photoresist layer can be subsequently removed, for example, by ashing.

In an alternative embodiment, the drain contact via cavities 87 and the layer contact via cavities 90 may be formed using the same patterned photoresist layer and the same one or more etching steps, rather than separate photoresist layers and separate etching steps.

Referring to FIGS. 16A-16D, at least one conductive material, such as at least one metallic material, can be deposited in the layer contact via cavities 90 and the drain contact via cavities 87. For example, a combination of a metallic barrier liner layer and a metallic fill material can be deposited in each of the layer contact via cavities 90 and the drain contact via cavities 87. The metallic barrier liner layer may comprise a metallic barrier material such as TiN, TaN, WN, MoN, TiC, TaC, WC, or a combination thereof. The thickness of the metallic barrier liner layer may be in a range from 5 nm to 30 nm, although lesser and greater thicknesses may also be employed. The metallic fill material may comprise W, Co, Ru, Mo, Ti, Ta, and/or Cu.

Excess portions of the at least one conductive material can be removed from above the horizontal plane including the top surface of the contact-level dielectric layer 80 by performing a planarization process. The planarization process may comprise a recess etch process and/or a chemical mechanical polishing (CMP) process. The horizontal plane including the top surface of the contact-level dielectric layer 80 is herein referred to as a second horizontal plane HP2. Each remaining portion of the at least one conductive material filling a respective layer contact via cavity 90 constitutes a layer contact via structure 86, which is also referred to as a contact via structure 86. Each remaining portion of the at least one conductive material filling a respective drain contact via cavity 87 constitutes a drain contact via structure 88. Each layer contact via structure 86 may comprise a metallic barrier liner 86A and a metallic fill material portion 86B. Each drain contact via structure 88 may comprise a metallic barrier liner 88A and a metallic fill material portion 88B. The layer contact via structures 86 and the drain contact via structures 88 may have top surfaces located within the second horizontal plane HP2.

Generally, an array of contact via structures 86 (e.g., word line contact via structures) can be formed through each dielectric fill structure 84 and directly on a top surface of a respective electrically conductive layer 46 within a respective subset of the electrically conductive layers 46. The respective subset of the electrically conductive layers 46 may comprise a plurality of electrically conductive layers 46 that are vertically spaced apart. For example, each array of contact via structures 86 may comprises N rows of contact via structures 86 arranged along a first horizontal direction hd1, and each row of contact via structures 86 within the N rows of contact via structures 86 comprises a respective set of M contact via structures 86. M is a first integer greater than 1, and N is a second integer greater than 1. In one embodiment, an array of contact via structures 86 may comprise an M×N rectangular array of contact via structures 86.

Rows of contact wells 85 are located within an alternating stack of insulating layers 32 and electrically conductive layers 46 and arranged along the first horizontal direction hd1. Each row of contact wells 85 may be located in a respective memory block. A plurality of contact wells 85 in each row may vertically extend through a respective subset of layers of the alternating stack (32, 46) that includes the topmost insulating layer 32T among the insulating layers 32.

In one embodiment, the contact wells 85 in each column extending in the second horizontal direction hd2 may have the same depth. In this embodiment, the rows of contact wells 85 are symmetrical. In another embodiment, the contact wells 85 in each column extending in the second horizontal direction hd2 may have different depths from each other. In this embodiment, the rows of contact wells 85 are asymmetrical.

Each of the contact wells 85 comprises a respective plurality of primary sidewalls SP each having a respective stepped bottom edge containing at least two horizontally-extending edge segments and at least one vertically-extending edge segment. Each of the contact wells 85 may be filled with a respective dielectric fill structure 84 and a respective array of contact via structures 86, such as an M×N array of layer contact via structures 86. Each array of contact via structures 86 vertically extends through a respective dielectric fill structure 84. Each contact via structure 86 contacts a top surface of a respective electrically conductive layer 46 within the alternating stack (32, 46).

In one embodiment, top surfaces of the array of contact via structures 86 are located within a second horizontal plane HP2 overlying the first horizontal plane HP1 that includes the topmost surfaces of the dielectric fill material portions 83. In one embodiment, each contact via structure 86 within the array of contact via structures 86 is laterally offset inward from the plurality of primary sidewalls SP of the contact well 85 by a respective lateral offset distance that is greater than a total thickness of the at least one dielectric liner (81, 82). In this case, the contact via structures 86 do not contact vertically-extending portions of the dielectric liners (81, 82).

In one embodiment, each of the insulating layers 32 has a first thickness; each vertically neighboring pair of the insulating layers 32 is vertically spaced from each other by a second thickness; and the horizontally-extending portions of the at least one dielectric liner (81, 82) may be vertically offset from each other by integer multiples of a sum of the first thickness and the second thickness. Each contact via structure 86 within the array of contact via structures 86 vertically extends through a respective horizontally-extending portion of the at least one dielectric liner (81, 82).

Figure 17A:
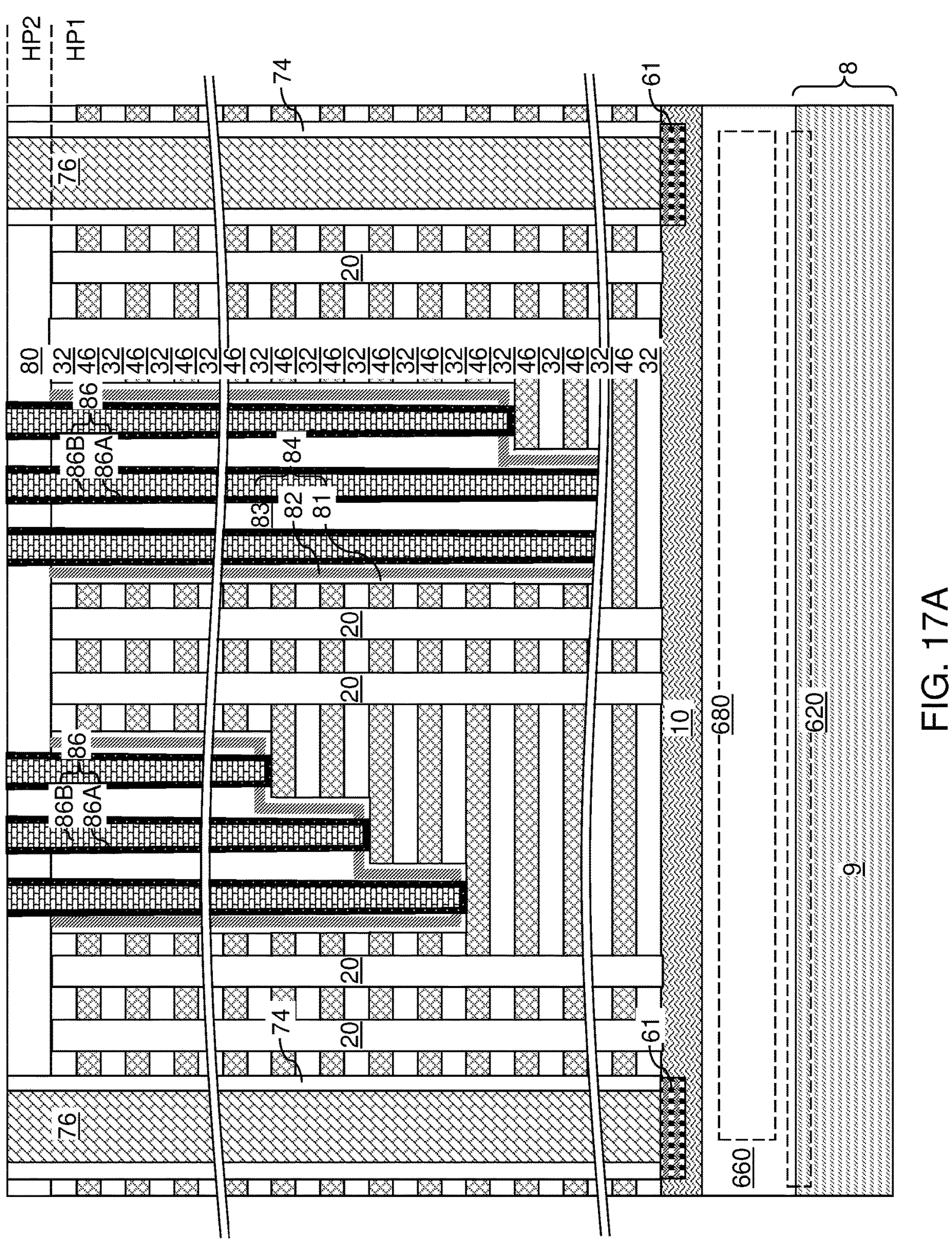
FIG. 17A is a vertical cross-sectional view of a first alternative configuration of the exemplary structure according to a second embodiment of the present disclosure.
Figure 17B:
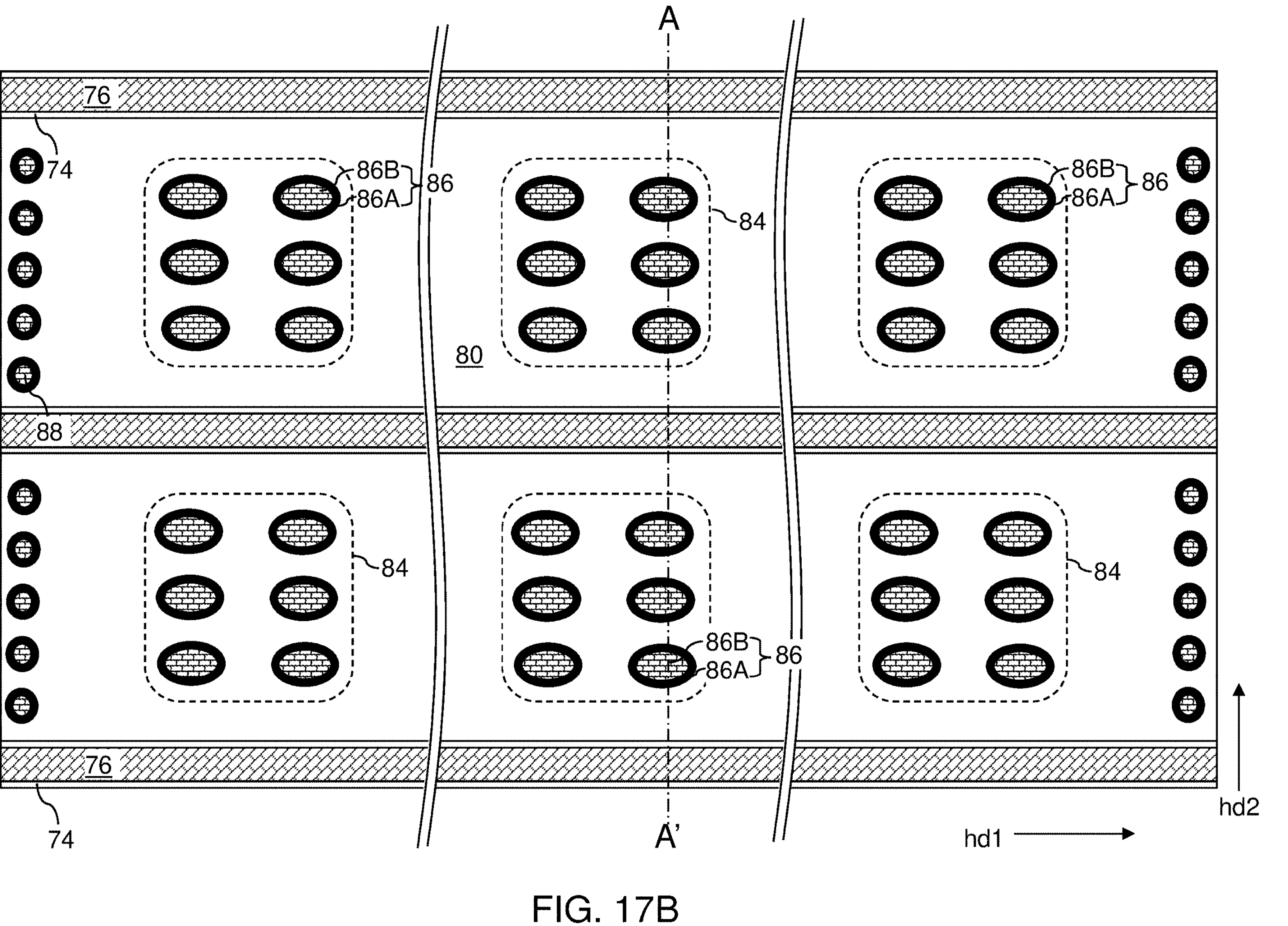
FIG. 17B is a top-down view of the first alternative configuration of the exemplary structure of FIG. 17A. The vertical plane A-A' is the cut plane of the vertical cross-sectional view of FIG. 17A.

Referring to FIGS. 17A and 17B, a first alternative configuration of the exemplary structure according to a second embodiment of the present disclosure is illustrated. In this case, M is 2 and N is 3. Thus, a 2×3 array of contact via structures 86 can be formed through each dielectric fill structure 84. The contact via structures 86 may have oval rather than circular horizontal cross-sectional shapes.

Figure 18:
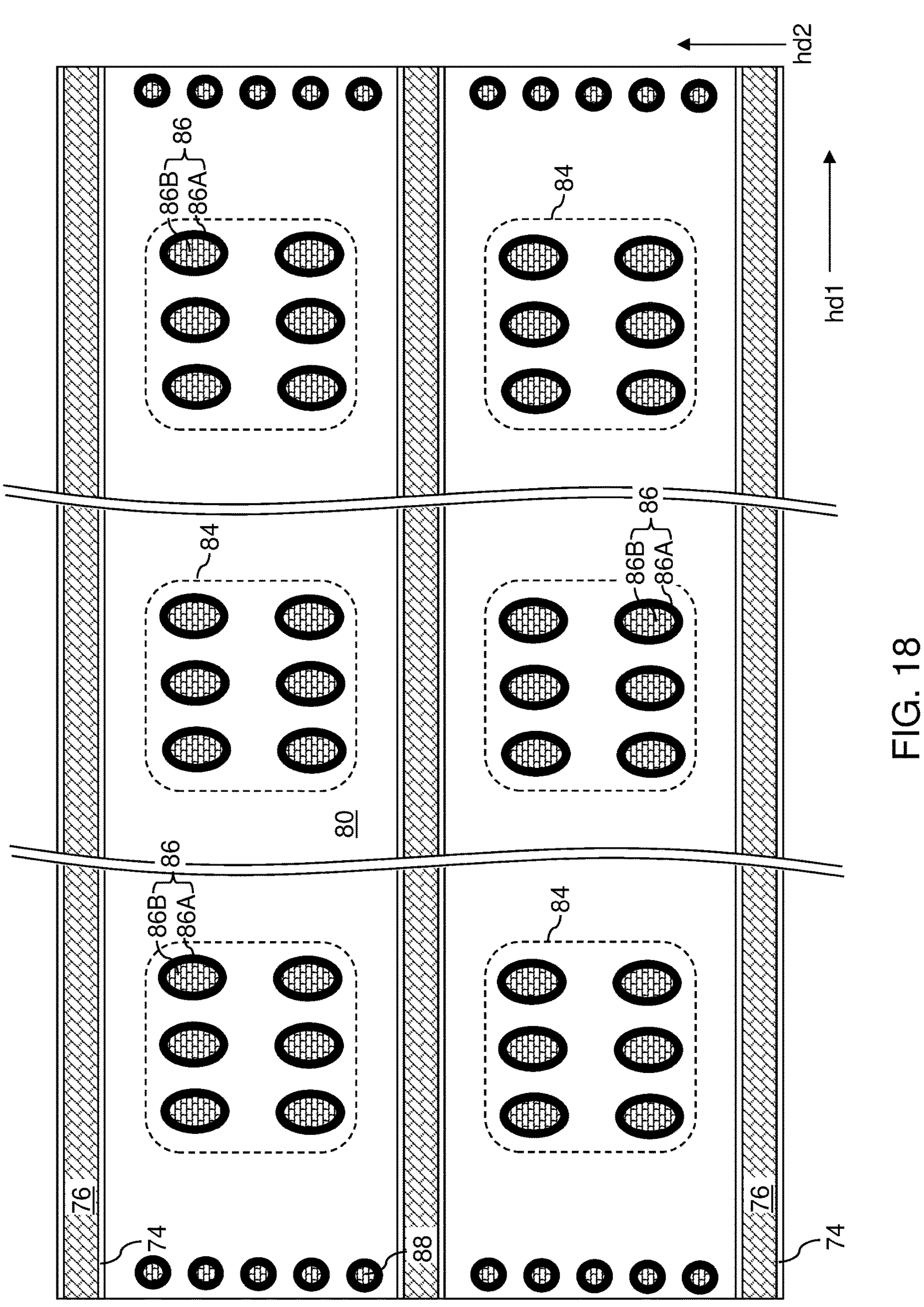
FIG. 18 is a top-down view of a second alternative configuration of the exemplary structure according to a third embodiment of the present disclosure.

Referring to FIG. 18, a second alternative configuration of the exemplary structure according to a third embodiment of the present disclosure is illustrated. In this case, M is 3 and N is 2. Thus, a 3×2 array of contact via structures 86 can be formed through each dielectric fill structure 84.

Figure 19:
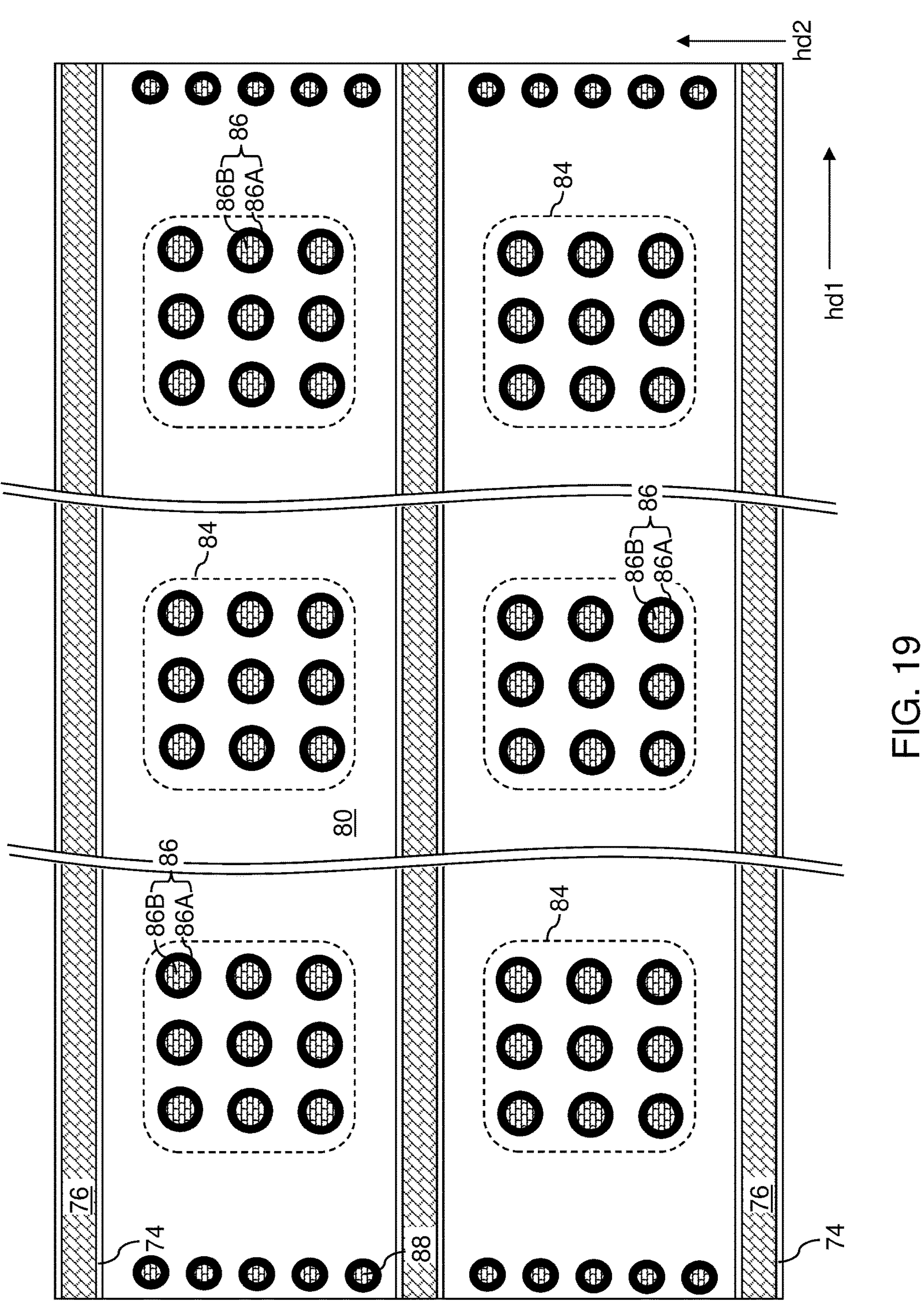
FIG. 19 is a top-down view of a third alternative configuration of the exemplary structure according to a fourth embodiment of the present disclosure.

Referring to FIG. 19, a third alternative configuration of the exemplary structure according to a fourth embodiment of the present disclosure is illustrated. In this case, M is 3 and N is 3. Thus, a 3×3 array of contact via structures 86 can be formed through each dielectric fill structure 84.

Generally speaking, an M×N array of contact via structures 86 can be formed through each dielectric fill structure 84, and each of M and N can be an integer greater than 1.

Referring to all drawings and according to various embodiments of the present disclosure, a memory device 900 comprises: an alternating stack (32, 46) of insulating layers 32 and electrically conductive layers 46; memory openings 49 vertically extending through the alternating stack (32, 46); memory opening fill structures 58 located in the memory openings 49 and comprising a respective memory film 50 and a respective vertical semiconductor channel 60; contact wells 85 vertically extending through a respective subset of layers of the alternating stack (32, 46) that includes a topmost insulating layer 32T of the insulating layers 32; dielectric fill structures 84 located in the contact wells 85; and an array of contact via structures 86 vertically extending through the respective dielectric fill structure 84 in each of the contact wells 85 and contacting a top surface of a respective electrically conductive layer 46 within a subset of the electrically conductive layers 46, the subset of the electrically conductive layers 46 comprising a plurality of electrically conductive layers 46 that are vertically spaced apart.

In one embodiment, each of the contact wells 85 comprises a plurality of primary sidewalls SP each having a respective stepped bottom edge containing at least two horizontally-extending edge segments and at least one vertically-extending edge segment; and each of the primary sidewalls SP comprises a respective top edge located entirely within a horizontal plane, and the top edges of the primary sidewalls SP are adjoined to each other to define a top periphery of each of the contact wells 85. In one embodiment, each of the contact wells 85 comprises a plurality of bottom surface segments that are vertically spaced apart from each other; and each horizontally-extending edge segment of the stepped bottom edges of each of the contact wells 85 coincides with an edge of a respective bottom surface segment of the plurality of bottom surface segments.

In one embodiment, each of the contact wells 85 comprises a plurality of secondary sidewall SSs that are not vertically coincident with any of the plurality of primary sidewalls SP.

In one embodiment, the top periphery of each of the contact wells 85 is located entirely within a first horizontal plane HP1 including a top surface of a topmost layer within the alternating stack (32, 46); a top surface of each of the dielectric fill structures 84 is located entirely within the first horizontal plane HP1; and top surfaces of the array of contact via structures 86 are located within a second horizontal plane HP2 overlying the first horizontal plane HP1.

In one embodiment, a first one of the dielectric fill structures 84 located in a first one of the contact wells 85 comprises: at least one dielectric liner (81, 82) located at a peripheral region of the first one of the contact wells 85; and a dielectric fill material portion 83 that is laterally surrounded by the at least one dielectric liner (81, 82), wherein each contact via structure 86 within the array of contact via structures 86 is laterally offset inward from the plurality of primary sidewalls SP of the first one of the contact wells 85 by a respective lateral offset distance that is greater than a total thickness of the at least one dielectric liner (81, 82).

In one embodiment, each of the insulating layers 32 has a first thickness; each vertically neighboring pair of the insulating layers 32 is vertically spaced from each other by a second thickness (which may be the thickness of an electrically conductive layer 46 or the sum of the thickness of an electrically conductive layer 46 and twice the thickness of a backside blocking dielectric layer 44); each contact via structure 86 within the array of contact via structures 86 vertically extends through a respective horizontally-extending portion of the at least one dielectric liner (81, 82); and the horizontally-extending portions of the at least one dielectric liner (81, 82) are vertically offset from each other by integer multiples of a sum of the first thickness and the second thickness.

In one embodiment, the at least one dielectric liner (81, 82) comprises a first dielectric liner 81 comprising a silicon oxide material that is in direct contact with the plurality of primary sidewalls SP and a plurality of bottom surface segments of the first one of the contact wells 85, and further comprises a second dielectric liner 82 comprising a dielectric material other than silicon oxide and contacting inner sidewalls of the first dielectric liner; and the dielectric fill material portion 83 comprises silicon oxide.

In one embodiment, each of the insulating layers 32 and the electrically conductive layers 46 within the alternating stack (32, 46) comprises lengthwise sidewalls that laterally extend along a first horizontal direction; and the alternating stack comprises a memory block.

In one embodiment, the array of contact via structures 86 comprises N rows of contact via structures 86 arranged along the first horizontal direction; each row of contact via structures 86 within the N rows of contact via structures 86 comprises a respective set of M contact via structures 86; M is a first integer greater than 1; and N is a second integer grater than 1. In one embodiment, the array of contact via structures 86 comprises an M×N rectangular array of contact via structures 86.

In one embodiment, the dielectric fill structure 84 is in direct contact with each insulating layer within the alternating stack (32, 46) that overlies a horizontal plane including a bottommost surface of the dielectric fill structure 84; and each electrically conductive layer 46 within the alternating stack (32, 46) that overlies the horizontal plane is laterally spaced from the dielectric fill structure 84 by a vertically-extending portion of a respective backside blocking dielectric layer. In another embodiment, the dielectric fill structure 84 is in direct contact with each insulating layer and each electrically conductive layer 46 within the alternating stack (32, 46) that overlie a horizontal plane including a bottommost surface of the dielectric fill structure 84.

In one embodiment, the contact wells 85 are separated by different distances from each other. For example, a first contact well and an adjacent second contact well may be laterally separated by first lateral distance, while the second contact well and the adjacent third contact well are separated by a second lateral distance different from the first lateral distance, where the first and second lateral distances extend in the same horizontal direction (e.g., in the word line or the bit line direction). Thus, the walls of the different contact wells may have a different thickness to accommodate driver circuit placement.

The contact well structure reduces mechanical stress differences on the device because there is a height difference of only three word lines at the bottom of each contact well. Thus, the formation of rows of contact wells along the word line direction results in mechanical stresses that are nearly uniform in the bit line direction due to the substantially uniform metal (e.g., tungsten) volume distribution in the bit line direction within a memory block. Thus, buckling of the alternating stacks and warping of the substrate may be reduced or avoided. Furthermore, the dielectric fill structure in the contact well is tolerant of voids (i.e., air gaps), which do not cause metal short circuits. Still further, the number of masking and lithography steps may be reduced relative to prior art staircase formation methods, which reduces the process cost.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:

an alternating stack of insulating layers and electrically conductive layers;

memory openings vertically extending through the alternating stack;

memory opening fill structures located in the memory openings and comprising a respective memory film and a respective vertical semiconductor channel;

contact wells vertically extending through a respective subset of layers of the alternating stack that includes a topmost insulating layer of the insulating layers;

dielectric fill structures located in the contact wells; and an array of contact via structures vertically extending through the respective dielectric fill structure in each of the contact wells and contacting a top surface of a respective electrically conductive layer within a subset of the electrically conductive layers, the subset of the electrically conductive layers comprising a plurality of electrically conductive layers that are vertically spaced apart, wherein a first one of the dielectric fill structures located in a first one of the contact wells comprises:

at least one dielectric liner located at a peripheral region of the first one of the contact wells; and a dielectric fill material portion that is laterally surrounded by the at least one dielectric liner, wherein each contact via structure within the array of contact via structures is laterally offset inward from the plurality of primary sidewalls of the first one of the contact wells by a respective lateral offset distance that is greater than a total thickness of the at least one dielectric liner; and wherein the at least one dielectric liner comprises:

a first dielectric liner that is in direct contact with the plurality of primary sidewalls of the first one of the contact wells and a plurality of bottom surface segments of the first one of the contact wells; and a second dielectric liner having a vertically-extending portion in direct contact with an inner sidewall of the first dielectric liner and a horizontally-extending portion in direct contact top surface of a horizontally-extending portion of the first dielectric liner.

2. The memory device of claim 1, wherein:

each of the contact wells comprises a plurality of primary sidewalls each having a respective stepped bottom edge containing at least two horizontally-extending edge segments and at least one vertically-extending edge segment; and each of the primary sidewalls comprises a respective top edge located entirely within a horizontal plane, and the top edges of the primary sidewalls are adjoined to each other to define a top periphery of each of the contact wells.

3. The memory device of claim 2, wherein:

each of the contact wells comprises a plurality of bottom surface segments that are vertically spaced apart from each other; and each horizontally-extending edge segment of the stepped bottom edges of each of the contact wells coincides with an edge of a respective bottom surface segment of the plurality of bottom surface segments.

4. The memory device of claim 2, wherein each of the contact wells comprises a plurality of secondary sidewalls that are not vertically coincident with any of the plurality of primary sidewalls.

5. The memory device of claim 2, wherein:

the top periphery of each of the contact wells is located entirely within a first horizontal plane including a top surface of a topmost layer within the alternating stack;

a top surface of each of the dielectric fill structures is located entirely within the first horizontal plane; and top surfaces of the array of contact via structures are located within a second horizontal plane overlying the first horizontal plane.

6. The memory device of claim 1, wherein:

each of the insulating layers has a first thickness;

each vertically neighboring pair of the insulating layers is vertically spaced from each other by a second thickness;

each contact via structure within the array of contact via structures vertically extends through a respective horizontally-extending portion of the at least one dielectric liner; and the horizontally-extending portions of the at least one dielectric liner are vertically offset from each other by integer multiples of a sum of the first thickness and the second thickness.

7. The memory device of claim 1, wherein:

the first dielectric liner comprises a silicon oxide material, and the second dielectric liner comprises a dielectric material other than silicon oxide that laterally surrounds the dielectric fill material portion; and the dielectric fill material portion comprises silicon oxide.

8. The memory device of claim 1, wherein:

each of the insulating layers and the electrically conductive layers within the alternating stack comprises lengthwise sidewalls that laterally extend along a first horizontal direction; and the alternating stack comprises a memory block.

9. The memory device of claim 8, wherein:

the array of contact via structures comprises N rows of contact via structures arranged along the first horizontal direction;

each row of contact via structures within the N rows of contact via structures comprises a respective set of M contact via structures;

M is a first integer greater than 1; and

N is a second integer greater than 1.

10. The memory device of claim 8, wherein the array of contact via structures comprises an M×N rectangular array of contact via structures.

11. The memory device of claim 1, wherein:

a first one of the dielectric fill structures is in direct contact with each of the insulating layers within the alternating stack that overlies a horizontal plane including a bottommost surface of the first one of the dielectric fill structures; and each of the electrically conductive layers within the alternating stack that overlies the horizontal plane is laterally spaced from the first one of the dielectric fill structures by a vertically-extending portion of a respective backside blocking dielectric layer.

12. The memory device of claim 1, wherein a first one of the dielectric fill structure is in direct contact with each of the insulating layers and each of the electrically conductive layers within the alternating stack that overlie a horizontal plane including a bottommost surface of the first one of the dielectric fill structures.

13. The memory device of claim 1, wherein the contact wells are separated by different distances from each other.

14. The memory device of claim 1, wherein the first dielectric liner comprises:

a first horizontally-extending dielectric liner portion overlying a first bottom surface segment of the first one of the contact wells;

a second horizontally-extending dielectric liner portion overlying a second bottom surface segment of the first one of the contact wells; and a vertically-extending connecting dielectric liner portion that connects the first horizontally-extending dielectric liner portion and the second horizontally-extending dielectric liner portion.

15. The memory device of claim 1, wherein the second dielectric liner is in direct contact with the dielectric fill material portion.

16. The memory device of claim 15, wherein the first dielectric liner is not in direct contact with the dielectric fill material portion.

17. The memory device of claim 1, wherein a first contact via structure within the array of contact via structures is in direct contact with the dielectric material portion, the second dielectric liner, and the first dielectric liner.

18. The memory device of claim 1, wherein top surfaces of the array of contact via structures are located above a horizontal plane including a topmost surface of the dielectric material portion.

19. The memory device of claim 18, wherein:

a topmost surface of the first dielectric liner and a topmost surface of the second dielectric liner are located within a horizontal plane including the topmost surface of the dielectric material portion;

a bottommost surface of the first dielectric liner is located above a horizontal plane including a bottommost surface of the alternating stack; and the dielectric material portion is located above, and is vertically spaced from, horizontally-extending portions of the first dielectric liner.

20. The memory device of claim 18, further comprising drain contact via structures contacting the memory opening fill structures, wherein top surfaces of the drain contact via structures and the top surfaces of the array of contact via structures are located in a same horizontal plane.

* * * * *